US010644725B1

(12) United States Patent
Walke et al.

(10) Patent No.: US 10,644,725 B1
(45) Date of Patent: May 5, 2020

(54) INTERLEAVED DATA BLOCK PROCESSING IN LOW-DENSITY PARITY-CHECK (LDPC) ENCODER AND DECODER

(71) Applicant: Xilinx, Inc., San Jose, CA (US)

(72) Inventors: Richard L. Walke, Edinburgh (GB); Andrew Dow, Edinburgh (GB); Andrew M. Whyte, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 40 days.

(21) Appl. No.: 16/137,935

(22) Filed: Sep. 21, 2018

(51) Int. Cl.
*H03M 13/27* (2006.01)
*H03M 13/11* (2006.01)
*H03M 13/00* (2006.01)
*H03M 13/29* (2006.01)

(52) U.S. Cl.
CPC ... *H03M 13/2778* (2013.01); *H03M 13/1102* (2013.01); *H03M 13/2927* (2013.01); *H03M 13/616* (2013.01); *H03M 13/6393* (2013.01); *H03M 13/116* (2013.01)

(58) Field of Classification Search
CPC .......... H03M 13/2778; H03M 13/616; H03M 13/116; H03M 13/1102; H03M 13/2927; H03M 13/6393
USPC .......................... 714/752, 763, 784, 786, 805
See application file for complete search history.

(56) References Cited

U.S. PATENT DOCUMENTS

| | | | |
|---|---|---|---|
| 7,539,926 B1 | 5/2009 | Lesea | |
| 8,291,285 B1 * | 10/2012 | Varnica | H03M 13/1137 |
| | | | 714/752 |
| 8,495,453 B1 * | 7/2013 | Varnica | H03M 13/1137 |
| | | | 714/752 |
| 9,083,383 B1 | 7/2015 | Tunali et al. | |
| 9,203,440 B1 | 12/2015 | Tunali et al. | |
| 9,413,390 B1 | 8/2016 | Yin et al. | |
| 9,667,276 B1 | 5/2017 | Tunali et al. | |
| 2014/0089757 A1 * | 3/2014 | Yang | H03M 13/112 |
| | | | 714/752 |
| 2015/0303942 A1 * | 10/2015 | Zhang | H03M 13/1105 |
| | | | 714/763 |

OTHER PUBLICATIONS

Peter Hailes, Design and implementation of flexible FPGA-based LDPC decoders, Jun. 19, 2018, University of Southampton, Faculty of Physical Sciences & Engineering Department of Electronics and Computer Science, pp. 1-174. (Year: 2018).*

(Continued)

*Primary Examiner* — John J Tabone, Jr.
(74) *Attorney, Agent, or Firm* — Kevin T. Cuenot

(57) ABSTRACT

A decoder circuit can include low-density parity-check (LDPC) decoder circuitry having a plurality of stages and an LDPC repository configured to store parity-check information associated with one or more LDPC codes. The LDPC repository is configured to determine a stall requirement for a layer of a first data block and perform a memory check for a second data block. The LDPC repository, in response to the stall requirement indicating a stall for the layer of the first data block and determining that the memory check is satisfied, is further configured to schedule processing of the first data block and the second data block in the LDPC decoder circuitry using the parity-check information by interleaving the layer of the first data block and a layer of the second data block through the plurality of stages of the LDPC decoder circuitry.

20 Claims, 25 Drawing Sheets

(56) References Cited

OTHER PUBLICATIONS

Nimara et al., FPGA Architecture of Multi-Codeword LDPC Decoder With Efficient BRAM Utilization, Jun. 2, 2016, IEEE, 1-4. (Year: 2016).*

Sun et al., Multi-Layer Parallel Decoding Algorithm and VLSI Architecture for Quasi-Cyclic LDPC Codes, 2011, IEEE, pp. 1776-1779. (Year: 2011).*

Mansour, Mohammad M., "A Turbo-Decoding Message-Passing Algorithm for Sparse Parity-Check Matrix Codes," IEEE Transactions of Signal Processing, vol. 54, No. 11, Nov. 2006, pp. 4376-4392.

Emran, Ahmed A. et al., "Simplified Variable-Scaled Min Sum LDPC Decoder for irregular LDPC Codes," Electronics and Communications Engineering Department, E-JUST University, CNNC: Networking Issues in Multimedia Entertainment, 2014, pp. 518-523.

Xilinx, "Vivado Design Suite User Guide," Release Note, Installation, and Licensing, UG973 (v2017.3), Oct. 4, 2017, 88 pg., Xilinx, Inc., San Jose, California, USA.

Xilinx, "Zynq UltraScale+ RFSoC Data Sheet: Overview," Advance Product Specification DS889 (v1.4), May 17, 2018, 33 pg., Xilinx, Inc., San Jose, California, USA.

Xilinx, "Soft-Decision FEC Integrated Block," LogiCORE IP Product Guide, Vivado Design Suite, PG256, Jun. 18, 2018, 134 pg., Xilinx, Inc., San Jose, California, USA.

Xilinx, "Xilinx Delivers Zynq UltraScale+ RFSoC Family Integrating the RF Signal Chain for 5G Wireless, Cable Remote-PHY, and Radar," Xilinx, Inc. Press Release, Oct. 3, 2017, 3 pg., Xilinx, Inc., San Jose, California, USA.

Xilinx, "LDPC Encoder / Decoder," Xilinx, Inc. Part No. EF-DI-LDPC-ENC-DEC-SITE, [retrieved May 21, 2018], 3 pg., Xilinx, Inc., San Jose, California, USA.

Xilinx, "Zynq UltraScale+RFSoCs," Xilinx, Inc., [retrieved May 21, 2018] from the Internet: <https://www.xilinx.com/products/silicon-devices/soc/rfsoc.html>, 7 pg.

Specification and drawings for U.S. Appl. No. 15/688,628, filed Aug. 28, 2017, Tunali et al.

Specification and drawings for U.S. Appl. No. 15/938,760, filed Mar. 28, 2018, Walke et al.W.

Specification and drawings for U.S. Appl. No. 16/112,588, filed Aug. 24, 2018, Walke et al.

Specification and drawings for U.S. Appl. No. 16/137,927, filed Sep. 21, 2018, Walke et al.

Specification and drawings for U.S. Appl. No. 16/138,414, filed Sep. 21, 2018, Walke et al.

* cited by examiner

400A

```
1    for b = 1 : B
2        for p = 1 : P
3            for l = 1 : L_b
4                v_{l,p}^b = v_{l,p}^b - upd\_vnode_{l,p}^b
5            end
6            for l = 1 : L_b
7                upd\_vnode_{l,p}^b = α min(|V_{l,p}^b|) ∏ sign(V_{l,p}^b)
8            end
9            for l = 1 : L_b
10               v_{l,p}^b = v_{l,p}^b + upd\_vnode_{l,p}^b
11           end
12       end
13   end
```

FIG. 4A

|   | 1 | 2 | 3 | 4 | 5 | 6 | 7 | 8 | 9 | 10 | 11 | 12 | 13 |
|---|---|---|---|---|---|---|---|---|---|----|----|----|----|
| 1 | 9 | 117 | 204 | 26 | . | 0 | 0 | . | . | . | . | . | . |
| 2 | 167 | . | . | 166 | 253 | . | 0 | 0 | . | . | . | . | . |
| 3 | 81 | 114 | . | 44 | 52 | 1 | . | 0 | 0 | . | . | . | . |
| 4 | . | 8 | 58 | . | 158 | 0 | . | . | 0 | . | . | . | . |
| 5 | 179 | 214 | . | . | . | . | 71 | . | . | 0 | . | . | . |
| 6 | 231 | 41 | . | . | . | . | 103 | . | . | . | 0 | . | . |
| 7 | 155 | . | . | . | . | . | 158 | . | 116 | . | . | 0 | . |
| 8 | . | 129 | . | . | . | . | . | . | . | . | . | . | 0 |

FIG. 11

INTERLEAVED DATA BLOCK PROCESSING IN LOW-DENSITY PARITY-CHECK (LDPC) ENCODER AND DECODER

TECHNICAL FIELD

This disclosure relates to integrated circuits (ICs) and, more particularly, to interleaved processing of data blocks in low-density parity-check (LDPC) decoders and encoders.

BACKGROUND

Low-density parity-check (LDPC) codes are a class of error-correcting codes that may be efficiently encoded and decoded in hardware. LDPC codes are linear codes that have sparse parity-check matrices. The sparseness of the parity-check matrices allows for relatively fast decoding and computationally-inexpensive error correction. Many practical LDPC code designs use quasi-cyclic (QC) LDPC codes to yield more efficient hardware parallelization. Layered decoding is an efficient way of decoding LDPC codes and is commonly used in a wide range of applications. The number of cycles needed to process an entire layer of a base matrix associated with a QC LDPC code may depend on the hardware resources of the decoder.

Many existing LDPC decoders are preconfigured to support only a limited number of LDPC codes (e.g., for a particular communication standard). However, older LDPC codes are often phased out for newer LDPC codes as new communication standards are developed and existing standards are improved upon. Furthermore, some communication systems may use proprietary LDPC codes (e.g., for a backhaul network).

SUMMARY

In one or more embodiments, a decoder circuit can include low-density parity-check (LDPC) decoder circuitry having a plurality of stages and an LDPC repository configured to store parity-check information associated with one or more LDPC codes. The LDPC repository is configured to determine a stall requirement for a layer of a first data block and perform a memory check for a second data block. The LDPC repository, in response to the stall requirement indicating a stall for the layer of the first data block and determining that the memory check is satisfied, is further configured to schedule processing of the first data block and the second data block in the LDPC decoder circuitry using the parity-check information by interleaving the layer of the first data block and a layer of the second data block through the plurality of stages of the LDPC decoder circuitry.

In one or more embodiments, a method can include receiving a first data block for processing through LDPC decoder circuitry using stored parity-check information, wherein the LDPC decoder circuitry includes a plurality of stages, determining a stall requirement for a layer of the first data block, and determining whether the LDPC decoder circuitry has sufficient memory for storing and processing a second data block. The method can include, in response to the stall requirement indicating a stall for the layer of the first data block and determining that sufficient memory is available, scheduling processing of the first data block and the second data block in the LDPC decoder circuitry using the parity-check information by interleaving the layer of the first data block and a layer of the second data block through the plurality of stages of the LDPC decoder circuitry.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 4A shows an example layered decoding operation, in accordance with some embodiments.

FIG. 11 shows an example parity-check matrix for an LDPC code, in accordance with some embodiments.

DETAILED DESCRIPTION

Figure 1:
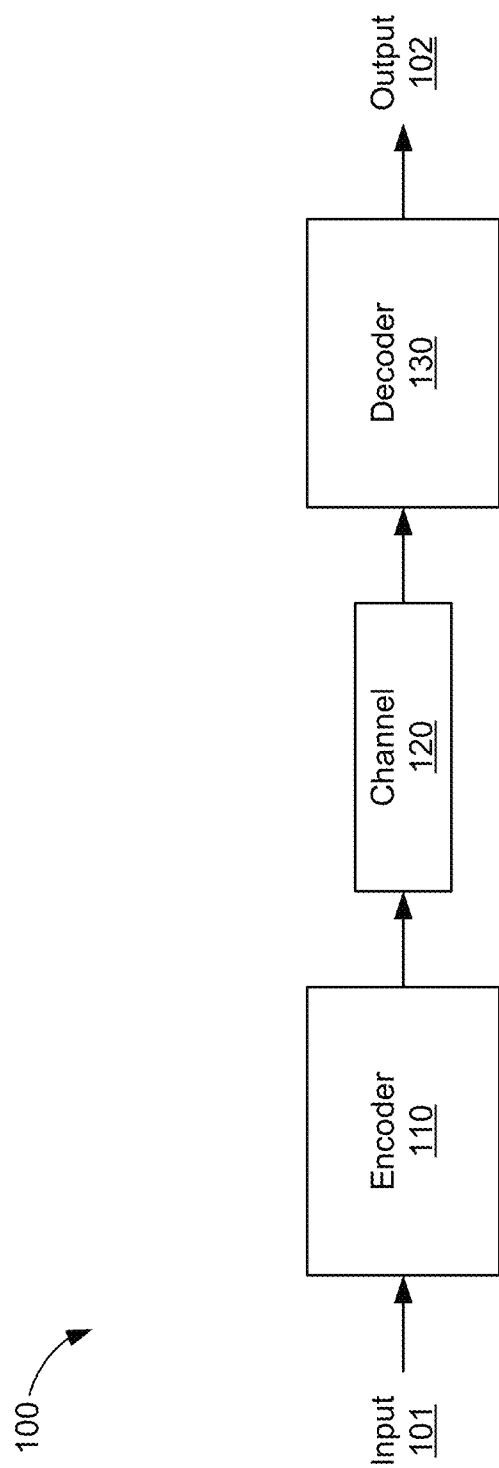
FIG. 1 is a block diagram of an example communication system, in accordance with some embodiments.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

This disclosure relates to integrated circuits (ICs) and, more particularly, to interleaved processing of data blocks in low-density parity-check (LDPC) decoders and encoders. LDPC codes are widely used in many communication standards. Some LDPC codes may use quasi-cyclic parity-check matrices for improved bit error rate. Such codes may be referred to as quasi-cyclic low-density parity-check (QC LDPC) codes. A parity-check matrix for a QC LDPC code may be represented by a base matrix and expansion sub-matrices for expanding the elements of the base matrix. Some LDPC decoders may use a layered approach to decoding QC LDPC codes, for example, by updating soft bit information from layer to layer of the parity-check matrix. Each layer corresponds to a row of the base matrix, which may include a plurality of rows of an expansion sub-matrix. Each sub-matrix of a parity-check matrix may correspond to an all-zero matrix or a circulant matrix having a circulant weight equal to or greater than one. For a circulant matrix with a circulant weight of one, each row and column of the circulant matrix may contain only one non-zero element. Thus, the plurality of rows of the circulant matrix may be processed in parallel (or simultaneously) by an LDPC decoder.

Many existing LDPC decoders are preconfigured to support only a limited number of LDPC codes (e.g., for a particular communication standard). However, older LDPC codes are often phased out for newer LDPC codes as new communication standards are developed and existing standards are improved upon. Aspects of the present disclosure provide a programmable LDPC decoder that can be dynamically configured (and reconfigured) to support a wide range of LDPC codes. In some embodiments, the decoder circuit may include an LDPC repository configured to store parity-check matrices for one or more LDPC codes. More specifically, each parity-check matrix may be stored as a set of parameterized data (e.g., parity-check information) describing various aspects or features of the parity-check matrix (such as codeword length, number of information bits, circulant size, number of layers, and the like). Aspects of the present disclosure recognize that multiple parity-check matrices may have at least some amount of parity-check information in common (such as the rotation of one or more circulant sub-matrices). Thus, in some aspects, at least some of the parity-check information stored in the LDPC repository may be shared or reused by multiple LPDC codes.

In some embodiments, the programmable LDPC decoder includes an LDPC decoder having a flexible data path. The data path, which is capable of performing LDPC decoding, is also configurable to perform LDPC encoding. The LDPC decoder, using the flexible data path, is capable of performing both LDPC encoding and LDPC decoding for a common class of QC LDPC codes that are applicable to a wide range of standards. These standards can include, but are not limited to, 5G New Radio, Wi-Fi communications (e.g., as defined by the IEEE 802.11 standards), and Cable access.

In some embodiments, the data path of the decoder circuit includes one or more circuit blocks that may be selectively bypassed based on the particular operation that is to be performed. For example, in response to performing LDPC encoding, one or more circuit blocks of the data path used for purposes of LDPC decoding are bypassed; and, one or more other circuit blocks used for LDPC encoding may be inserted into the data path, e.g., "activated." In response to performing LDPC decoding, one or more circuit blocks of the data path used for LDPC encoding are bypassed; and, one or more other circuit blocks used for LDPC decoding are inserted into the data path. In particular embodiments, whether the programmable LDPC decoder is to perform LDPC decoding or LDPC encoding is determined based on one or more control signals included in the control data provided for the particular data block to be processed. As such, the programmable LDPC decoder is capable of switching between performing LDPC encoding and LDPC decoding on a per data block basis in response to received control data.

In one or more other embodiments, the programmable LDPC decoder is capable of processing data blocks in an interleaved manner. The programmable LDPC decoder, for example, is capable of detecting data dependencies within LDPC codes. Due to the data dependencies, earlier layers of a data block must be processed completely prior to beginning operation on subsequent layers of the data block. This dependency between layers causes throughput degradation within the decoder and/or encoder. By interleaving data blocks on a layer-by-layer basis, the throughput of the encoder/decoder may be increased. In general, interleaving layers of different blocks allows the LDPC decoder to fill stalls (e.g., stall periods) arising from the data dependencies within the LDPC codes to recover throughput that would otherwise be lost due to the stalls.

The interleaving further leverages the multi-stage architecture of the encoder/decoder so that the layers can be scheduled in an interleaved manner between the different stages. The interleaved processing described herein may be used for decoding of data blocks and/or for encoding of data blocks. The term "data block," as used in this specification, refers to a codeword that is to be decoded and/or information that is to be encoded depending on the context.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram of an example communication system 100, in accordance with some embodiments. The communication system includes an encoder 110, a channel 120, and decoder 130. The encoder 110 and decoder 130 may be provided in respective communication devices such as, for example, computers, switches, routers, hubs, gateways, or other devices capable of transmitting and/or receiving communication signals. The channel 120 may be a wired or wireless communication link between the encoder 110 and the decoder 130.

The encoder 110 may receive an input 101 comprising message data to be transmitted to the decoder 130 via the channel 120. However, imperfections in the channel 120 may introduce channel distortion (e.g., non-linear distortion, multi-path effects, Additive White Gaussian Noise (AWGN), and/or other signal impairments). Thus, the encoder 110 may encode the input 101 prior to transmission. In some embodiments, the encoder 110 may encode the input 101 in accordance with an LDPC code so that error correction may be performed at the decoder 130. For example, the encoder 110 may generate an LDPC codeword as a result of the encoding. The LDPC codeword may be transmitted, over the channel 120, to the decoder 130. Upon receiving the LDPC codeword, the decoder 130 may use a parity-check matrix associated with the LDPC code to decode the received codeword. More specifically, the decoded codeword may be provided as an output 102 from the decoder 130. If channel 120 introduces errors (e.g., flipped bits) into the transmitted codeword, the decoder 130 may detect and correct such errors using the parity-check matrix.

Figure 2A:
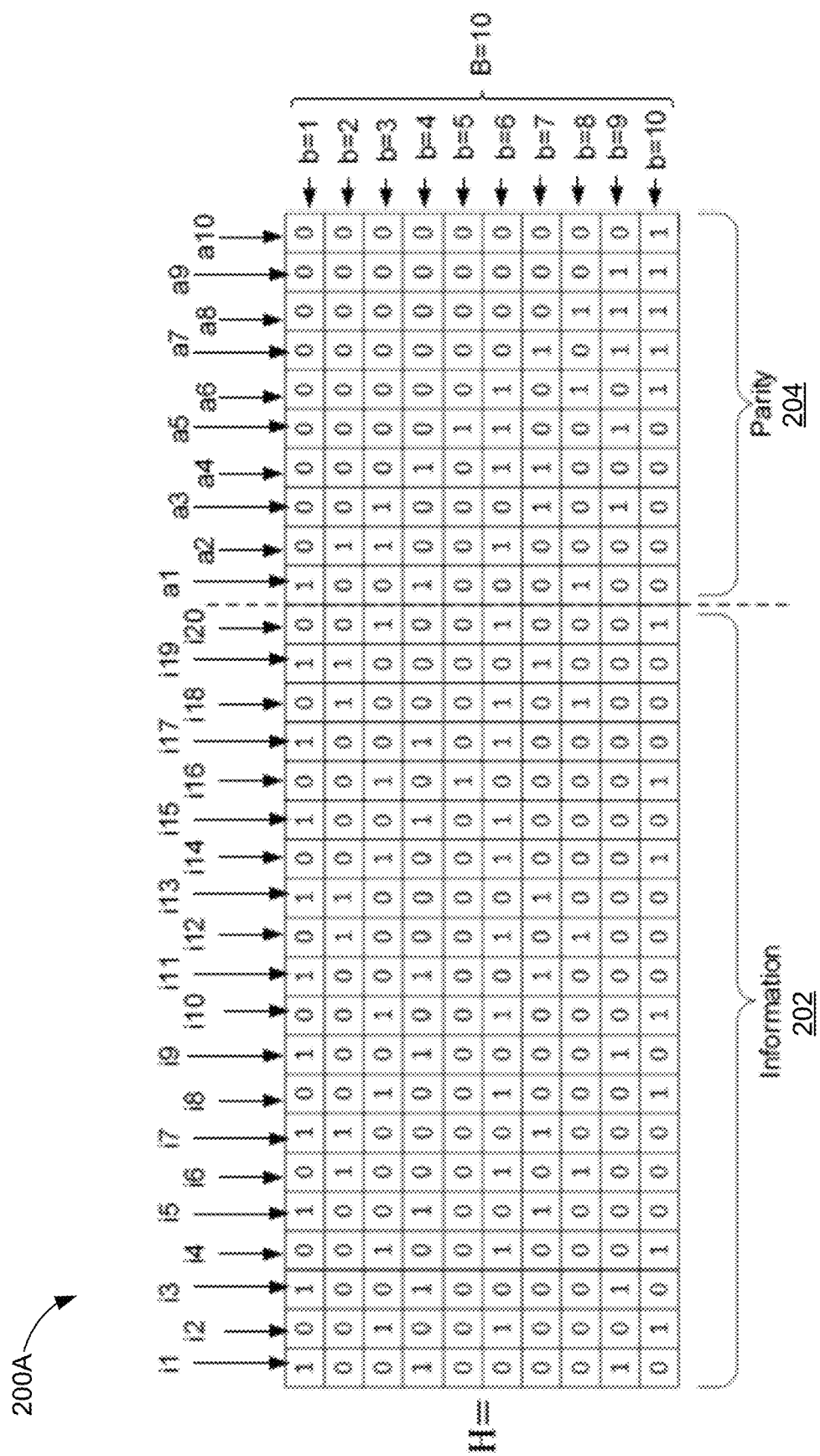
FIG. 2A shows an example parity-check matrix for a low-density parity-check (LDPC) code, in accordance with some embodiments.

FIG. 2A shows an example parity-check matrix 200A for an LDPC code, in accordance with some embodiments. The parity-check matrix 200A includes an information part 202 and a parity part 204. The information part 202 of the parity-check matrix 200A may correspond to information bits of an LDPC codeword (e.g., information bits i1 through i20 for each row). The parity part 204 of the parity-check matrix 200A may correspond to parity bits of the LDPC codeword (e.g., parity bits a1 through a10 for each row). The decoder 130 may determine that a received codeword (c) is a valid codeword if the following condition is satisfied: $Hc^T=0$, where H represents the parity-check matrix 200A.

Figure 2C:
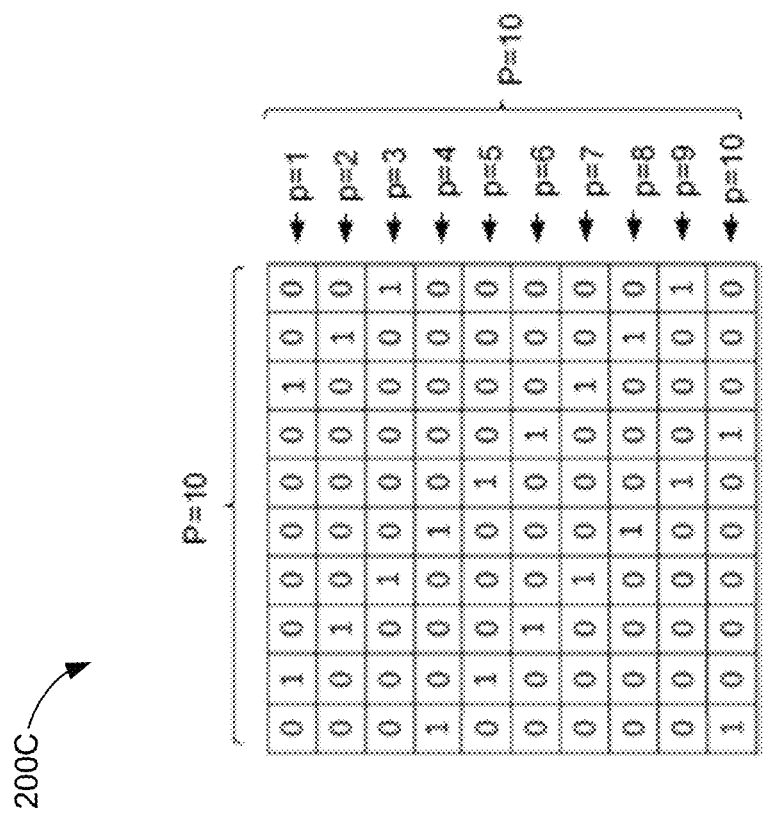
FIGS. 2B and 2C show example circulant sub-matrices for an LDPC code, in accordance with some embodiments.
Figure 2B:
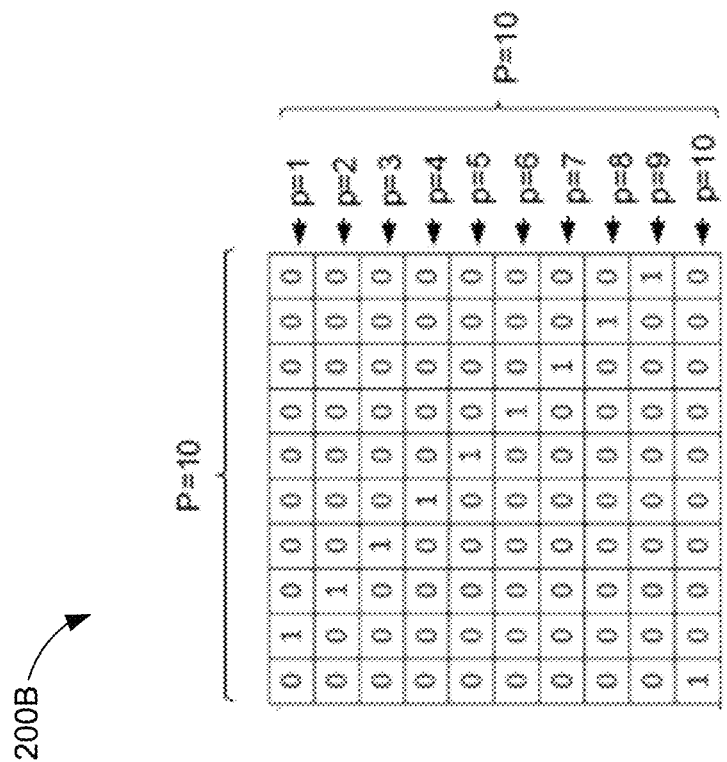

In some embodiments, the parity-check matrix 200A may correspond to a base matrix of a QC LDPC code. Each row of the base matrix may be referred to as a "layer," and may be assigned a particular layer index (b) based on the total number (B) of layers in the base matrix. In the example of FIG. 2A, the base matrix 200A is shown to have a total of 10 layers (e.g., B=10). Within a given layer, each column of the base matrix 200A (e.g., i1 through i20) may comprise a sub-matrix. For example, each "0" in the parity-check matrix 200A may be expanded to an all-zero sub-matrix, and each "1" in the parity-check matrix 200A may be expanded to a circulant sub-matrix having a circulant weight equal to or greater than 1. With reference for example to FIG. 2B, a circulant sub-matrix 200B is shown having a circulant weight equal to 1. Thus, each row and column of the circulant sub-matrix 200B contains only one non-zero element. Some QC LDPC codes may include circulant sub-matrices with circulant weight greater than 1. With reference for example to FIG. 2C, a circulant sub-matrix 200C is shown having a circulant weight equal to 2. Thus, each row and column of the circulant sub-matrix 200C contains exactly two non-zero elements.

Figure 3:
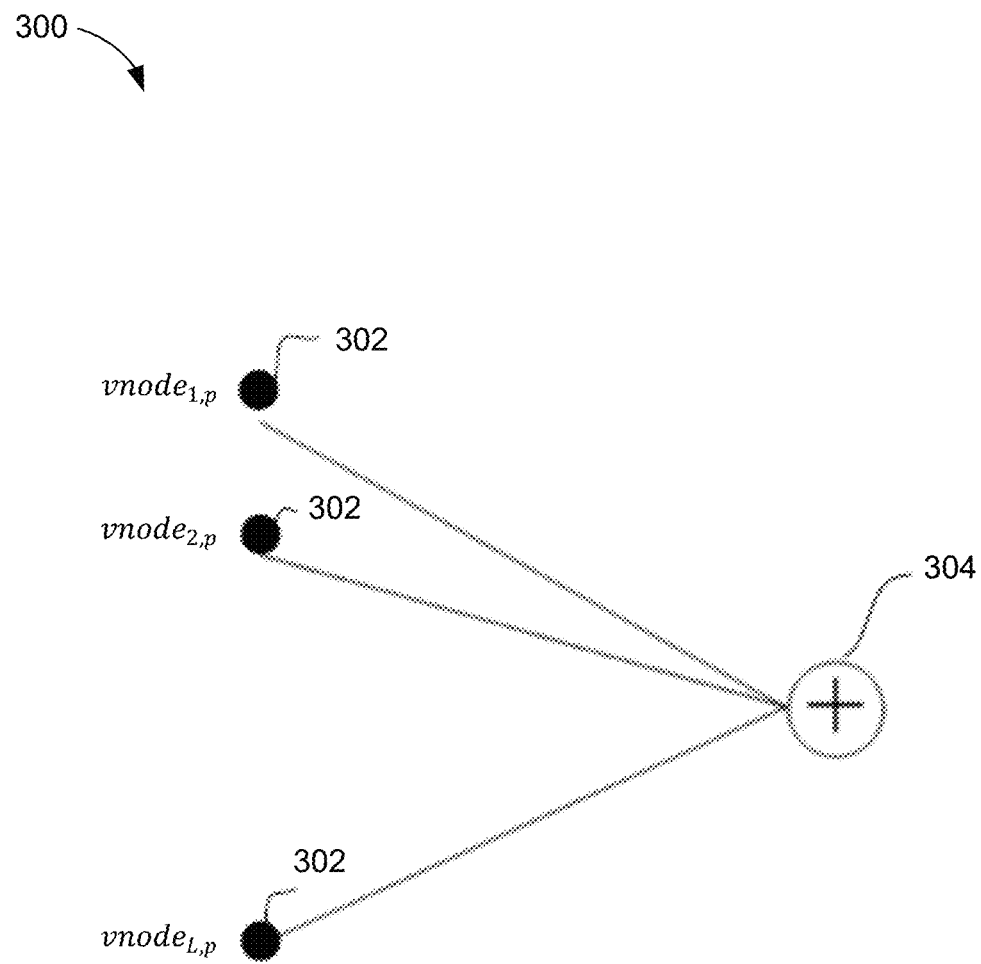
FIG. 3 shows an example bipartite graph representing a row of a parity-check matrix, in accordance with some embodiments.

FIG. 3 shows an example bipartite graph 300 representing a row of a parity-check matrix, in accordance with some embodiments. The bipartite graph 300 (which may also be referred to as a Tanner graph) includes a set of variable nodes 302 ($vnode_{1,p}$ to $vnode_{L,p}$) and a check node 304. The "edges" (e.g., lines) in the bipartite graph 300 connect the variable nodes 302 to the check node 304. More specifically, $vnode_{l,p}$ denotes the $l^{th}$ variable node 302 that participates in the $p^{th}$ row of the parity-check matrix, where L is the total number of non-zero bits in the $p^{th}$ row of the parity-check matrix. With reference for example to FIG. 2A, there are 11 bits (or columns) that participate in the parity-check operation associated with the first row (or layer) of the parity-check matrix 200A, thus L=11 and $vnode_{1,p}$ to $vnode_{L,p}$ are associated with codeword bits i1, i3, i5, i7, i9, i11, i13, i15, i17, i19 and a1, and columns 1, 3, 5, 7, 9, 11, 13, 15, 17, 19, and 21.

An LDPC decoder may decode a received codeword (c) by exchanging messages within the bipartite graph 300, along the edges, and updating these messages by performing computations at the nodes based on the incoming messages. For example, each variable node 302 in the graph 300 may initially be provided with a "soft bit" (e.g., representing the received bit of the codeword) that indicates an estimate of the associated bit's value as determined by observations from the communications channel. Using these soft bits, the LDPC decoder may update messages by iteratively reading them (or some portion thereof) from memory and writing an updated message (or some portion thereof) back to memory. The update operations are typically based on the parity-check constraints of the corresponding LDPC code. For example, the LDPC decoder may update the soft bits associated with the codeword c to satisfy the equation: $h_p c^T=0$, where $h_p$ is the $p^{th}$ row of the parity-check matrix.

FIG. 4A shows an example layered decoding operation 400A, in accordance with some embodiments. As shown in FIG. 4A, each $b^{th}$ layer of a corresponding parity-check matrix (H) contains the rows P·(b−1)+1 to P·b, thus each $b^{th}$ layer has a row weight $L_b$. In the layered decoding operation 400A, P denotes the size (e.g., number of rows) of a circulant sub-matrix in the parity-check matrix H, and B denotes the number of layers in the parity-check matrix H (e.g., B=(N−K)/P). Furthermore, $v_{l,p}^b$ denotes the log-likelihood ratio (LLR) of the $l^{th}$ variable node $vnode_{l,p}^b$ in the $p^{th}$ row of the $b^{th}$ layer of the parity-check matrix, and $V_{l,p}^b$ denotes the set of LLRs for all of the variable nodes $vnode_{l,p}^b$ that participate in the $p^{th}$ row of the $b^{th}$ layer of the parity-check matrix excluding of $v_{l,p}^b$ (e.g., $V_{l,p}^b = V_{l,p}^b \backslash v_{l,p}^b$). The messages exchanged between check nodes and variable nodes are represented as "updates," where $upd\_vnode_{l,p}^b$ denotes the update to the variable node $vnode_{l,p}^b$ in the $p^{th}$ row of the $b^{th}$ layer of the parity-check matrix.

In some embodiments, a variable update rule of the layered decoding operation 400A may use a belief propagation algorithm. A belief propagation algorithm may include, for example, a sum-product algorithm, a min-sum algorithm, a scaled min-sum algorithm, a variable scaled min-sum algorithm, or any other suitable belief propagation algorithm. The examples described herein use a scaled min-sum algorithm for illustrative purposes only. In some embodiments, the variable node update rule may perform lines 2 through 12 of the layered decoding operation 400A for each $b^{th}$ layer by processing the P consecutive rows of that layer.

Figure 4B:
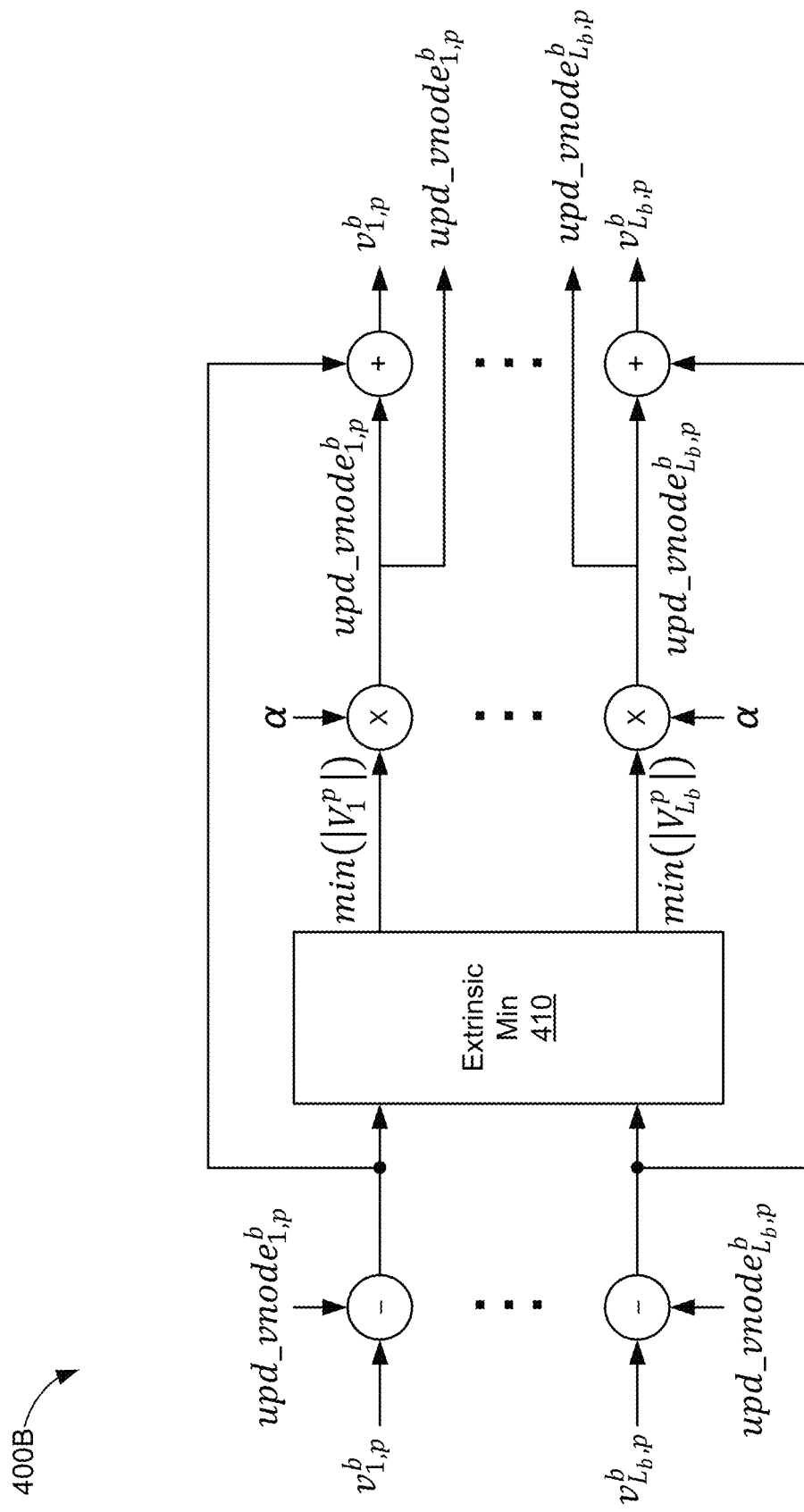
FIG. 4B is a block diagram of an example row processing unit for an LDPC decoder, in accordance with some embodiments.

FIG. 4B is a block diagram of an example row processing unit 400B for an LDPC decoder, in accordance with some embodiments. With reference for example to FIG. 4A, the row processing unit 400B may be configured to process and/or execute lines 3 through 11 of the layered decoding operation 400A for the $p^{th}$ row of the $b^{th}$ layer of a corresponding parity-check matrix. The row processing unit 400B receives, as its inputs, LLR values $v_{1,p}^b$ through $v_{L_b,p}^b$ (for $\text{vnode}_{1,p}^b$ through $\text{vnode}_{L_b,p}^b$, respectively). In some aspects, the LLR values $v_{l,p}^b$ may be obtained from a previous update (e.g., from another layer). Thus, the row processing unit 400B may first subtract the corresponding check node messages $\text{upd\_vnode}_{1,p}^b$ through $\text{upd\_vnode}_{L_b,p}^b$ from the LLR values $v_{1,p}^b$ through $v_{L_b,p}^b$, respectively (e.g., as described in line 4 of the layered decoding operation 400A).

An extrinsic minimum generator 410 may compute the extrinsic minimum values of the LLRs $v_{l,p}^b$ for each variable node index l, from 1 to $L_b$ (e.g., by computing $\min(|V_l^p|)$ $\Pi\text{sign}(V_l^p)$ as described in line 7 of the layered decoding operation 400A). In the example of FIG. 4B, a scalar ($\alpha$) is applied to the extrinsic minimum values $\min(|V_l^p|)$ through $\min(|V_{L_b}^p|)$ to generate scaled extrinsic minimum values, which correspond to updates $\text{upd\_vnode}_{1,p}^b$ through $\text{upd\_vnode}_{L_b,p}^b$ for the current layer being processed. The updates $\text{upd\_vnode}_{1,p}^b$ through $\text{upd\_vnode}_{L_b,p}^b$ are added to the LLR values $v_{1,p}^b$ through $v_{L_b,p}^b$, respectively, to produce updated LLR values $v_{l,p}^b$ (e.g., as described in line 10 of the layered decoding operation 400A) at the output of the row processing unit 400B. The updated LLR values $v_{1,p}^b$ through $v_{L_b,p}^b$ may then be stored in memory (not shown for simplicity), and may be used in a subsequent update of the layered decoding operation 400A.

It is noted that, the example row processing unit 400B may be scaled to simultaneously process P consecutive rows of a given layer of the parity-check matrix, for example, by operating a number (P) of the row processing units 400B in parallel. For example, a decoder architecture with 128 processors may be able to process one circulant having a size of up to P=128 per cycle. More specifically, it may take the decoder $L_b$ cycles to complete a single layer if P=128. However, if P≤64, the decoder may process multiple circulants (in parallel) in a single cycle of the decoding operation. For example, if 32<P≤64, the decoder may process 2 circulants in parallel per cycle. Further, if 2≤P≤32, the decoder may process 4 circulants in parallel per cycle. Thus, the number of parallel operations that may be performed by the decoder increases as the size of the circulant sub-matrix decreases, allowing a layer to be completed in less than $L_b$ cycles. On the other hand, if P>128, the decoder may process a single circulant over multiple cycles. For example, if 128<P≤256, the decoder may process one circulant in two cycles. Further, if 256<P≤384, the decoder may process one circulant in three cycles.

Aspects of the present disclosure recognize that the LDPC decoding circuitry may be reused to implement a wide range of LDPC codes by changing one or more parameters of the decoding circuitry. For example, an LDPC decoder that is configured for an LDPC code used in Wi-Fi communications (e.g., as defined by the IEEE 802.11 standards) may be dynamically reconfigured for an LDPC code used in 5G communications by changing one or more code definitions executed by the decoding circuitry. In some embodiments, parity-check matrices for one or more LDPC codes may be stored, as a set of parameterized data (e.g., parity-check information), in an LDPC repository. More specifically, the parity-check information may describe various aspects or features of each parity-check matrix (such as codeword length, number of information bits, circulant size, number of layers, and the like). Thus, the LDPC decoder may be configured (or reconfigured) to implement a parity-check matrix associated with a new LDPC code by dynamically updating the parity-check information stored in the LDPC repository.

Figure 5:
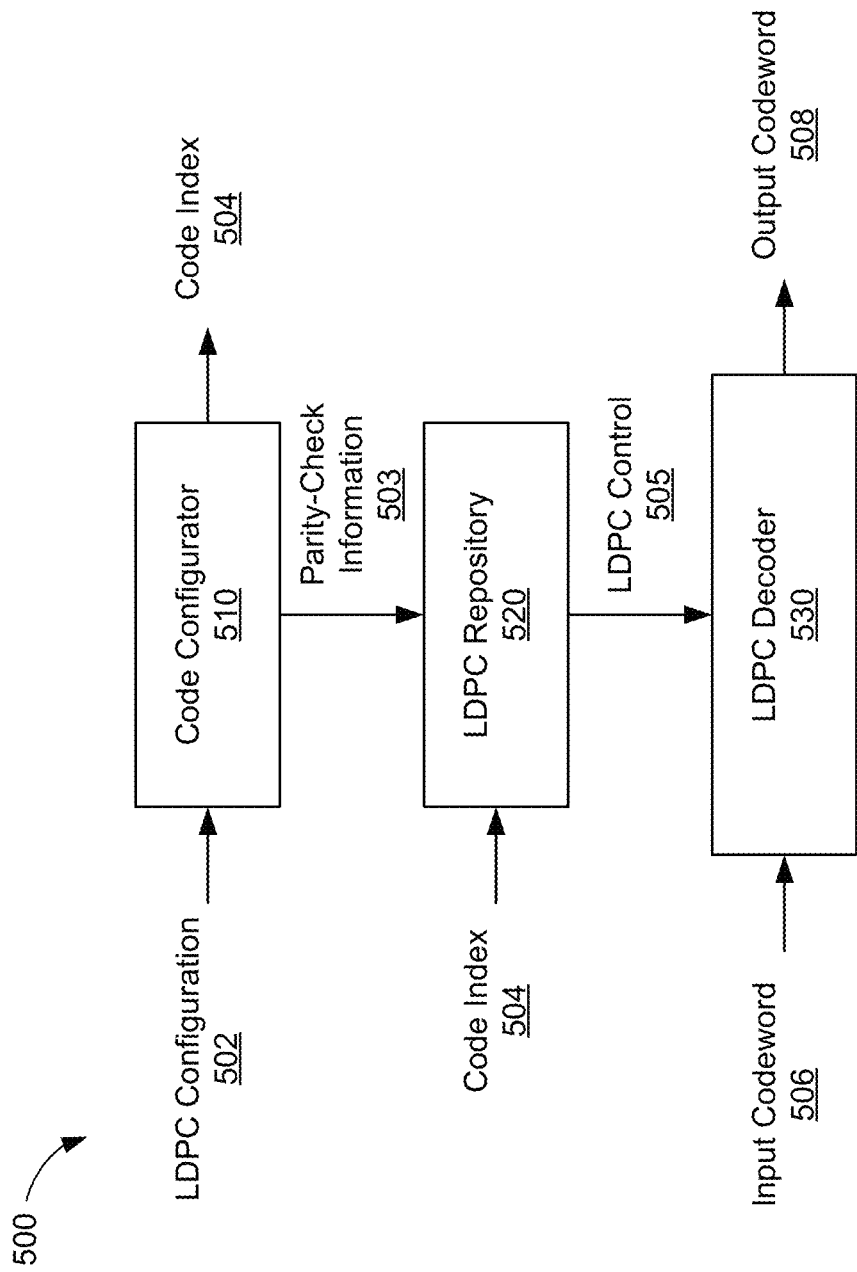
FIG. 5 is a block diagram of a programmable decoder circuit, in accordance with some embodiments.

FIG. 5 is a block diagram of a programmable decoder circuit 500, in accordance with some embodiments. In the example of FIG. 5, programmable decoder circuit 500 is configured to perform LDPC decoding operations. The decoder circuit 500 includes a code configurator 510, an LDPC repository 520, and an LDPC decoder 530. In some embodiments, the decoder circuit 500 may be programmable to support a wide range of LDPC codes (including standardized and custom codes). More specifically, the decoder circuit 500 may be dynamically configured (and reconfigured) to perform LDPC decoding operations in accordance with various LDPC codes by reading and writing parity-check information to and from the LDPC repository 520.

The code configurator 510 may receive an LDPC configuration 502 describing a parity-check matrix for an LDPC code. For example, the LDPC configuration 502 may describe or otherwise indicate the bit values (e.g., "1" or "0") in each column and each row of the associated parity-check matrix, as well as the number of information bits and/or parity bits in each LDPC codeword associated with the parity-check matrix. The code configurator 510 may store the LDPC configuration 502 as a set of parameterized data (e.g., parity-check information 503) in the LDPC repository 520. In some aspects, the parity-check information 503 may provide a high-level description of the associated parity-check matrix (such as codeword length, number of information bits, circulant size, number of layers, and the like). In some embodiments, the code configurator 510 may reuse or update at least some of the existing parity-check information in the LDPC repository 520 when storing the LDPC configuration 502. In some aspects, the code configurator 510 may further generate a code index 504 pointing to the storage location(s), in the LDPC repository 520, of the parity-check information 503 for the received LDPC configuration 502.

The LDPC repository 520 may store parity-check information for one or more LDPC codes. In some embodiments, the parity-check information stored by the LDPC repository 520 may be dynamically updated to reflect different parity-check matrices (e.g., for new LDPC codes). In some embodiments, the LDPC repository 520 may include a plurality of registers that are configured to store different parameters of each LDPC code. For example, aspects of the present disclosure recognize that multiple parity-check matrices may have at least some amount of parity-check information in common (such as the rotation of one or more circulant sub-matrices). Thus, one or more registers of the LDPC repository 520 may be shared or reused by multiple LDPC codes. As described above, the parity-check information associated with different LDPC codes may be indexed by the LDPC decoder 530. Thus, when configuring the decoder circuit 500 to implement a particular LDPC code, the LDPC repository 520 may receive an input specifying the code index 504 pointing to the storage location(s) associated with the LDPC code. The LDPC repository 520 may provide a set of LDPC control data 505 to the LDPC decoder 530 based on the received code index 504. In some aspects, the control data 505 may include at least some of the parity-check information 503 associated with the selected LDPC code.

The LDPC decoder 530 may read or receive the LDPC control data 505 from the LDPC repository 520. In some embodiments, the LDPC decoder 530 may implement a parity-check matrix based on the received LDPC control data 505. The LDPC decoder 530 may further receive an input codeword 506 and decode the received codeword 506 using the parity-check matrix associated with the LDPC control data 505. For example, the LDPC decoder 530 may check each bit of the input codeword 506 against the parity-check matrix, update the values for the selected bits based on the parity-check operations, and output the bits (e.g., bits that have either passed or been corrected by the parity-check operations) as an output codeword 508. It is noted that, for proper decoding, the input codeword 506 and the parity-check matrix implemented by the LDPC decoder 530 should correspond to the same LDPC code. Thus, in some embodiments, the LDPC decoder 530 may read or retrieve a particular set of LDPC control data 505 from the LDPC repository 520 based on the received input codeword 506. For example, a different code index 504 may be provided to the LDPC repository 520 for different input codewords 506 (e.g., depending on the LDPC code used to encode the codeword 506).

Figure 6A:
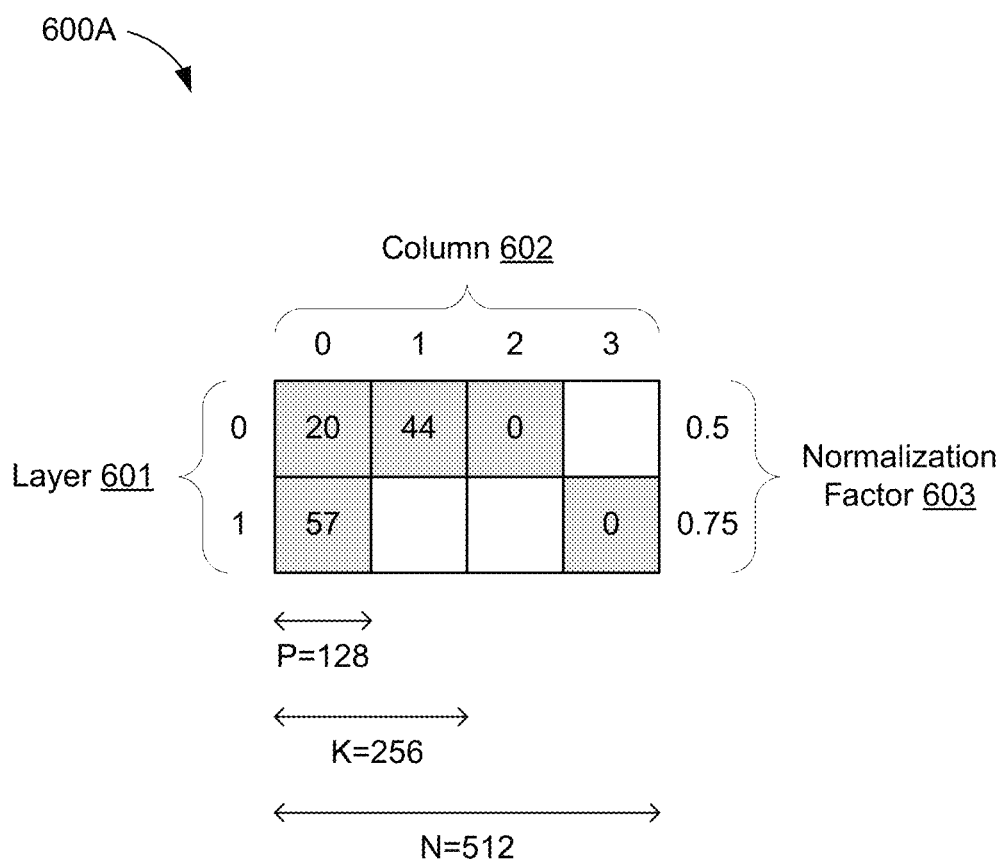
FIG. 6A shows an example LDPC configuration for an LDPC base matrix, in accordance with some embodiments.

FIG. 6A shows an example LDPC configuration for an LDPC base matrix 600A, in accordance with some embodiments. In some embodiments, the base matrix 600A may be associated with a QC LDPC code. The base matrix 600A includes a plurality of layers 601 (e.g., layers 0 and 1) each associated with a particular normalization factor 603 (e.g., 0.5 for layer 0 and 0.75 for layer 1). Each layer of the base matrix 600A is further subdivided into a plurality of columns 602 (e.g., columns 0-3), and each column within a given layer may correspond to an all-zero sub-matrix (depicted as a blank or empty square) or a circulant sub-matrix (depicted as a gray square with a numerical value inside). As described above with respect to FIGS. 2A and 2B, an all-zero sub-matrix may be a P×P matrix in which all of the values are 0 and a circulant sub-matrix may be a P×P matrix in which each row and column contains a number of 1's equal to its circulant weight.

The 1's in a circulant sub-matrix are arranged diagonally across the different layers, wrapping around in a circular fashion (e.g., from the last column to the first column of the sub-matrix). The numerical value inside each gray square indicates the rotation of the particular circulant. As used herein, the term "rotation" describes the initial offset of the diagonal of 1's. For any size rotation (r), the first 1 of the diagonal will reside in the $(r+1)^{th}$ column of the first row of the circulant. For example, when the rotation is equal to 0, the first 1 of the diagonal will reside in the first column of the first row of the circulant. On the other hand, when the rotation is equal 1, the first 1 of the diagonal will reside in the second column of the first row of that circulant (e.g., as shown in FIG. 2B). With reference for example to FIG. 2C, the circulant sub-matrix 200C can be described by two rotations, including a first rotation equal to 1 (e.g., the first 1 of the first diagonal resides in the second column of the first row of the circulant) and a second rotation equal to 7 (e.g., the first 1 of the second diagonal resides in the eighth column of the first row of the circulant).

In the example of FIG. 6A, the first layer (e.g., layer 0) of the base matrix 600A has three circulant sub-matrices, including a first circulant having a rotation of size 20 (e.g., in column 0), a second circulant having a rotation of size 44 (e.g., in column 1), and a third circulant having a rotation of size 0 (e.g., in column 2). The second layer (e.g., layer 1) of the base matrix 600A has two circulant sub-matrices, including a first circulant having a rotation of size 57 (e.g., in column 0) and a second circulant having a rotation of size 0 (e.g., in column 3). Each circulant sub-matrix comprises 128 rows and 128 columns (e.g., P=128). The base matrix 600A may be used to decode 512-bit LDPC codewords (e.g., N=512) in which only 256 bits are information bits (e.g., K=256). Thus, the remaining 256 bits of each LDPC codeword are parity bits.

Figure 6B:
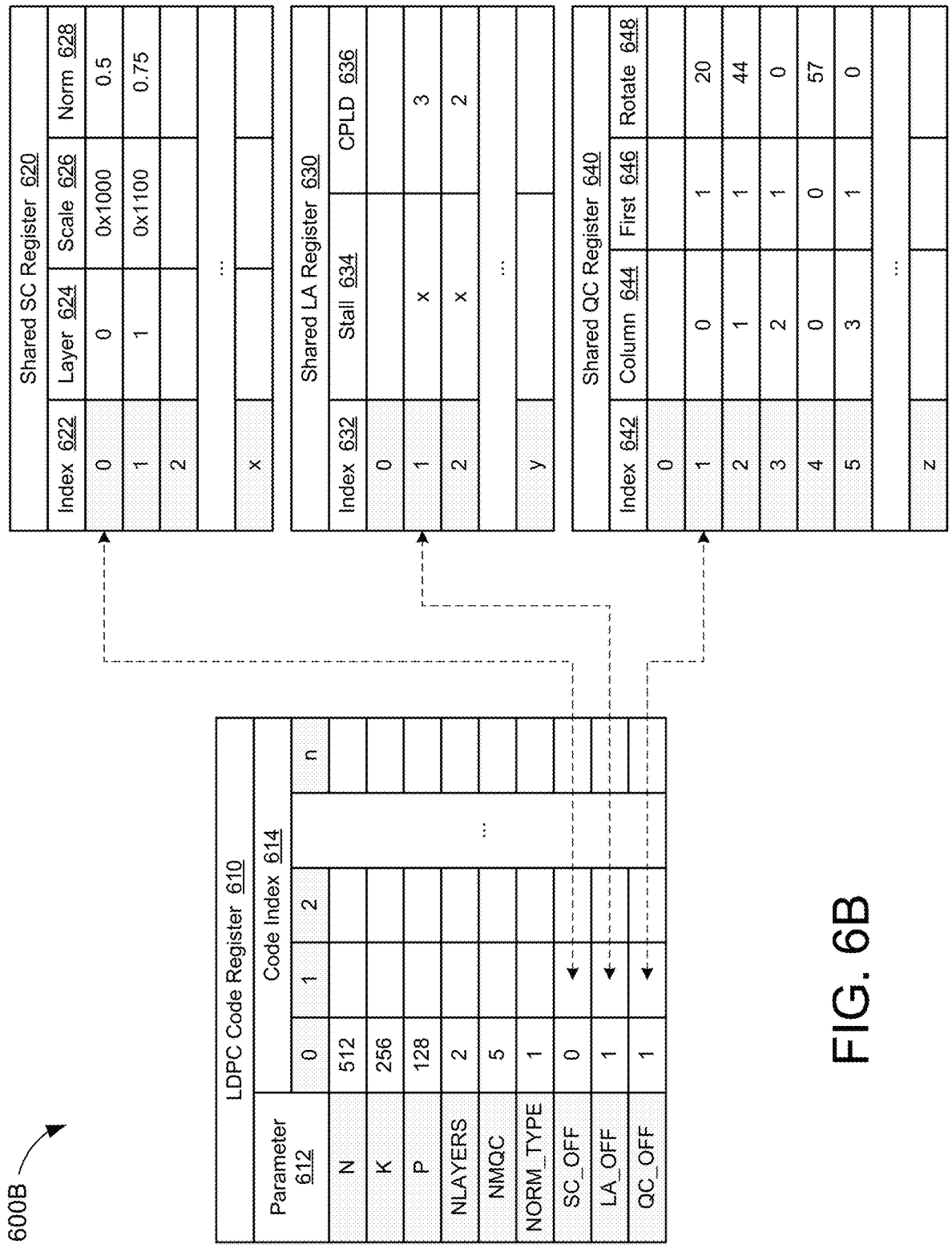
FIG. 6B shows an example configuration of an LDPC repository, in accordance with some embodiments.

FIG. 6B shows an example configuration of an LDPC repository 600B, in accordance with some embodiments. The LDPC repository 600B may represent an example configuration of the LDPC repository 520 of FIG. 5. In some embodiments, the LDPC repository 600B may be configured to store parity-check information describing parity-check matrices for one or more LDPC codes. In some aspects, at least some of the parity-check information stored in the LDPC repository 600B may be specific or unique to a particular LDPC code. In some other aspects, at least some of the parity-check information stored in the LDPC repository 600B may be common or shared among multiple LDPC codes. In the example of FIG. 6B, the LDPC repository 600B includes an LDPC code register 610, a shared scaling factor (SC) register 620, a shared layer (LA) register 630, and a shared circulant (QC) register 640.

The LDPC code register 610 may be configured to store code-specific parameters for one or more LDPC codes. Each row of the LDPC code register 610 may be associated with a different parameter 612 of the LDPC code. Example parameters 612 include, but are not limited to, the number of codeword bits (N), the number of information bits (K), the size of each sub-matrix (P), the number of layers in the base matrix (NLAYERS), the total number of circulant operations in the base matrix (NMQC), and whether normalization is to be applied (NORM_TYPE). In some implementations, N and K may be captured as multiples ($N_b$ and $K_b$, respectively) of P (e.g., where $N=P*N_b$ and $K=P*K_b$). Thus, P may be provided as an input along with the codeword data. As described in greater detail below, the parameters 612 may also include pointers to one or more shared registers. For example, the LDPC code register 610 may store a pointer to the shared SC register 620 (SC_OFF), a pointer to the shared LA register 630 (LA_OFF), and/or a pointer to the shared QC register 630 (QC_OFF). Each column of the LDPC code register 610 may be associated with a different code index 614. For example, the code-specific parameters for a particular LDPC code may be stored in the appropriate rows for the given index (e.g., 0-n). In the example of FIG. 6B, the rows associated with index 0 of the LDPC code register 610 are populated with parity-check information describing the base matrix 600A of FIG. 6A.

The shared SC register 620 may be configured to store the normalization factor to be applied to the processing of each layer of the base matrix. Data in the shared SC register 620 may be organized in a plurality of columns 622-628. The first column stores an SC index 622 for a corresponding set of scaling factors. The second column stores layer information 624 indicating the layer of the base matrix associated with a particular scaling factor. The third column stores scaling information 626 indicating a scale value (e.g., 0-15) to be used for generating each scaling factor. The fourth column stores normalization information 628 indicating the scaling factor (α) to be applied to each layer of the base matrix (e.g., α=1 when scale value is 0; and α=0.0625*

[scale value] when scale value is any number between 1-15). In some embodiments, the parity-check information stored by the SC register 620 may be shared or reused by multiple LDPC codes. For example, two or more LDPC codes stored in the LDPC code register 610 may use the same scaling factors, and may thus point to the same SC index 622 in the shared SC register 620.

The shared LA register 630 may be configured to store layer information describing the number of operations to be performed on each layer of the base matrix. Data in the shared LA register 630 may be organized in a plurality of columns 632-636. The first column stores an LA index 632 for a corresponding set of layer information. The second column stores a stall value 634 indicating the number of cycles (e.g., 0-255) to wait at the start of a layer to enforce data dependencies. For example, data dependencies often exist between layers and/or iterations of an LDPC decoding operation. To enforce such data dependencies, it may be desirable to ensure that at least a threshold amount of time has elapsed (e.g., corresponding to the stall value) between successive memory accesses to the same data. The third column of the LA register 630 stores a CPLD value 636 indicating the number of processing cycles per layer. It is noted that the number of circulant operations that can be performed in each of the cycles may depend on the packing factor (e.g., as described in greater detail below). In some embodiments, the parity-check information stored by the LA register 630 may be shared or reused by multiple LDPC codes. For example, two or more LDPC codes stored in the LDPC code register 610 may use the same layer information, and may thus point to the same LA index 632 in the shared LA register 630.

The shared QC register 640 may be configured to store circulant information describing one or more circulant sub-matrices included in the base matrix. Data in the shared QC register 640 may be organized in a plurality of columns 642-648. The first column stores a QC index 642 for a corresponding set of circulants. The second column 644 stores column information 644 indicating the column of the base matrix in which a particular circulant can be found. The third column stores a first-use value 646 indicating whether the corresponding column of the base matrix is being used or accessed for the first time in the decoding operation. The fourth column stores rotation information 648 indicating the size of the rotation of the corresponding circulant sub-matrix. In some embodiments, the parity-check information stored by the QC register 640 may be shared or reused by multiple LDPC codes. For example, two or more LDPC codes stored in the LDPC code register 610 may use the same circulant information, and may thus point to the same QC index 642 in the shared QC register 640.

It is noted that the configuration shown in FIG. 6B provides significant flexibility in the way LDPC codes are stored and/or accessed in the LDPC register 600B. For example, the parity-check information stored in one or more of the shared registers 620-640 may be reused to support different code rates and/or codeword sizes. In some aspects, the size of the sub-matrix (e.g., in the LPDC code register 610) may be modified to support different codeword sizes at the same code rate. For example, the N, K, and/or P parameters associated with a particular code index may be changed while maintaining the same pointer values SC_OFF, LA_OFF, and QC_OFF. In some other aspects, a portion of the base matrix may be reused to support different codeword sizes and rates for the same number of information bits (K). For example, it may be possible to reduce the number of columns in a particular base matrix by reducing the number of layer (NLAYERS) and the codeword length (N) while maintaining the same pointer values SC_OFF, LA_OFF, and QC_OFF. This may result in an increase in code rate as the number of parity bits and codeword size is reduced. Still further, in some aspects, a portion of the base matrix may be reused to support different code rates for the same codeword size. For example, it may be possible to reduce the number of layers (NLAYERS) to increase the number of information bits (K) at a constant codeword length (N) by adjusting the pointer values SC_OFF, LA_OFF, and QC_OFF (and adjusting NLAYERS and K).

Figure 7:
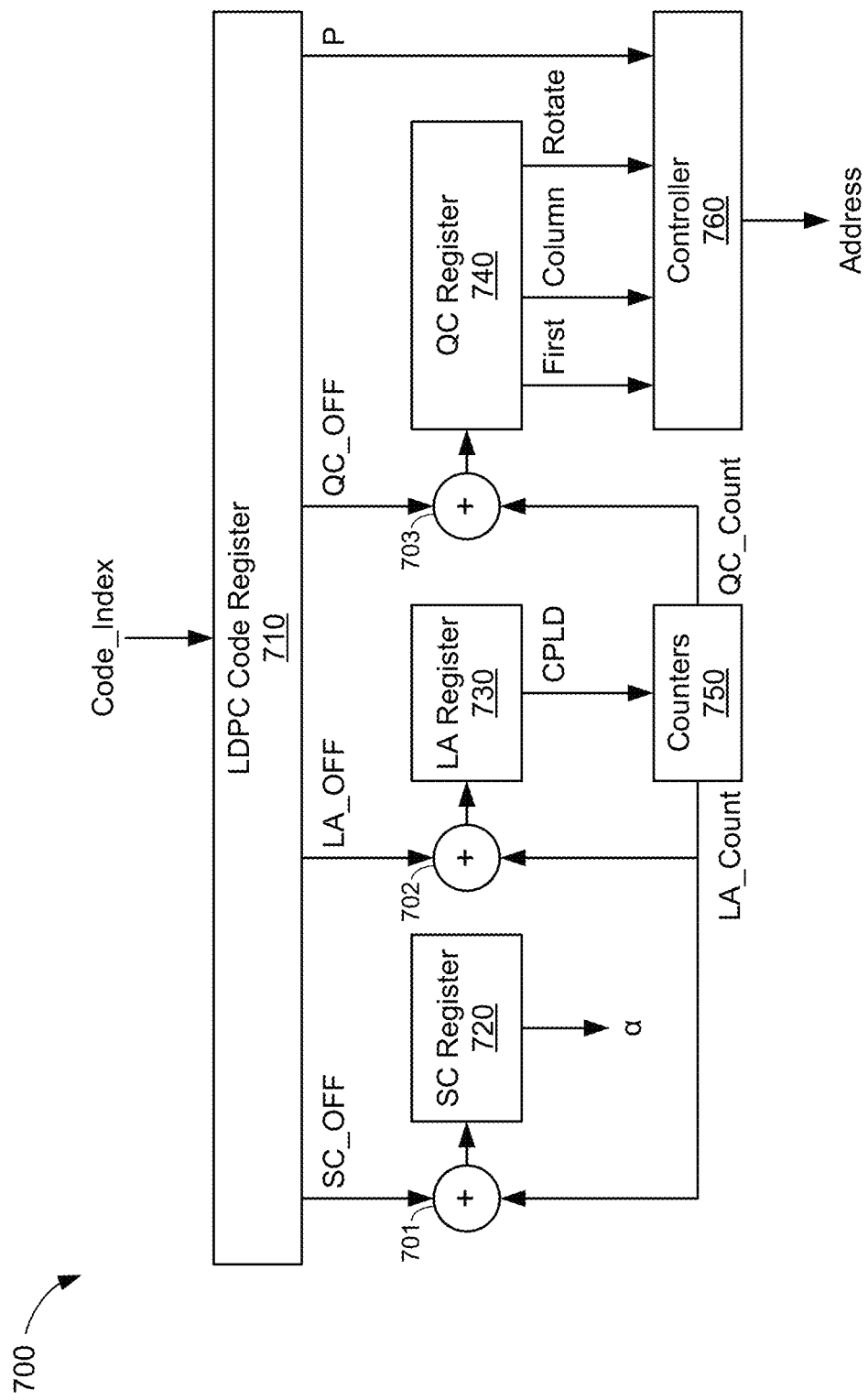
FIG. 7 is a block diagram of an example LDPC repository, in accordance with some embodiments.

FIG. 7 is a block diagram of an example LDPC repository 700, in accordance with some embodiments. The LDPC repository 700 may be an example embodiment of the LDPC repository 520 of FIG. 5. In some embodiments, the LDPC repository 700 may be configured to store parity-check information describing parity-check matrices for one or more LDPC codes. More specifically, the LDPC repository 700 may generate a set of LDPC control data, to control a decoding operation of a programmable LDPC decoder, for a selected LDPC code. The LDPC control data may enable the programmable LDPC decoder to decode an LDPC codeword using a parity-check matrix associated with the LDPC code used to encode the LDPC codeword.

The LDPC repository 700 includes an LDPC code register 710, an SC register 720, an LA register 730, and a QC register 740. In some embodiments, the LDPC code register 710 may be configured according to the LDPC code register 610 of FIG. 6B. Thus, the LDPC code register 710 may be configured to store code-specific parameters for one or more LDPC codes (e.g., N, K, P, NLAYERS, NMQC, and NORM_TYPE) and pointers to one or more shared registers (e.g., SC_OFF, LA_OFF, and QC_OFF). In some embodiments, the SC register 720 may be configured according to the shared SC register 620 of FIG. 6B. Thus, the SC register 720 may be configured to store the normalization factor ($\alpha$) to be applied to the processing of each layer of the base matrix. In some embodiments, the LA register 730 may be configured according to the shared LA register 630 of FIG. 6B. Thus, the LA register 730 may be configured to store layer information (e.g., CPLD) describing the number of processing cycles to be performed on each layer of the base matrix. In some embodiments, the QC register 740 may be configured according to the shared QC register 640 of FIG. 6B. Thus, the QC register 740 may be configured to store circulant information (e.g., First, Column, Rotate) describing one or more circulant sub-matrices included in the base matrix.

In some embodiments, the LDPC repository 700 may include additional circuitry for retrieving or reading the LDPC control data from the registers 710-740. For example, the additional circuitry may include a set of counters 750, a controller 760, and a plurality of adders 701-703. The adders 701-703 may be coupled to the registers 720-740, respectively, to retrieve shared parity-check information associated with a selected LDPC code. For example, the LDPC code register 710 may receive a code index (Code_Index) identifying a particular parity-check matrix stored in the LDPC repository 700. The LDPC code register 710 may output a set of parameters associated with the corresponding code index. For example, the parameters may include the sub-matrix size (P) and pointers to respective registers 720-740 (SC_OFF, LA_OFF, and QC_OFF).

The counters 750 may generate a layer count value (LA_Count) and a circulant count value (QC_Count) based, at least in part, on the number of processing cycles to be performed on each layer of the base matrix (CPLD). More specifically, LA_Count may be used to increment the pointers to the SC register 720 and LA register 730 by adding the LA_Count value to SC_OFF and LA_OFF, respectively, via the adders 701 and 702. Moreover, QC_Count may be used to increment the pointer to the QC register 740 by adding the QC_Count value to QC_OFF via the adder 703. In some embodiments, the counters 750 may be initialized to a count value of zero (e.g., LA_Count=0 and QC_Count=0). The counters 750 may increment LA_Count to retrieve, from the SC register 720, the scaling factor (α) associated with each layer of the base matrix and to retrieve, from the LA register 730, the number of processing cycles to be performed (CPLD) on each layer of the base matrix. the counters 750 may further increment QC_Count to retrieve, from the QC register 740, the circulant information (First, Column, and Rotate) for each layer of the base matrix. In some aspects, the counter 750 may determine when to increment LA_Count based on the current QC_Count value and the CPLD information output by the LA register 730. For example, the counter 750 may increment LA_Count once the QC_Count value is equal to the total number of count values for the current layer (e.g., as indicated by CPLD).

The controller 760 may generate a memory address (Address) based, at least in part, on the circulant information output by the QC register 740 and one or more LDPC code parameters output by the LDPC code register 710. For example, the controller 760 may determine the location in memory at which a selected portion of the LDPC codeword is stored. The selected portion may coincide with the column(s) of the LDPC codeword to participate in the current processing cycle of the LDPC decoding operation. In some embodiments, the controller 760 may determine the memory address of the selected portion of the LDPC codeword based, at least in part, on the sub-matrix size (P) and the column of the base matrix in which a corresponding circulant is located (Column). In some aspects, the controller 760 may retrieve additional information (not shown for simplicity) from the LDPC code register 710 for determining the memory address. Such additional information may include, for example, a parameter indicating the number of M-size vectors in the codeword (N) accounting for sub-matrix size (P) and packing.

Figure 8:
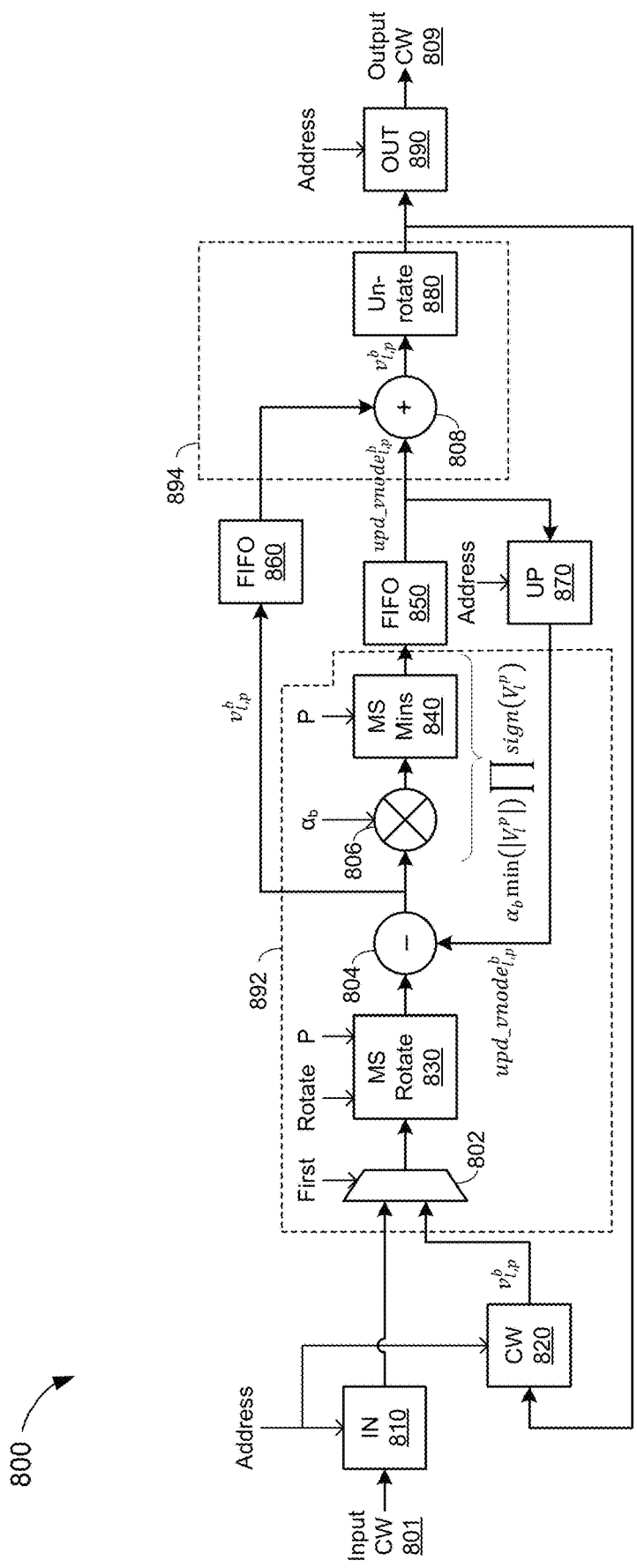
FIG. 8 is a block diagram of a programmable LDPC decoder, in accordance with some embodiments.

FIG. 8 is a block diagram of a programmable LDPC decoder 800, in accordance with some embodiments. The programmable LDPC decoder 800 may be an example embodiment of the LDPC decoder 530 of FIG. 5. In some embodiments, the LDPC decoder 800 may be dynamically configured (and reconfigured) to perform LDPC decoding operations in accordance with one or more LDPC codes stored in an LDPC repository (such as the LDPC repository 700 of FIG. 7). For example, the LDPC decoder 800 may implement a parity-check matrix associated with a selected LDPC code based on LDPC control data provided by the LDPC repository. In some embodiments, the LDPC decoder 800 may be configured to process multiple circulants of the parity-check matrix in parallel. For example, the LDPC decoder 800 may pack multiple circulant operations into a single processing cycle (e.g., clock cycle).

The LDPC decoder 800 includes an input (IN) buffer 810, a codeword (CW) buffer 820, a multi-size (MS) rotator 830, an MS minimum generator 840, first-in first-out (FIFO) buffers 850 and 860, an update (UP) buffer 870, an un-rotator 880, and an output (OUT) buffer 890. In some embodiments, the buffers 810, 820, 870, and 890 may correspond to random access memory (RAM). However, in actual implementations, any type of data storage device may be used to implement the buffers 810, 820, 870, and 890. In some implementations, the buffers 810, 820, 870, and/or 890 may be combined in various ways. For example, in some aspects, the input buffer 810, CW buffer 820, and/or output buffer 890 may be combined to reduce the amount of time spent reading and writing input and output data between the buffers.

The input buffer 810 may receive and store an input codeword (CW) 801 to be decoded. In some embodiments, each bit of the input codeword 801 may be represented by a log-likelihood ratio (LLR):

$$LLR(x) = \ln\left(\frac{Pr(x=1)}{Pr(x=0)}\right)$$

where Pr(x=1) is the probability that a particular bit (x) of the input codeword 801 is 1 and Pr(x=0) is the probability that the particular bit (x) of the input codeword 801 is 0. Thus, negative LLR values may be interpreted as a hard binary "0" value and positive LLR values (and LLR=0) may be interpreted as a hard binary "1" value. It is noted that, in other implementations, negative LLR values may be interpreted as a hard binary "1" value and positive LLR values (and LLR=0) may be interpreted as a hard binary "0" value.

In some embodiments, one or more of the buffers 810, 820, and/or 890 may be partitioned into a number (NMB) of memory banks to enable parallel decoding operations to be performed on LLRs associated with multiple columns of the input codeword 801. For example, the width of the input buffer 810 may be equal to a number (M) of LLRs. Thus, each individual memory bank may have a width equal to m, where m=M/NMB. In some aspects, the LLRs of the input codeword 801 may be stored across the plurality of memory banks in a round-robin fashion. During each processing cycle of the LDPC decoding operation, each memory bank may output up to m LLRs (e.g., for a maximum of M LLRs that can be output in parallel by the input buffer 810). For example, if the input buffer 810 is partitioned into 4 memory banks (NMB=4) with a combined width equal to 128 LLRs (M=128), the input buffer 810 may be configured to output either 1 column (e.g., P=128), 2 columns (e.g., P=64), or 4 columns (e.g., P=32) of the input codeword in parallel. Accordingly, the partitioning of the input buffer 810 (e.g., into a plurality of memory banks) may facilitate the processing of multiple circulants of the parity-check matrix in parallel (e.g., in a single processing cycle).

At runtime, the input buffer 810 may receive LDPC control data (e.g., Address) from the LDPC repository indicating the memory addresses of selected LLRs that participate in the current layer of decoding. The selected LLRs may be provided as inputs to a multiplexer 802 which selectively outputs the LLRs from the input buffer 810 (or a set of LLRs from the codeword buffer 820) to the MS rotator 830 based on LDPC control data (e.g., First) received from the LDPC repository. In some embodiments, the multiplexer 802 may output the LLRs from the input buffer 810 only if the LLRs are being used for the first time in the decoding operation (e.g., First=1). For any subsequent circulant operations performed on the same set of the LLRs within the same layer (e.g., First=0), the multiplexer 802 may output updated LLR values from the CW buffer 820 instead. In some other embodiments, the multiplexer 802 may output the LLRs from the input buffer 810 for each of the circulant operations (e.g., when the CW buffer 820 is combined or integrated with the input buffer 810).

The MS rotator 830 receives the LLRs from the multiplexer 802 and rotates the received LLRs based on LDPC control data (e.g., Rotate and P) received from the LDPC repository. For example, the MS rotator 830 may shift or rotate the LLRs stored in memory to coincide with the rotation(s) of the circulant sub-matrices to be applied in the current processing cycle (e.g., so that the circulant operations can be performed on the LLRs in the correct order). The MS rotator 830 may determine the size of the rotation(s) to be applied to the LLRs based at least in part on the rotation (e.g., Rotate) and sub-matrix size (e.g., P) of the circulants. In some embodiments, the MS rotator 830 may be configured to perform multiple rotations, concurrently, on the received LLRs based on the number of circulants that are packed into the current processing cycle. For example, when the LDPC decoder 800 is configured to perform 2 circulant operations in parallel (e.g., where at least some of the hardware of the LDPC decoder 800 is reused), the MS rotator 830 may perform 2 concurrent rotations (e.g., performing a different rotation on each subset of LLRs) on the LLRs received from the multiplexer 802. Similarly, when the LDPC decoder 800 is configured to perform 4 circulant operations in parallel, the MS rotator 830 may perform 4 concurrent rotations on the LLRs received form the multiplexer 802. Accordingly, the MS rotator 830 may further facilitate the processing of multiple circulants of the parity-check matrix in parallel (e.g., in a single processing cycle).

The rotated LLRs may be combined, by a subtractor circuit 804, with update messages (e.g., $upd\_vnode_{l,p}^b$) from the update buffer 870. It is noted that each of the update messages $upd\_vnode_{l,p}^b$ may correspond to respective updates $upd\_vnode_{l,p}^b$ of FIGS. 4A and 4B. More specifically, the subtractor circuit 804 may subtract the update messages $upd\_vnode_{l,p}^b$ from the LLRs $v_{l,p}^b$ (e.g., as described in line 4 of the layered decoding operation 400A of FIG. 4A). In some aspects, the resulting LLRs $v_{l,p}^b$ may be buffered by the FIFO 860. In some other aspects, the MS minimum generator 840 may compute the extrinsic minimum values of the LLRs $v_{l,p}^b$ (e.g., by computing $\min(|V_i^p|)$ $\Pi sign(V_i^p)$ as described in line 7 of the layered decoding operation 400A of FIG. 4A). In some embodiments, the MS minimum generator 840 may be configured to compute multiple extrinsic minimum values, concurrently, for different sets of LLRs based on the number of circulants that are packed into the current processing cycle. Accordingly, the MS minimum generator 840 may further facilitate the processing of multiple circulants of the parity-check matrix in parallel (e.g., in a single processing cycle). In some aspects, a multiplier 806 may apply a scaling factor ($\alpha_b$) to the extrinsic minimum values $\min(|V_i^p|)$ to generate scaled extrinsic minimum values, which correspond to update messages $upd\_vnode_{l,p}^b$ for the current layer being processed.

The update messages $upd\_vnode_{l,p}^b$ output by the MS minimum generator 840 may be buffered by the FIFO 850. In some embodiments, the FIFO 850 may be configured to store (for each layer) $sign(V_i^p)$, the $\Pi sign(V_i^p)$, and the two lowest "minima" calculated for $\min(|V_i^p|)$. For example, the first minimum may correspond to the lowest magnitude calculated across all $V_i^p$ and the second minimum may correspond to the second-lowest magnitude calculated across all $V_i^p$. Aspects of the present disclosure recognize that the magnitude of $upd\_vnode_{l,p}^b$ may correspond to the first minimum or the second minimum, depending on whether the value $V_i^p$ excluded from the min-sum calculation corresponds to the first minimum. Thus, in some embodiments, $upd\_vnode_{l,p}^b$ may be reconstructed at the output of the FIFO 850 based on the values stored for each layer. For example, the sign of $upd\_vnode_{l,p}^b$ may be determined based on the product of $sign(V_i^p)$ and $\Pi sign(V_i^p)$, and the magnitude of $upd\_vnode_{l,p}^b$ may correspond to the first minimum or the second minimum stored therein (e.g., depending on the value $V_i^p$ excluded from the min-sum calculation).

In some aspects, the FIFO 850 may output the update messages $upd\_vnode_{l,p}^b$ to the update buffer 870, where the update messages $upd\_vnode_{l,p}^b$ are subsequently stored (e.g., for use in the next layer of the decoding operation). In some other aspects, the update messages $upd\_vnode_{l,p}^b$ may be combined, by an adder circuit 808, with the LLRs $v_{l,p}^b$ from the FIFO 860, and the updated LLRs $v_{l,p}^b$ may be rotated by the un-rotator 880. More specifically, the adder circuit 808 may add the update messages $upd\_vnode_{l,p}^b$ to the LLRs $v_{l,p}^b$ (e.g., as described in line 10 of the layered decoding operation 400A of FIG. 4A). The un-rotator 880 may undo the rotation applied by the MS rotator 830 so that the resulting LLRs $v_{l,p}^b$ can be returned to memory in their original positions. In some implementations, the un-rotator 880 may be bypassed or excluded from the LDPC decoder 800. In some aspects, the resulting LLRs $v_{l,p}^b$ may be stored in the codeword buffer 820 (e.g., for use in the next layer of the decoding operation). In some other aspects, the resulting LLRs $v_{l,p}^b$ may be stored in the output buffer 890 to be combined into an output codeword 809. In some embodiments, the output buffer 890 may receive LDPC control data (e.g., Address) from the LDPC repository indicating the memory addresses of selected LLRs stored in the output buffer 890. The selected LLRs may be output from the output buffer 890 as the output codeword 809.

It is noted that, in some embodiments, one or more circulants of a base matrix may have a circulant weight greater than 1 (e.g., as shown in FIG. 2C). In such embodiments, data dependencies may exist between the update messages in a particular layer. As such, the layered decoding operation described above (e.g., with reference to FIG. 4A) may not be implemented by processing the P rows of a particular layer in parallel. However, aspects of the present disclosure recognize that, by computing row updates for each row and storing the row updates in a storage element, a layer update operation may be performed using the stored row updates for sub-matrices having circulant weights greater than 1 in the P rows. This allows the row updates to be performed in parallel. More specifically, the P rows of the same layer may be processed in parallel despite the data dependencies between the P rows.

In the example of FIG. 8, for purposes of illustration, a bounding box 892 indicates a portion of the programmable LDPC decoder 800 that may be referred to as a first stage. The first stage, which also may be referred to as the "Mins Loop," generally corresponds to lines 3-5 and 6-8 of FIG. 4A. Bounding box 894 indicates another portion of the programmable LDPC decoder 800 that may be referred to as a second stage. The second stage, which also may be referred to as the "Update Loop," generally corresponds to lines 9-11 of FIG. 4A.

Figures 9, 10:
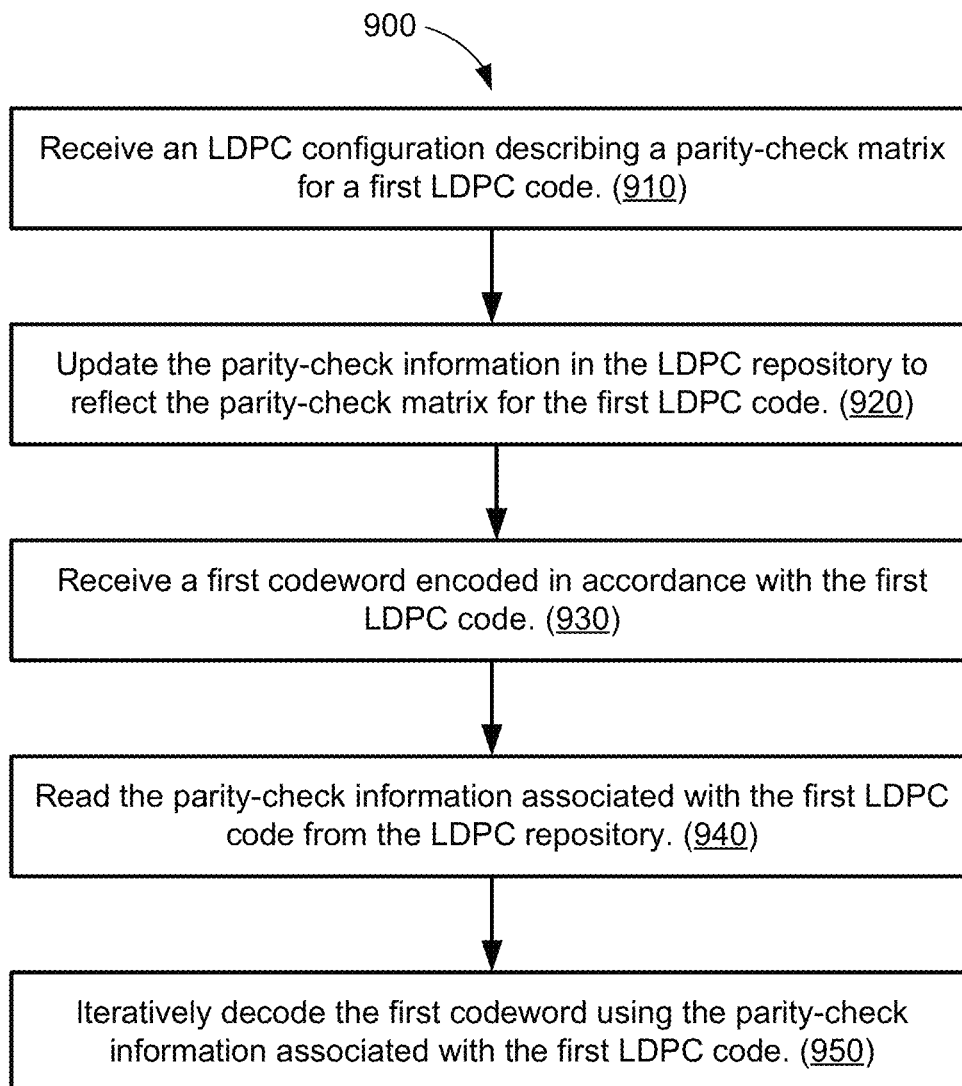
FIG. 9 is an illustrative flow chart depicting an example operation of a programmable LDPC decoder, in accordance with some embodiments.
FIG. 10 illustrates an example of a parity portion of a double diagonal matrix.

FIG. 9 is an illustrative flow chart depicting an example operation 900 of a programmable LDPC decoder, in accordance with some embodiments. Although described below with respect to the decoder circuit 500 of FIG. 5, the example operation 900 may be performed by any suitable decoder circuit.

The decoder circuit 500 may receive an LDPC configuration describing a parity-check matrix for a first LDPC code (910). For example, the decoder circuit 500 may receive an LDPC configuration describing a parity-check matrix for an LDPC code. The LDPC configuration may describe or otherwise indicate the bit values (e.g., "1" or "0") in each column and each row of the associated parity-check matrix, as well as the number of information bits and/or parity bits in each LDPC codeword associated with the parity-check matrix.

The decoder circuit 500 may then update the parity-check information in the LDPC repository to reflect the parity-check matrix for the first LDPC code (920). For example, the decoder circuit 500 may store the LDPC configuration as a set of parameterized data (e.g., parity-check information) in the LDPC repository. In some aspects, the parity-check information may provide a high-level description of the associated parity-check matrix (such as codeword length, number of information bits, circulant size, number of layers, and the like).

The decoder circuit 500 may further receive a first codeword encoded in accordance with the first LDPC code (930). For example, the decoder circuit 500 may implement a parity-check matrix based on the parity-check information stored in the LDPC repository. In some embodiments, the decoder circuit 500 may use the parity-check matrix to decode the received codeword.

The decoder circuit 500 may then read the parity-check information associated with the first LDPC code from the LDPC repository (940). In some embodiments, the decoder circuit 500 may read or retrieve a particular set of parity-check information from the LDPC repository based on the received input codeword. For example, a different code index may be provided to the LDPC repository for different codewords (e.g., depending on the LDPC code used to encode the codeword).

The decoder circuit 500 may iteratively decode the first codeword using the parity-check information associated with the first LDPC code (950). For example, the LDPC decoder 530 may check each bit of the input codeword 506 against the parity-check matrix, update the values for the selected bits based on the parity-check operations, and output the bits (e.g., bits that have either passed or been corrected by the parity-check operations) as an output codeword 508.

In accordance with another aspect of the inventive arrangements described within this disclosure, a decoder circuit is capable of performing LDPC encoding in addition to LDPC decoding as described herein. For example, the LDPC decoder circuitry portion of the decoder circuit may implement a data path that is configurable at runtime (e.g., during operation) to perform LDPC encoding or LDPC decoding based on control information provided thereto. In one or more embodiments, the LDPC decoder may be switched, on a per data block basis, between performing LDPC encoding or LDPC decoding during operation. In particular embodiments, the LDPC decoder may further be switched on a per layer basis between performing LDPC encoding or LDPC decoding during operation. In each case, whether taking a per data block or a per layer approach, e.g., for purposes of interleaving, the particular LDPC codes used may also change for each data block or layer as the case may be. The decoder circuit is capable of performing LDPC encoding on received information using parity-check information for LDPC encoding that is stored in the LDPC repository. As such, the LDPC repository may be shared and used for both LDPC decoding and LDPC encoding. In some embodiments, certain parity-check information stored in the LDPC repository is used for LDPC decoding while different parity-check information is used for LDPC encoding. In other embodiments, the same parity-check information may be used for both LDPC decoding and LDPC encoding.

In one or more embodiments, the parity-check information for LDPC encoding is generated in an offline process using one or more of the techniques described herein. For purposes of discussion and with reference to FIG. 2A, a parity-check matrix such as 200A and represented as H includes the information part 202, also referred to as N, and a parity part 204, also referred to as M. The information bits of a codeword can be denoted as S and the parity bits of the codeword as C. The product of H with the codeword [SC] is 0 and is given by expression 1 below.

$$[N\ M]\begin{bmatrix}S\\C\end{bmatrix}=0 \quad (1)$$

Expression 1 can be rewritten as expression 2 below.

$$NS=MC \quad (2)$$

If the parity part M of H only contains one new parity bit per row, as is the case with parity-check matrix 200A of FIG. 2A, the parity-check matrix is lower triangular. In the example of FIG. 2A, row b=1 includes a single parity bit a1. Row b=2 includes a single parity bit a2. Row b=3 has parity bits a2 and a3, where parity bit a3 is the only new parity bit introduced. As may be observed, each row of parity-check matrix 200A introduces one "new" parity bit. In such cases, it is possible to solve for C (the parity bits) using a back-substitution process where the decoder circuit uses expression 2 to solve for each row of the parity-check matrix. By processing each row of the parity-check matrix in turn (or a layer if P>1), the decoder circuit is capable of solving for the unknown parity bits to perform LDPC encoding of information.

For example, referring to parity-check matrix 200A of FIG. 2A, the first row in FIG. 2A is a parity equation involving only information bits i1, i3, i5, i7, i9, i11, i13, i14, i15, i17, and i19. The decoder circuit is capable of determining parity bit a1 by performing a modulo-2 sum (e.g., XORing the bits) of the information bits i1, i3, i5, i7, i9, i11, i13, i14, i15, i17, and i19. Since the modulo-2 sum of the information bits and the unknown parity bit must be zero, the modulo-2 sum of the information bits is the value for the parity bit a1. For example, if the modulo-2 sum of the information bits is 1, the parity bit a1 must be 1 to sum to 0. If the modulo-2 sum of the information bits is 0, the parity bit a1 must be 0 to sum to 0. The next row of H can be used to establish the next unknown parity bit, and so on until all the parity bits are determined.

In other cases, the parity-check matrix includes more than one new parity bit per row. For example, LDPC codes used in WiFi and 5G New Radio have parity-check matrices referred to as "double diagonal" matrices. The parity-check matrices for LDPC codes used in WiFi and 5G New Radio generally include more than one new parity bit per row. The techniques for generating parity bits for double diagonal matrices differ from the techniques for generating parity bits for lower triangular matrices. These processing techniques involve processing the parity-check matrix offline to generate a derivative of the parity-check matrix that may be used for LDPC encoding. A description of the derivative of the parity-check matrix may be loaded into the decoder circuit and used to perform LDPC encoding.

For example, a first technique for processing a double diagonal type of parity-check matrix H involves reducing the parity portion of H (e.g., reduce M) to a lower triangular form. The parity portion of H can be reduced so that H is in lower triangular form by adding rows to H. The resulting matrix is a lower triangular matrix that is suitable for LDPC encoding. The resulting matrix, however, is no longer suitable for LDPC decoding. Appreciably, parity-check information specifying the derivative of the parity-check matrix may be generated and stored in the decoder circuit for purposes of LDPC encoding while other parity-check information specifying the original parity-check matrix is also stored for purposes of decoding, if need be.

The first technique requires that rows be added to the parity-check matrix H to remove parity bits above the diagonal to create a lower diagonal portion. For example, adding a row to H that has an element with the same rotation will result in cancellation since the diagonals line up on one another and two 1 values sum to 0. This allows a 1 in the parity column to be eliminated for a row. When elements in the row are added with different rotations, an increase in the number of circulants occurs. As such, the first technique for reducing the parity portion of H can be used to reduce the parity part to lower triangular. The first technique, however, may result in an increase in the number of circulants in other portions of H, which can be computationally expensive.

In one or more other embodiments, a second technique for processing certain double diagonal parity-check matrices involves summing all rows of H to produce an equation containing only a single parity bit. The result can be used with the original matrix to solve for the parity bits. The second technique exploits the property of certain double diagonal matrices (e.g., those corresponding to Wifi and 5G New Radio codes) where the summation of all the rows results in the cancellation of all but one of the parity columns. The decoder circuit is capable of solving this new equation to obtain the first parity column. The decoder circuit may then use the original parity-check matrix to obtain the remaining parity columns.

FIG. 10 illustrates an example of a parity portion M of a double diagonal matrix. In the example of FIG. 10, each number in the parity portion M represents a circulant (e.g., P×P identity matrix) with the specified rotation. Each "." indicates that the sub-matrix is all zero. In the example of FIG. 10, all columns of the parity portion M except column 1 have a total of 2 circulants with the same rotation of 0. As such, each column with the exception of column 1 sums to 0. Column 1 has 3 circulants, two of which are the same and have a 0 rotation that will cancel leaving the third circulant with a rotation of 1. This is illustrated in expression 3 below.

$$[111111]M=[100000] \qquad (3)$$

As stated previously the check equations satisfy expression 2. Multiplying both sides of expression 2 by [111111] results in expression 4 below.

$$[111111]NS=[111111]MC \qquad (4)$$

Substituting [100000] for [111111]M in expression 4 (where [100000] is obtained from expression 3) results in expression 5 below.

$$[111111]NS=[100000]C \qquad (5)$$

In the above example, the quantity NS can be computed and reused when solving for the remaining parity bits using expression 2. As discussed, expression 2 can be solved using the back-substitution process previously described since the first parity bit in the double diagonal matrix is determined.

In one or more other embodiments, more complex encode matrices can be supported by the current instruction definition. For example, the solution to certain types of double diagonal matrices can be realized by solving for the first parity column using an additional equation formed from the sum of other rows of the H matrix as described above. The overhead of doing this can be minimized by re-using intermediate terms such as the sum of information bits of each of the rows of H, e.g., NS. Additional storage for these intermediate terms can be provided within the memories (e.g., RAMs) of the LDPC decoder by defining the number of columns to be larger than N, where the value is specified in the code definition register.

In general, the decoder circuit is capable of performing an LDPC encode operation that is defined using a modified H matrix with additional steps such as the calculation of intermediate terms. The intermediate terms may be implemented as new rows of the modified H matrix. The modified H matrix, while suitable for encoding, is not suitable for decoding. The modified H matrix captures the operations that need to be performed in a consistent manner for LDPC encoding.

FIG. 11 shows an example parity-check matrix 1100, in accordance with some embodiments. As an illustrative and non-limiting example, the parity-check matrix 1100 may be used within 5G New Radio applications. For purposes of illustration, the number of information columns has been reduced to 5 and the number of layers reduced to 8. In the example of FIG. 11, the parity-check matrix 1100 includes an inner "double-diagonal" portion 1102 highlighted by the thicker bounding box and a single diagonal extension formed of rows 5, 6, 7, and 8.

Figure 12:
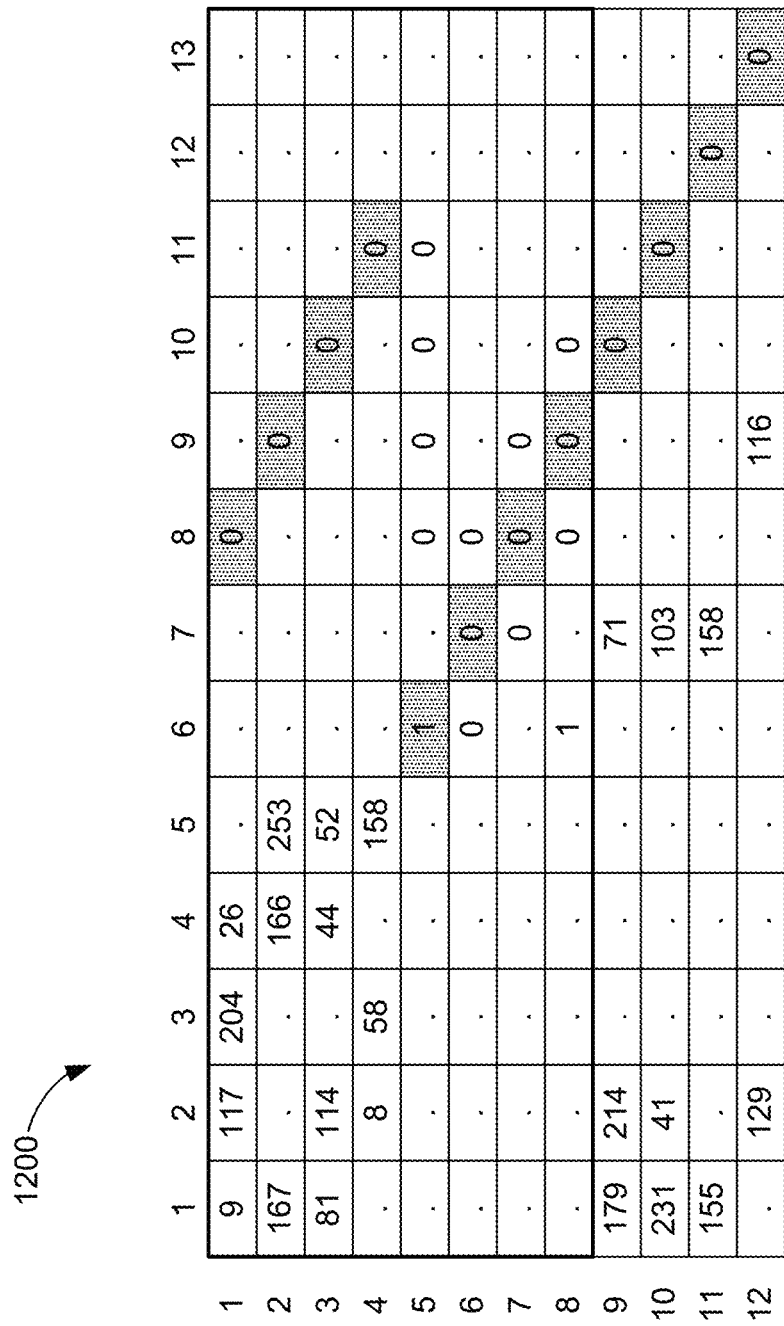
FIG. 12 shows an example of a derivative parity-check matrix for encoding, in accordance with some embodiments.

FIG. 12 shows an example of a derivative 1200 of a parity-check matrix for encoding, in accordance with some embodiments. The modified parity-check matrix 1200 is generated from the parity-check matrix 1100 of FIG. 11. Using the derivative 1200 of FIG. 12, which may be specified by parity-check information stored in the decoder circuit, the decoder circuit is capable of performing LDPC encoding of information, e.g., data blocks. The decoder circuit, for example, is capable of performing the encoding in two different parts where the inner double diagonal matrix is handled using layers 1-8 and the remaining layers 9-12 are used to handle the single diagonal extension.

The decoder circuit is capable of handling the double diagonal matrix using the method described above where another parity-check equation is generated and solved to determine the first parity bit. The decoder circuit is capable of performing this operation using the first 5 layers of derivative 1200, where the first 4 rows correspond to the operations to calculate the product between the information bits and the associated part of the parity-check matrix, e.g., NS. The decoder circuit uses each row to calculate one element of the resulting vector and places the result in one of the parity columns. For example, the decoder circuit is capable of using row 1 to calculate the sum of the information bits associated with columns 1, 2, 3, and 4. The decoder circuit places the result in memory associated with column 8. The order of operations is chosen such that the result is the last operation, where the result(s) are shaded in FIG. 12. The operations performed are consistent with conventional encode operations using the H matrix. The decoder circuit is capable of calculating the other elements of NS using the subsequent rows and storing the result in memory associated with columns 9, 10 and 11.

In row 5, the decoder circuit sums the intermediate terms to determine the first parity bit in column 6. In row 6, the decoder circuit determines the second parity bit shown in column 7 by solving row 1 of the parity-check matrix in FIG.

11. Since the sum of the information bits has already been calculated and stored in memory for column 8, the decoder circuit is capable of summing columns 8 and 6 and writing the result back to column 7 corresponding to the location for the second parity in FIG. 12.

Using rows 7 and 8, the decoder circuit is capable of performing a similar process to calculate further parity bits associated with the double diagonal matrix corresponding to columns 8 and 9. Using rows 9 and 12, the decoder circuit is capable of calculating the remaining parity bit. In calculating the remaining parity bit, the intermediate sums are no longer stored. As such, the decoder circuit is capable of forming the sum of the information and the parity. As an illustrative example, in row 9, the decoder circuit determines the sum for information associated with columns 1 and 2 and parity bits associated with column 7. The programmable LDPC decoder writes the result back as a parity bit associated with column 10.

In the example described in connection with FIGS. 11 and 12, since each row of the derivative 1200 is a layer, P elements of parity are calculated at the same time. The example described represents 1 bit per 8-bit LLR using the sign. As such, in one or more embodiments, the programmable LDPC decoder is capable of using multiple bits of the LLR (e.g., 8-bits of the LLR) to encode multiple (e.g., 8) separate data blocks simultaneously using the same code.

While the example operations described represent 1 bit per 8-bit LLR via the sign, in other embodiments, the decoder circuit is capable of using all Y bits of the LLR (e.g., 8) to encode Y separate data blocks simultaneously using the same code using a single instruction-multiple data (SIMD) approach. Simultaneous encoding of multiple data blocks can be achieved by modifying the MS minimum generator. The modifications, while consuming additional IC area, provide a Yx increase in throughput. The parallelism described can be achieved so long as each of the data blocks being encoded simultaneously is encoded using the same LDPC code. In cases where the code changes prematurely, the decoder circuit is capable of interleaving bit data of the data blocks within LLRs automatically.

Figure 13A:
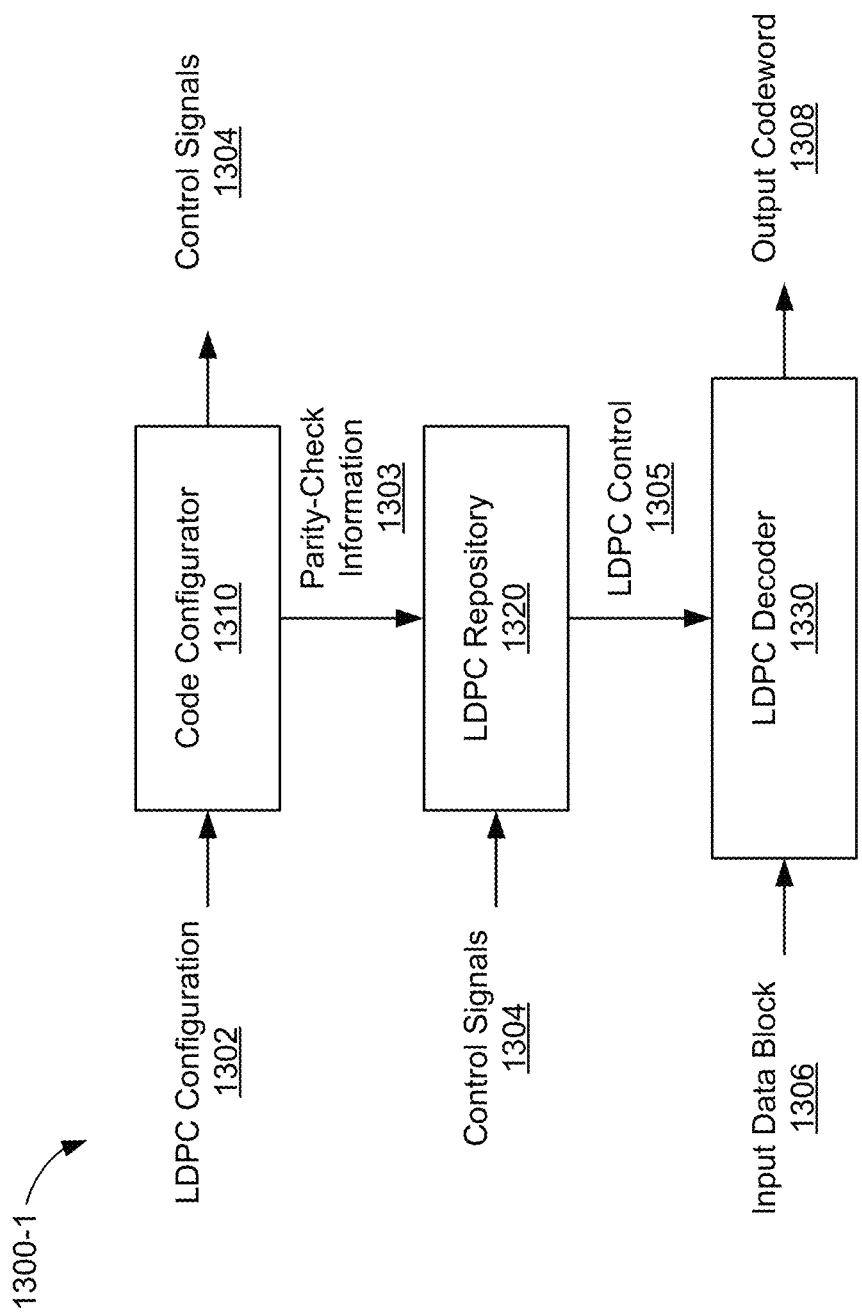
FIGS. 13A and 13B are block diagrams illustrating programmable decoder circuits, in accordance with some embodiments.

FIG. 13A is a block diagram illustrating another aspect of a programmable decoder circuit 1300-1, in accordance with some embodiments. In the example of FIG. 13A, the decoder circuit 1300-1 is configurable to perform LDPC decoding or LDPC encoding. The decoder circuit 1300-1 includes a code configurator 1310, an LDPC repository 1320, and an LDPC decoder 1330. In some embodiments, the decoder circuit 1300-1 is programmable to support a wide range of LDPC codes (including standardized and custom codes). More specifically, the decoder circuit 1300-1 may be dynamically configured (and reconfigured) to perform LDPC decoding operations or LDPC encoding operations in accordance with various LDPC codes by reading and writing parity-check information to and from the LDPC repository 1320 and receiving control signals 1304.

The code configurator 1310 may receive an LDPC configuration 1302 describing a parity-check matrix (or a derivative thereof) for an LDPC code. For example, the LDPC configuration 1302 may describe a parity-check matrix that may be used for LDPC decoding and/or LDPC encoding or a derivative of a parity-check matrix that may be used for LDPC encoding. The LDPC configuration 1302 may describe a derivative of a parity-check matrix generated using any of the techniques described herein for use in performing LDPC encoding. The code configurator 1310 is capable of storing the LDPC configuration 1302 as a set of parameterized data referred to as parity-check information 1303 in the LDPC repository 1320. In some aspects, the parity-check information 1303 may provide a high-level description of the associated parity-check matrix or derivative (such as codeword length, number of information bits, circulant size, number of layers, and the like). In some embodiments, the code configurator 1310 may reuse or update at least some of the existing parity-check information in the LDPC repository 1320 when storing the LDPC configuration 1302. In some aspects, the code configurator 1310 may further generate the control signals 1304. The control signals 1304 can include a code index pointing to the storage location(s), in the LDPC repository 1320, of the parity-check information 1303 for the received LDPC configuration 1302.

In some embodiments, the code configurator 1310 is implemented as hardwired circuitry. For example, the code configurator 1310 is implemented as fixed circuitry that is capable of generating the parity-check information 1303. In other embodiments, the code configurator is implemented as a processor that is configured to execute program code. Upon execution of the program code, the code configurator 1310 generates the parity-check information 1303. The processor may be a hardwired processor or a soft processor, e.g., implemented in programmable circuitry of an IC. In still other embodiments, the code configurator 1310 is implemented using programmable circuitry albeit in a manner that is customized for generating the parity-check information 1303 (e.g., without executing program code). When implemented using programmable circuitry, the code configurator 1310 may be reimplemented and/or modified dynamically in the field.

In one or more embodiments, the code configurator 1310 is capable of receiving LDPC configuration 1302 which specifies a code descriptor that defines a particular 5G code requirement. The code configurator 1310, in response to receiving the code descriptor, generates the parity-check information 1303. The code configurator 1310 is further capable of managing the parity-check information 1303 that is stored in the LDPC repository 1320. For example, the code configurator 1310 is capable of determining that a particular code is no longer needed and, in response, overwriting the parity-check information 1303 for the code that is no longer needed with parity-check information for a new and/or different code.

In the example of a 5G application, there may be a large number of codes that are used. The code configurator 1310 is capable of managing these codes, generating the parity-check information 1303 for the codes, and loading the parity-check information 1303 into the LDPC repository 1320. By implementing the code configurator 1310 as a processor that is capable of executing program code or implementing the code configurator 1310 in programmable circuitry, the code configurator 1310 may be updated or modified in the field to generate parity-check information 1303 for new and/or different LDPC codes that may arise over time. In supporting code management, the code configurator 1310 may receive one or more control signals (not shown) that indicate which sets of the parity-check information in the LDPC repository 1320 may be overwritten with newly generated parity-check information 1303 for a new and/or different code.

As an illustrative and non-limiting example, the code configurator 1310 may be modified to generate new and/or different parity-check information for different codes using the same base matrix definition (e.g., FIG. 6A) where the code configurator 1310 does so by changing the PSIZE and reducing the rotation using a modulo PSIZE operation. In particular embodiments, the code configurator described in connection with FIG. 5 may be implemented with the same and/or similar features as those of code configurator 1310.

As discussed, in some cases, the parity-check information corresponding to a given LDPC code is suitable for use in performing both LDPC decoding and LDPC encoding. In such cases, the same parity-check data may be used to perform both LDPC encoding and LDPC decoding for the same LDPC code. In other cases, the parity-check information used for LDPC decoding for a given LDPC code is different from the parity-check information used for LDPC encoding for the LDPC code. In any case, LDPC repository 1320 is capable of storing parity-check information for use in performing LPDC decoding, LDPC encoding, or both and for one or more different LDPC codes.

The LDPC repository 1320 is capable of operating substantially as described in connection with LDPC repository 520 of FIG. 5. For example, the parity-check information 1303 stored in LDPC repository 1320 may be dynamically updated to reflect different parity-check matrices (e.g., for new LDPC codes) whether for LDPC encoding or LDPC decoding. As previously described, the parity-check information associated with different LDPC codes may be indexed by the LDPC decoder 1330. Thus, when configuring the programmable decoder circuit 1300-1 to implement a particular LDPC code, whether for LDPC encoding or LDPC decoding, the LDPC repository 1320 may receive the control signals 1304 specifying the code index pointing to the storage location(s) associated with the LDPC code. The LDPC repository 1320 may provide a set of LDPC control data 1305 to the LDPC decoder 1330 based on the received control signals 1304. In some aspects, the LDPC control data 1305 may include at least some of the parity-check information 1303 associated with the selected LDPC code.

For purposes of decoding, the programmable decoder circuit 1300-1 is capable of operating substantially as described in connection with the programmable decoder circuit 500 of FIG. 5. In the example of FIG. 13A, the LDPC repository 1320 is capable of providing additional control data to support LDPC encoding operations based on additional data items included in the parity-check information 1303 and a different data structure utilized in the LDPC repository 1320.

In the example of FIG. 13A, LDPC decoder 1330 receives LDPC control data 1305 from the LDPC repository 1320. The LDPC control data 1305 may include at least some parity-check information for LDPC decoding or LDPC decoding corresponding to a particular LDPC code based on the control signals 1304, e.g., the code index specified therein. The LDPC control data 1304 may also include an encode enable flag that indicates whether LDPC decoding or LDPC encoding is to be performed for each input data block 1306 that is received. The LDPC decoder 1330 is capable of receiving the LDPC control data 1305 for each different data block 1306 that is received. As such, the LDPC decoder 1330 is capable of performing, on a per data block 1306 basis, either LDPC encoding or LDPC decoding based on the LDPC control data 1305, which further specifies the particular parity-check information needed for the specified operation.

The encode enable flag included in the LDPC control data 1305 indicates when the LDPC decoder 1330 is to perform LDPC encoding instead of LDPC decoding. For example, when the encode enable flag is set, the LDPC decoder 1330 performs LDPC encoding. When the encode enable flag is not set, the LDPC decoder 1330 performs LDPC decoding as described within this disclosure.

For example, in response to determining that the encode enable flag of the LDPC control data 1305 is not set, the LDPC decoder 1330 is configured to perform LDPC decoding. The LDPC decoder 1330 receives the data block 1306, which is an input codeword in this case. The LDPC decoder 1330 decodes the received data block 1306 using the parity-check matrix associated with the LDPC control data 1305. For example, as described, the LDPC decoder 1330 is capable of checking each bit of the data block 1306 against the parity-check matrix, updating the values for the selected bits based on the parity-check operations, and outputting the bits (e.g., bits that have either passed or been corrected by the parity-check operations) as an output codeword 1308. As described, for proper decoding, the data block 1306 and the parity-check matrix implemented by the LDPC decoder 1330 should correspond to the same LDPC code. Thus, in some embodiments, the LDPC decoder 1330 may read or retrieve a particular set of the LDPC control data 1305 from the LDPC repository 1320 based on the received data block 1306. For example, a different code index may be provided to the LDPC repository 1320 for different data blocks 1306 (e.g., depending on the LDPC code used to encode the data block 1306).

In response to determining that the encode enable flag of the LDPC control data 1305 is set, the LDPC decoder 1330 is configured to perform LDPC encoding. In that case, the LDPC decoder 1330 receives the data block 1306, which is information to be encoded by the LDPC decoder 1330. The LDPC decoder 1330 is capable of encoding the data block 1306 using parity-check information associated with the LDPC control data 1305 to generate the codeword 1308. For example, the LDPC decoder 1330 is capable of processing the data block 1306 using the parity-check information to generate the parity bits for the data block 1306. The LDPC decoder 1330 is capable of outputting the data block 1306 in combination with the generated parity bits as codeword 1308. It is noted that, for proper encoding, the data block 1306 and the parity-check information used by the LDPC decoder 1330 should correspond to the same LDPC code. Thus, in some embodiments, the LDPC decoder 1330 may read or retrieve a particular set of the LDPC control data 1305 from the LDPC repository 1320 based on the data block 1306. For example, a different code index may be provided to the LDPC repository 1320 for different data blocks 1306 (e.g., depending on the LDPC code that is to be used to encode the data block 1306).

Figure 13B:
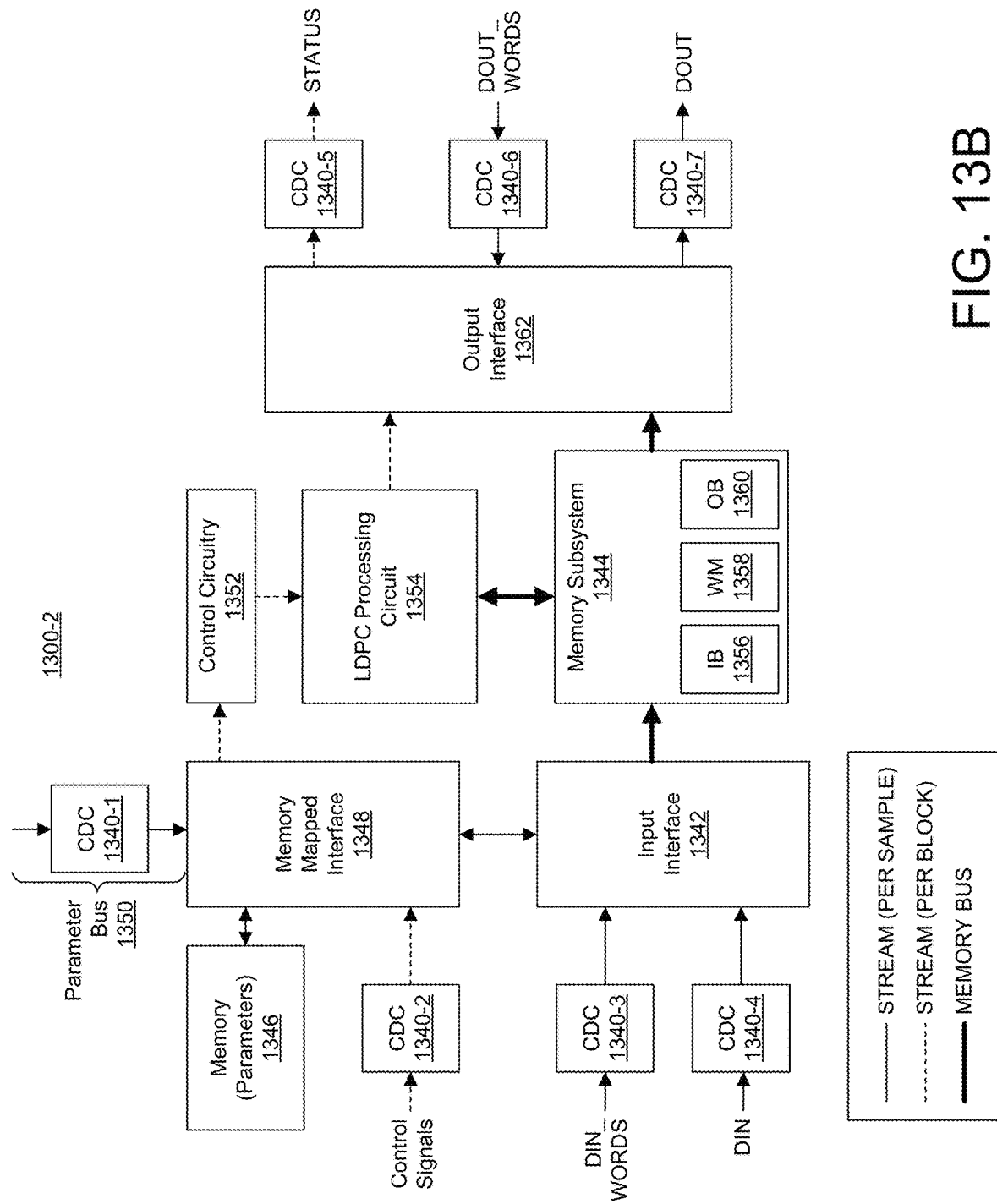

FIG. 13B is a block diagram illustrating an example architecture 1300-2 for a programmable decoder circuit, in accordance with some embodiments. For purposes of illustration, the code configurator 1310 is omitted from architecture 1300-2. In one or more embodiments, the code configurator 1310 (not shown) may be implemented in any of the arrangements described herein (e.g., as a hardwired processor, a hardwired and dedicated circuit block, as a soft-processor, as a circuit block implemented in programmable circuitry). In particular embodiments, the circuit blocks illustrated in architecture 1300-2 are implemented as hardwired circuit blocks. In one or more other embodiments, the circuit blocks of architecture 1300-2 are implemented using a mix of hardwired circuit blocks and programmable circuitry, e.g., within a programmable IC such as a field programmable gate array.

In the example of FIG. 13B, architecture 1300-2 includes a plurality of clock domain crossing (CDC) circuits 1340. Inclusion of CDC circuits 1340 allows architecture 1300-2 to operate at a different clock rate than the surrounding circuitry. In one or more embodiments, architecture 1300-2 operates on a separate clock than other circuitry in an around architecture 1300-2. The clock for architecture 1300-2, for example, is capable of running at a higher frequency than the clock for other surrounding circuitry. In one or more other embodiments, CDC circuits 1340 can be omitted. For example, in some cases, CDC circuits 1340 may be omitted where architecture 1300-2 is clocked at a same frequency as the surrounding circuitry.

In some embodiments, CDC circuits 1340 are also capable of performing width conversion. CDC circuits 1340 such as, for example, CDC circuits 1340-1, 1340-2, 1340-3, and/or 1340-4, are capable of decreasing the width of received signals by a particular factor. As an example, the factor may be 2 or 4 (decreasing width from 512-bits to 256-bits or 128-bits) since architecture 1300-2 is capable of operating at a faster clock speed than the circuitry coupled to architecture 1300-2 beyond the boundary formed by CDC circuits 1340. CDC circuits 1340 such as, for example, CDC circuits 1340-5, 1340-6, and/or 1340-7, are capable of increasing the width of received signals by a particular factor. The factor may be 2 or 4 and may match the factor used to decrease the width of the signals, but further may depend upon the particular clock domains that couple to inputs and outputs of architecture 1300-2. The increased width of signals accounts for the decrease in clock frequency once the boundary formed by CDC circuits 1340 is crossed. The width conversion performed by the CDC circuits 1340 allows circuitry external to architecture 1300-2 with a slower speed clock to keep up with architecture 1300-2 having a higher speed clock.

In the example of FIG. 13B, architecture 1300-2 includes an input interface 1342. Input interface 1342 may be implemented as a streaming interface. An example of a streaming interface is a stream-enabled on-chip interconnect such as an Advanced Microcontroller Bus Architecture (AMBA®) Advanced Extensible Interface (AXI) stream interconnect. An AXI-stream interconnect enables connection of heterogeneous master/slave AMBA® AXI-stream protocol compliant circuit blocks. Input interface 1342 is capable of routing received data, e.g., data blocks received via the DIN signal, to memory subsystem 1344. AXI is provided for purposes of illustration and is not intended to be limiting. Other suitable streaming interconnects, protocols, and/or buses may also be used. In general, data streams are used for point-to-point communications where addressing is not used or required as is the case for memory mapped transactions.

The DIN signal provided to input interface 1342 provides the streamed data to be processed. In one example, DIN has a width of 512 bits. In one or more embodiments, the DIN_WORDS signal specifies the number of bits of DIN, e.g., a bit-width, that is input on each clock cycle. Data blocks can be transferred over a plurality of clock cycles. For each input on DIN, input interface 1342 receives a DIN_WORDS value specifying the number of bits to be processed out of the total number of possible bits (e.g., out of 512). In one or more other embodiments, the DIN_WORDS signal is specified on a per data block basis. Architecture 1300-2 is capable of switching between different modes of operation based on the value of one or more parameters stored in memory 1346.

In one or more embodiments, the control signals provided to memory mapped (MM) interface 1348 specifies the particular codes to be used to process a data block received on DIN. Memory 1346, for example, is capable of storing parity-check information corresponding to one or more different LDPC codes. For example, the control signals may specify parity-check information for one of a plurality of LDPC codes to process a data block received on DIN. In one or more embodiments, for each data block provided to input interface 1342 for processing, the control signals provide 32 bits of data specifying how architecture 1300-2 is to process the data block. The control signals, for example, may indicate whether encoding or decoding is to be performed and the particular code, e.g., the particular LDPC code, from memory 1346 to be used for the operation.

MM interface 1348 is coupled to memory 1346. In one or more embodiments, MM interface 1348 is implemented as an AXI MM interface. Memory 1346 is configured to store one or more parameters for architecture 1300-2. The parameters can include one or more different LDPC codes concurrently that can be used for purposes of encoding and/or decoding as indicated by the control signals and as described herein. In particular embodiments, the codes can be stored in memory 1346 as matrix definitions, e.g., parity-check information as previously described. In particular embodiments, MM interface 1346 is connected to a parameter bus 1350.

Parameter bus 1350 is capable of providing the parameters for architecture 1300-2 that MM interface 1348 stores in memory 1346. For example, parameter bus 1350 may provide parity-check information (e.g., parity-check information 503 or 1303). Using parameter bus 1350, different LDPC codes can be downloaded for storage in memory 1346 prior to operating architecture 1300-2 or at runtime, e.g., during operation of architecture 1300-2.

In one or more embodiments, parameter bus 1350 is implemented as an AXI-Lite interface. For example, parameter bus 1350, when implemented using AXI-Lite, is capable of providing point-to-point bidirectional communication with another circuit block from which the parameters are provided. As an illustrative and nonlimiting example, the circuit block may be a processor, a processor system, or the code configurator capable of generating and/or providing parameters to memory 1346 by way of MM interface 1348. In one or more embodiments, the processor system is included in the same IC as architecture 1300-2. In other embodiments, the processor system or source of the parameters may be located off-chip from architecture 1300-2.

It should be appreciated that AXI is provided for purposes of illustration and not limitation. Other suitable streaming interconnects, MM interconnects, control interfaces, and/or protocols may also be used. In general, data streams are used for point-to-point communications where addressing is not used or required as is the case for memory mapped transactions.

In the example of FIG. 13B, architecture 1300-2 further includes control circuitry 1352. In one or more embodiments, control circuitry 1352, the memory mapped interface 1348, and the memory 1346, taken collectively, represent the LPDC repository (e.g., LDPC repository 510 or LDPC repository 1310).

In one or more embodiments, LDPC processing circuit 1354 is capable of performing encoding and decoding operations on data received via input interface 1342. For example, based upon the control signals, LDPC processing circuit 1354 is capable of determining the specified LDPC code from memory 1346 and whether the received data block is to be encoded or decoded. In performing the encoding and decoding operations, LDPC processing circuit 1354 is capable of using memory subsystem 1344. Data received via input interface 1342 is provided to memory subsystem 1344 for processing by LDPC processing circuit 1354.

In one or more other embodiments, LDPC processing circuit 1354 is capable of performing only LPDC decoding.

In that case, LDPC processing circuit 1354 may be capable of determining the particular LDPC code to be used for decoding from memory 1346 based on the control signals. LDPC processing circuit 1354 decodes received codewords using the specified LDPC code.

Memory subsystem 1344 includes an input buffer 1356 that is capable of receiving streamed data from input interface 1342, a working memory 1358 that is usable by LDPC processing circuit 1354 for encoding and/or decoding received data blocks, and an output buffer 1360 that is capable of storing results of decoding and/or encoding operations.

In one or more embodiments, LDPC processing circuit 1354 and memory subsystem 1344 represent the LDPC decoder circuitry (e.g., the LDPC decoder circuitry 530 or the LDPC decoder circuitry 1330). An example implementation of the LDPC processing circuit 1354 and the memory subsystem 1344 for performing only decoding are provided in FIG. 8. Example implementations of the LDPC processing circuit 1354 and the memory subsystem 1344 configurable for performing encoding and decoding are provided in FIGS. 16A and 16B.

Output interface 1362 is implemented as a streaming interface. In the example of FIG. 13B, the status signal indicates the operation performed on the data that is output from DOUT (e.g., encode or decode). The DOUT_WORDS signal specifies the number of bits (e.g., bit width) of DOUT that forms the output generated by architecture 1300-2. For example, DOUT and DOUT_WORDS may operate similar to DIN_WORDS and DIN in that DOUT_WORDS indicates the bit width of words output from DOUT (e.g., the bits of the total number of bits of DOUT that constitute valid output).

In the example of FIG. 13B, the input interface 1342, the LDPC processing circuit 1354, and output interface 1362 may be connected to memory subsystem 1344 through a memory bus. The LDPC processing circuit 1354 is capable of performing encoding or decoding based upon the particular operation specified by the control signals. Encoding or decoding may be specified by the control signals on a per data block basis. As such, architecture 1300-2 is capable of switching between decoding and/or encoding using a selected LDPC code on a per data block basis. Further, architecture 1300-2 is capable of applying a different LDPC code on a per data block basis for purposes of decoding and/or encoding.

Figure 14:
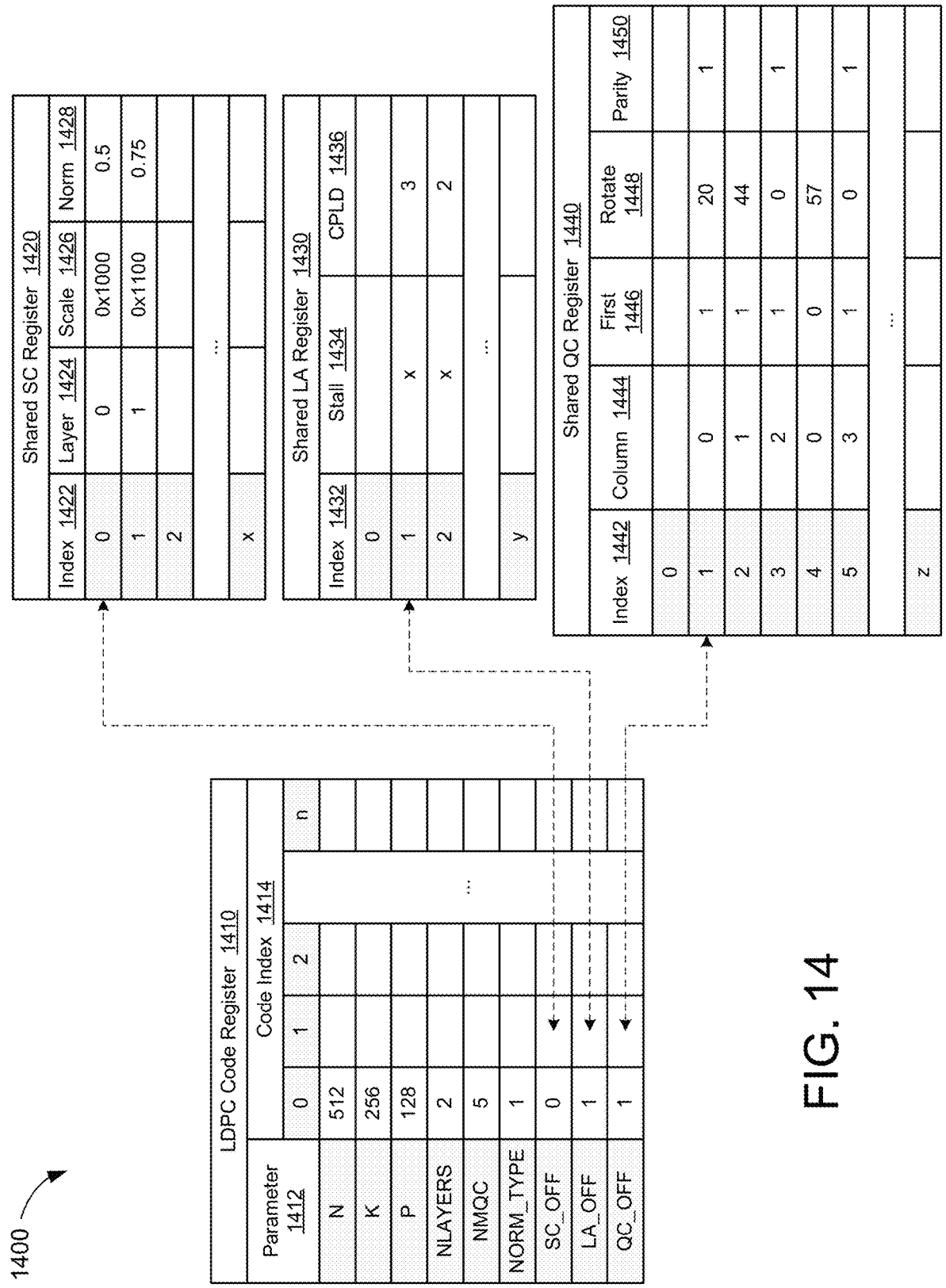
FIG. 14 shows another example configuration of an LDPC repository, in accordance with some embodiments.

FIG. 14 shows another example configuration of an LDPC repository 1400, in accordance with some embodiments. The LDPC repository 1400 is substantially similar to the LDPC repository 520 of FIG. 5. The LDPC repository 1400 represents an example configuration of the LDPC repository of FIG. 13A and, as such, is adapted for performing LDPC encoding. As illustrated, the LDPC repository 1400 includes an LDPC code register 1410, a shared SC register 1420, a shared LA register 1430, and a shared QC register 1440. The LDPC code register 1410 includes parameters 1412 and a code index 1414. The shared SC register 1420 includes an index 1422 (e.g., a row number) for a corresponding set of scaling factors (e.g., layer 1424, scaling 1426, and normalization 1428). The shared LA register 1430 includes an index 1432 (e.g., a row number) for a corresponding set of layer information (e.g., stall value 1434 and a CPLD value 1436).

The shared QC register 1440 includes an index 1442, column 1444, first 1446, and rotate 1448. In the example of FIG. 14, the shared QC register 1440 is expanded from that illustrated in FIG. 6B to include an additional column 1450 for purposes of performing LDPC encoding. In the example of FIG. 14, shared QC register 1440 includes a parity 1450 column. The parity 1450 column indicates whether the bit currently being processed is a parity bit. The parity 1450 column assumes that the last operation is associated with the new parity bit within the layer.

Figure 15:
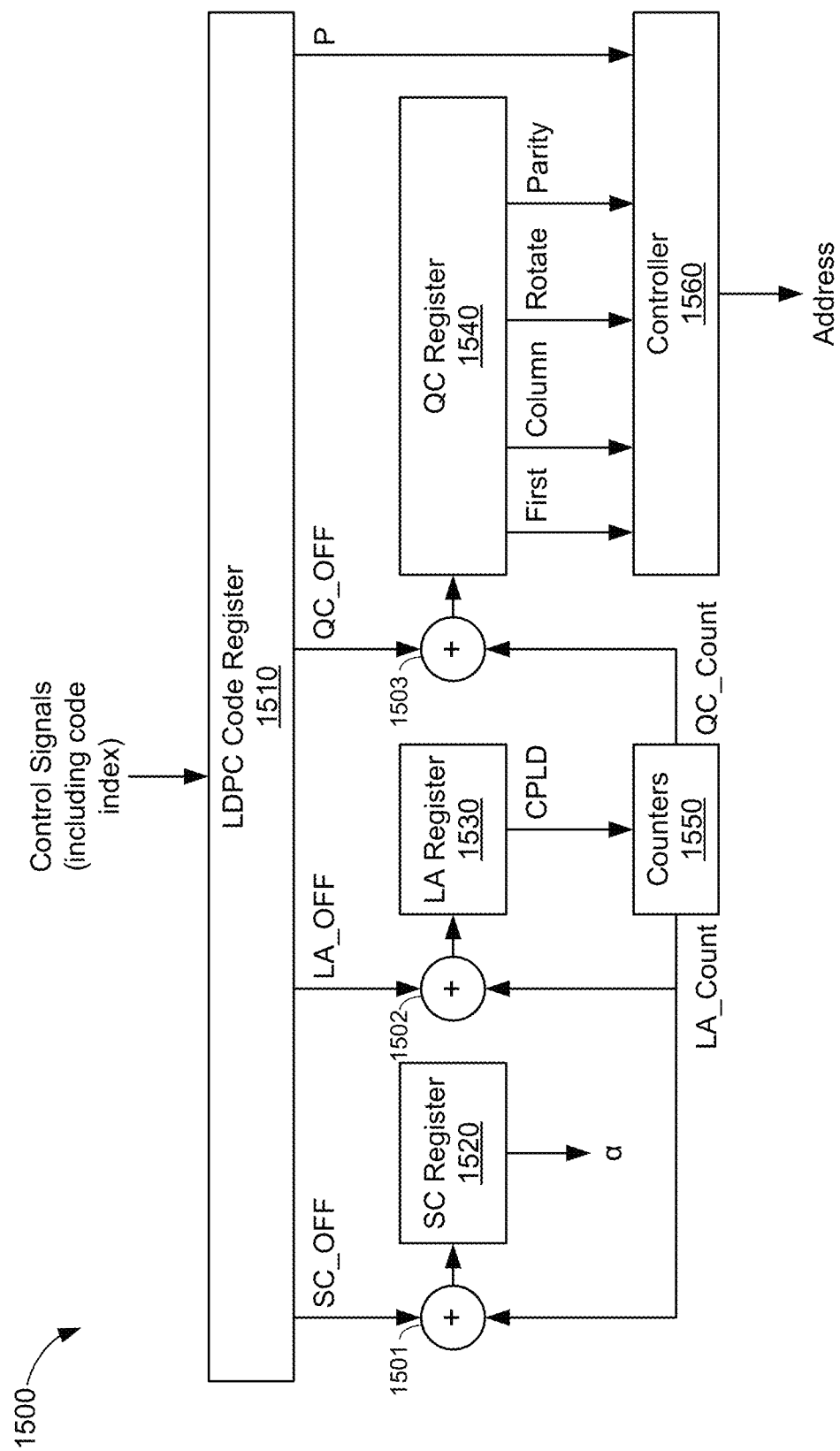
FIG. 15 is a block diagram of another example LDPC repository, in accordance with some embodiments.

FIG. 15 is a block diagram of another example implementation of an LDPC repository, in accordance with some embodiments. The LDPC repository 1500 of FIG. 15 is adapted to support both LDPC decoding and LDPC encoding and may be used to implement the LDPC repository 1320 of FIG. 13A. In the example of FIG. 15, the LDPC repository 1500 includes an LDPC code register 1510, an SC register 1520, an LA register 1530, a QC register 1540, counters 1550, a controller 1560, and adders 1501, 1502, and 1503.

The LDPC repository 1500 is capable of operating substantially as described in connection with the LDPC repository 700 of FIG. 7. In the example of FIG. 15, to support LPDC encoding, values from the parity 1450 column of the LDPC repository 1400 of FIG. 14 are provided to the controller 1560. The controller 1560 is capable of providing LDPC control data (e.g., LDPC control data 1305), which may include the First, Column, Rotate, and Parity data (e.g., Address), to the LDPC decoder 1330. The control data may also include the encode enable flag (not shown, e.g., within Address). As discussed, values in the parity 1450 column indicate to the LDPC decoder 1330 when the particular bit being processed is a parity bit. In the example of FIG. 15, the LDPC repository 1500 is capable of controlling decoding operations and encoding operations for particular LDPC codes. Further, the LDPC repository 1500 is capable of controlling such operations on a per data block basis.

In one or more embodiments, the shared QC register 1440 may include an additional bit that is used for packing operations. The additional bit (not shown) indicates that the QC operation is associated with the last operation for a given layer corresponding to the write operation. In cases where multiple QC operations are packed, the bit indicates which QC operation is the last for the layer. The additional bit may be provided as part of the LDPC control data 1305 (e.g., Address) to the LDPC decoder 1330 by controller 1560.

Figure 16A:
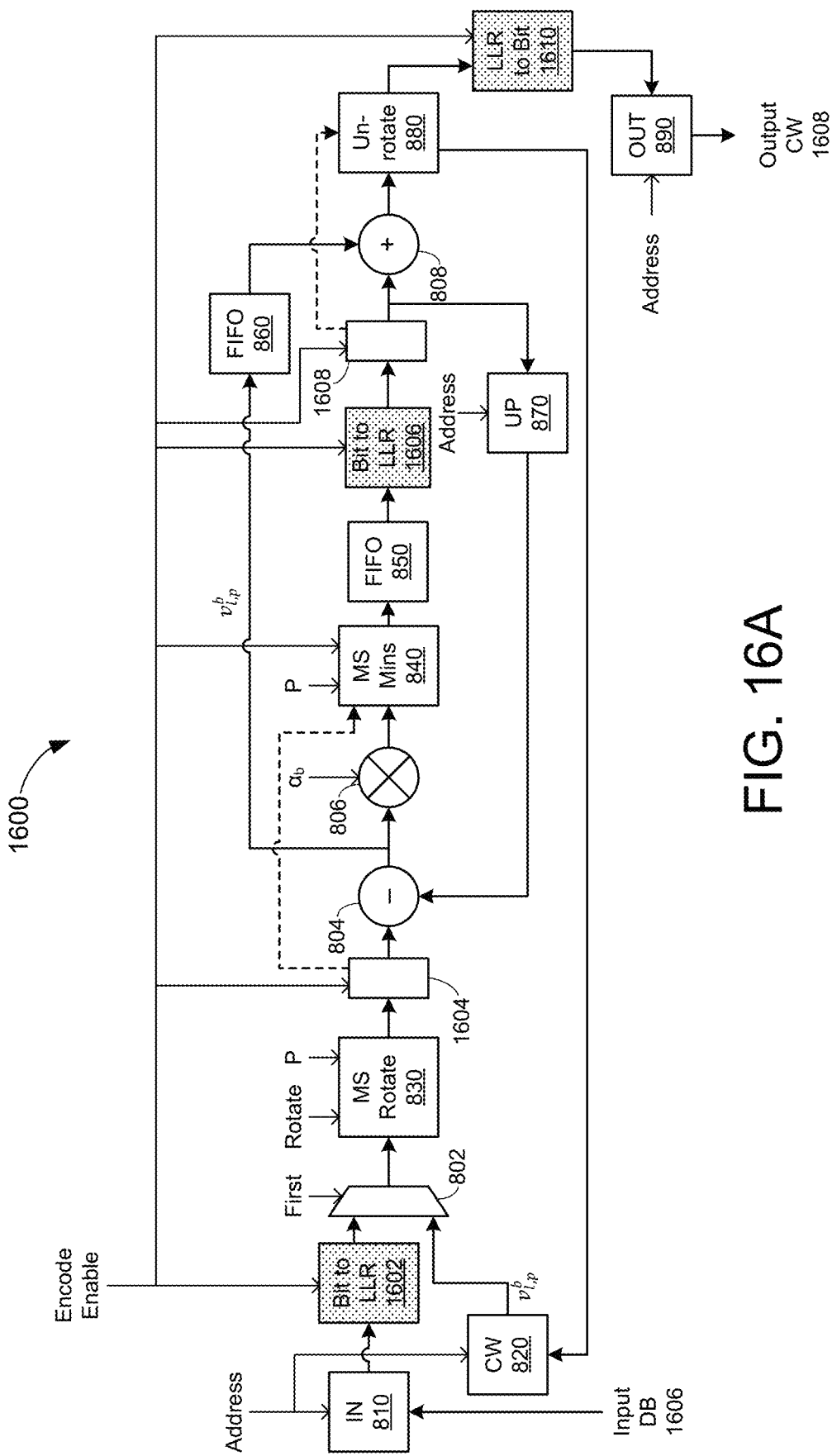
FIGS. 16A and 16B are block diagrams of another programmable LDPC decoder, in accordance with some embodiments.
Figure 16B:
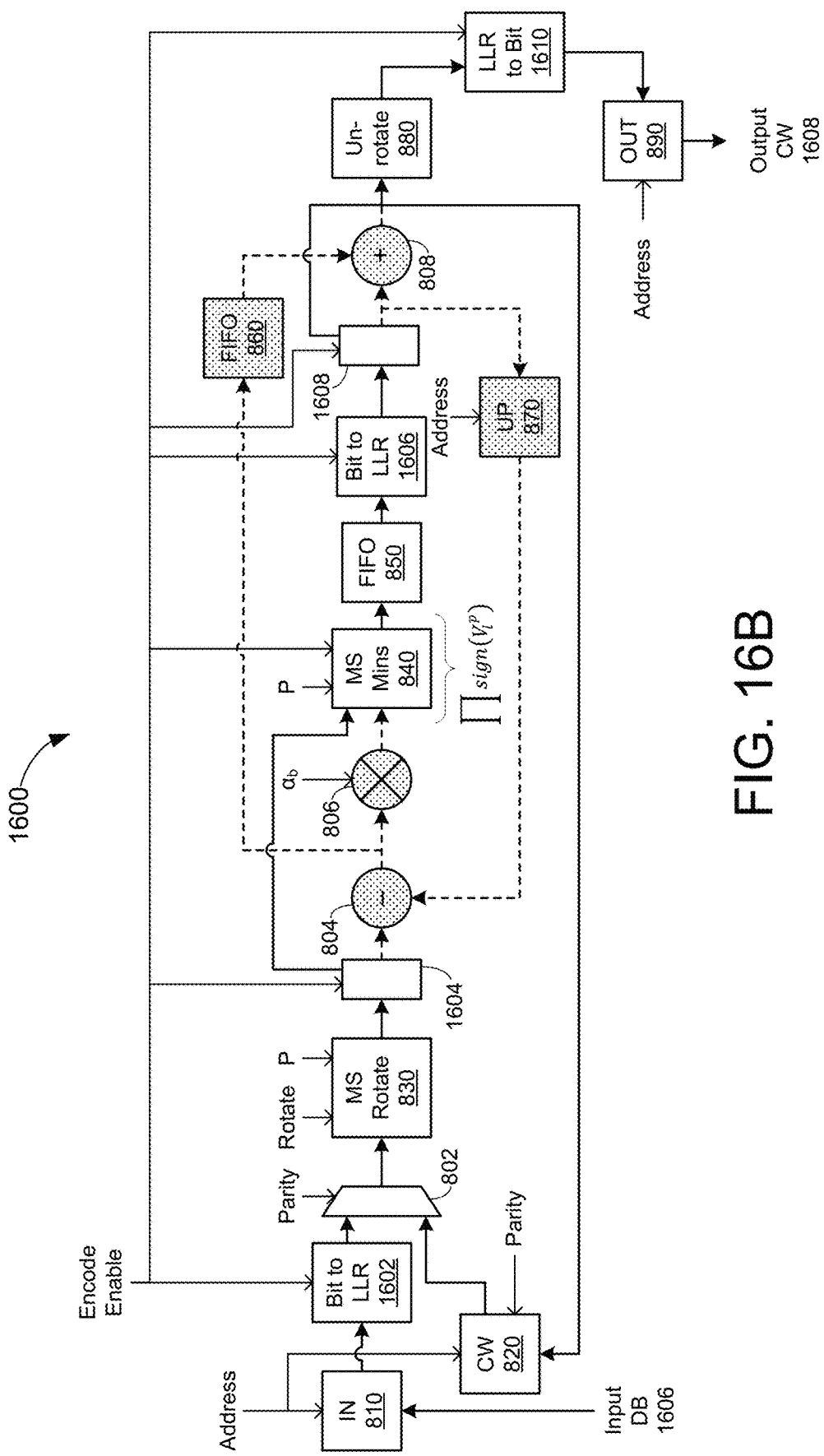

FIGS. 16A and 16B are block diagrams of another example implementation of an LDPC decoder, in accordance with some embodiments. The example LDPC decoder 1600 of FIGS. 16A and 16B is capable of performing both LDPC encoding and LDPC decoding. FIG. 16A illustrates an example where the LDPC decoder 1600 is configured for performing LDPC decoding. FIG. 16B illustrates an example where the LDPC decoder 1600 is configured for performing LDPC encoding.

Referring to both FIGS. 16A and 16B, the LDPC decoder 1600 is substantially similar to the LDPC decoder 800 of FIG. 8. In the example of FIGS. 16A and 16B, additional circuit blocks are inserted into the data path to control the flow of data. For example, the LDPC decoder 1600 includes a bit to LLR circuit 1602, a switch 1604, a bit to LLR circuit 1606, a switch 1608, and an LLR to bit circuit 1610. The additional circuit blocks are controllable using control signals (e.g., LDPC control data 1305) to alter or modify the data path within LDPC decoder 1600. As noted, the control signals may include the encode enable flag. As discussed, the control signals can be provided to the LDPC decoder 1600 on a per input data block basis to specify whether each input data block is to be decoded or encoded. The control signals further specify, on a per input data block basis, the particular parity-check information to be used for the operation specified by the encode enable flag.

For purposes of illustration, the LDPC decoder 1600 of FIGS. 16A and 16B is illustrated using shading to indicate circuit blocks that are effectively removed (whether actually or functionally) from the data path. The shaded circuit blocks are circumvented or otherwise bypassed so as to have no influence upon the data path of the LDPC decoder 1600. Such circuit blocks may be bypassed by signals that convey data around the circuit blocks (e.g., switches 1604, 1608), include internal bypass circuitry, or be provided signals that effectively nullify the operation of the circuit blocks. Within FIGS. 16A and 16B, dashed lines indicate signal lines that are not active.

For example, referring to FIG. 16A, since the LDPC decoder 1600 is configured by the control signals including the encode enable flag to perform LDPC decoding, the circuits 1602, 1606, and 1610 are bypassed. The switches 1604 and 1608 are configured by the encode enable flag of the control signals to output data via one of two different output ports, where data is output on the solid signal line and not on the dashed signal lines. Thus, in the example of FIG. 16A, the switch 1604 outputs data to the subtractor circuit 804 and not directly to MS minimum generator 840 by way of the dashed signal line. The switch 1608 outputs data to the adder 808 and not directly to the un-rotator 880 by way of the dashed signal line. As a result, the LDPC decoder 1600 operates substantially as described in connection with FIG. 8 for purposes of performing LDPC decoding of an input data block 1606 (e.g., a codeword) to generate an output codeword 1608.

In one or more embodiments, the LDPC decoder 1600 is capable of outputting hard bits instead of LLRs. The output codeword 1608, for example, is specified as a plurality of hard bits, e.g., information bits and parity bits. In that case, the LLR to bit circuit 1610 is independently controllable from the other circuit blocks that receive the control signals. Accordingly, in response to the control signals, the LLR to bit circuit 1610 can be activated or inserted into the data path (e.g., no longer bypassed) to convert LLRs into hard bits that are stored in the output buffer 890 to be output as the output codeword 1608.

In particular embodiments, the LDPC decoder 1600 is capable of optionally outputting the parity part. For example, the LDPC decoder 1600 is capable of outputting only the data bits or only the LLRs of data bits without the parity part. The control signal provided to the LDPC decoder 1600, for example, may indicate whether the parity part is to be output with the information part. The LDPC decoder 1600 is controllable by way of the control signal to selectively output the parity part.

Referring to FIG. 16B, the LDPC decoder 1600 is configured to perform LDPC encoding. In response to the control signals indicating that encoding is to be performed for the input data block 1606, the data path of the LDPC decoder 1600 is configured (or reconfigured) by selectively bypassing one or more circuit blocks of the LDPC decoder 1600 used for performing LDPC decoding. Further, the LDPC decoder 1600 is configured (or reconfigured) by activating or inserting one or more (un-bypassing) one or more circuit blocks of the LDPC decoder 1600 that are used for LDPC encoding into the data path.

For example, in response to the encode enable flag of the control signals indicating that LDPC encoding is to be performed, the bit to LLR circuit 1602 is no longer bypassed. The bit to LLR circuit 1602 is activated and inserted into the data path to process data from input buffer 810. The bit to LLR circuit 1602 outputs the generated LLRs to the multiplexer 802. In response to the encode enable flag of the control signals indicating that LDPC encoding is to be performed, the switch 1604 outputs data from MS rotator 830 to the MS minimum generator 840 thereby bypassing the subtractor circuit 804 and the multiplication circuit 806. In response to the encode enable flag of the control signals indicating that LDPC encoding is to be performed, the bit to LLR circuit 1606 generates hard bits from the LLRs determined by the MS minimum generator 840 that are stored in the FIFO 850. In response to the encode enable flag of the control signals indicating that LDPC encoding is to be performed, the switch 1608 outputs data to the un-rotator 880, thereby bypassing the adder 808 and the entire signal path including update circuit 870. In response to the encode enable flag of the control signal indicating that LDPC encoding is to be performed, the LLR to bit circuit 1610 is activated and inserted into the signal path (e.g., no longer bypassed) and generates hard bits that are stored in output buffer 890.

In the encoding configuration shown in FIG. 16B, information to be encoded is received in the input buffer 810 as input data block 1606. The bit to LLR circuit 1602 generates an LLR for each received bit. The values of the LLRs are chosen such that the sign of the LLR is consistent with the bit value. Using this convention, a product-of-signs operation is consistent with the modulo-2 summation of the bits required to calculate a new parity value for each layer of parity-check matrix.

The LLRs are output to the multiplexer 802. The multiplexer 802, in the case of performing LDPC encoding, is controlled by the Parity signal (e.g., from parity 1450 column of FIG. 14). The multiplexer 802 passes LLRs corresponding to information bits or LLRs corresponding to determined parity bits to the MS rotator 830 based on the Parity signal provided as part of the LDPC control information. The switch 1604 outputs the rotated LLRs to the MS minimum generator 840. The MS minimum generator 840 is capable of performing the product-of-signs operation, e.g., the modulo-2 summation of bits, to calculate a new parity value for each layer of parity-check matrix. The resulting sign, e.g., the parity value calculated by the MS minimum generator 840, is stored in the FIFO 850. The bit to LLR circuit 1606 is capable of converting the resulting sign, e.g., the parity bit, to an LLR. The switch 1608 outputs the LLR to the un-rotator 880 and to codeword buffer 820. The un-rotator 880 may undo the rotation applied by the MS rotator 830. In some embodiments, the LDPC decoder is capable of, when performing LDPC encoding, rotating bits of the information, storing the rotated bits of the information internally in rotated form, maintaining a record of the rotation, and un-rotating the rotated bits of information in response to outputting the information in encoded form.

In some aspects, the resulting LLRs may be stored in the codeword buffer 820 (e.g., for use in the next layer of the encoding operation). In the example of FIG. 16B, the codeword buffer 820 stores the LLRs (e.g., corresponding to parity bits) for purposes of reuse by the MS minimum generator 840 in determining parity bits for further layers. In the example of FIG. 16B, the codeword buffer 820 may be write-enabled by control signals (e.g., Parity) to store only the LLRs corresponding to parity bits.

The LLRs output from the un-rotator 880 are provided to the LLR to bit circuit 1610. The LLR to bit circuit 1610 converts the received LLRs into hard bits. For example, the LLR to bit circuit 1610 is capable of converting received LLRs into hard bits by performing sign extraction, where the extracted sign of an LLR is the hard bit represented by the LLR. The LLR to bit circuit 1610 is capable of storing the hard bits in the output buffer 890. In some other aspects, the resulting hard bits, which include information bits and parity bits, are stored in the output buffer 890 to be combined into the output codeword 1608. In some embodiments, the output buffer 890 receives the control signals (e.g., Address) from the LDPC repository indicating the memory addresses of selected bits stored in the output buffer 890. The selected bits are output from the output buffer 890 as the output codeword 1608.

In the example of FIG. 16B, values are only rotated for the data path on read, e.g., using the MS rotator 830. Further rotations are not performed on the data until the data is output using the un-rotator 880. Such is the case as rotation is an expensive operation in terms of the amount of circuitry required and time needed to perform the rotations. In one or more embodiments, the LDPC decoder 1600 is capable of processing the rotated results in rotated form, e.g., as is after rotation by the MS rotator 830, through the data path. LDPC decoder 1600 is capable of generating a record indicating that further rotation is required prior to output and maintaining the record. When results are re-read for output, the un-rotator 880 is capable of performing the inverse rotation of MS rotator 830. In the case of encoding, since the number of elements output per cycle is reduced, the resources required to perform the rotation are reduced. In the case of encode, for example, since hard bits are rotated, 128 bits may be rotated rather than 128×8 bits (e.g., LLRs) as in the case of decode.

As previously discussed, in one or more embodiments, the input buffer 810, the codeword buffer 820, and the output buffer 890 may be implemented as a single memory, e.g., a RAM. In that case, the LDPC decoder 1600 need not copy information from one buffer to another. For example, the LDPC decoder 1600 need not copy information from the input buffer 810 to the output buffer 890. In embodiments where a single RAM is used, it is not necessary to identify the QC operations on information bits in order to perform the copy thereby saving a bit in the instruction and reducing the memory required to store the LDPC configuration.

In the example of FIGS. 16A and 16B, the MS minimum generator 840 also receives control signals. In one or more embodiments, the MS minimum generator 840 optionally implements a power optimization mode that conserves power when the encode enable flag indicates an encode operation. For example, duplicate memory circuits that may be included in the MS minimum generator that are used for decoding may be deactivated or powered off while in the encode mode based on the encode enable flag.

In the example of FIGS. 16A and 16B, additional circuit elements, e.g., switches 1604 and 1608, were shown as being inserted into the signal path of the LDPC decoder circuitry. Switches 1604 and 1608 were included to control the signal flow. It should be appreciated that other techniques or circuit architectures for controlling the data flow may be used in place of switches 1604 and 1608.

In one or more other embodiments, the same outcome in terms of signal processing and data flow may be achieved in the LDPC encoder without including switches 1604 and 1606. For example, the subtractor circuit 804 may be effectively bypassed by providing a zero value from update buffer 870 to subtractor circuit 804 to be subtracted from the output from MS rotate 830 so that the value from MS rotate 830 passes through subtractor circuit 804 unchanged. The multiplier circuit 806 may be effectively bypassed by setting the value of $\alpha_b$ to 1 so that the value from MS rotate 830, which propagates through the subtractor circuit 804 unchanged, also propagates through multiplier circuit 804 unchanged. Adder 808 may be effectively bypassed by setting the value output from FIFO 860 to 0 so that the signal output from bit to LLR 1606 passes to un-rotate 880 unchanged.

Accordingly, in one or more embodiments, switches 1604 and 1608 are omitted from the LDPC decoder circuitry and the encode enable flag is used to control the signals provided to the subtractor circuit 804, the multiplier circuit 806, and the adder 808 so that the circuits are functionally bypassed and pass input signals unchanged. In this regard, the term "bypass," as applied to circuit elements in the data path of the LDPC decoder circuitry, may mean physically bypassing or functionally bypassing as described herein. Similarly, a circuit block that is included or inserted into the data path may be physically inserted into the data path or activated (e.g., by providing suitable values to the inputs) so that the circuit block does act on and/or modify data received as input(s).

Using the programmable LDPC decoder to perform LDPC encoding operations provides a solution for implementation within an IC that provides several advantages. In one aspect, assuming that decode requires on average 8 iterations, then approximately $\frac{1}{8}^{th}$ of the cycles required to perform LDPC decoding are required to perform LDPC encoding while achieving the same data throughput as LDPC decoding. Data throughput of LDPC encoding may be further increased by utilizing additional bits of the data path to encode multiple data bits from multiple data blocks employing the same code simultaneously. Parallel LDPC encoding of 8 data blocks, for example, means that the programmable LDPC decoder is capable of using approximately $\frac{1}{64}^{th}$ of the cycles required to perform LDPC decoding while achieving the same data throughput as when performing LDPC decoding.

Performing LDPC encoding using the programmable LDPC decoder allows certain components of the programmable LDPC decoder to be reused, thereby saving IC area. To support programmability, the programmable LDPC decoder is capable of storing definitions for multiple, different LDPC codes. This ability requires the programmable LDPC decoder to include a sufficient amount of memory. By using the programmable LDPC decoder to also perform LDPC encoding, the memory may be shared between the LDPC encoding and LDPC decoding so that, at least in some cases, one copy of the information may be stored for purposes of both LDPC encoding and LDPC decoding. Further, in cases where only LDPC encoding is needed, the programmable LDPC decoder may be used within a circuit design to reduce the number of circuit resources of the IC, e.g., look-up tables, needed since a separate encoder is not needed. Using the programmable LDPC decoder for decoding and/or encoding also reduces the IP verification effort for the circuit design.

In addition, by using the programmable LDPC decoder to perform encoding, the circuitry can be "repurposed" to so that a system is able to perform additional encoding or decoding as may be required. The circuitry may be configured to perform encoding or decoding dynamically during operation in the field thereby providing the system with greater flexibility.

Referring to the example of FIG. 8, the delineation of the first stage (Mins Loop) and the second stage (Update Loop) are also applicable to the example of FIGS. 16A and 16B. The different stages are not shown to more clearly illustrate the data paths within the LDPC decoder in each of the examples presented in FIGS. 16A and 16B. Still, the LDPC decoder of FIGS. 16A and 16B includes the Mins Loop and the Update Loop as previously described.

Figure 17:
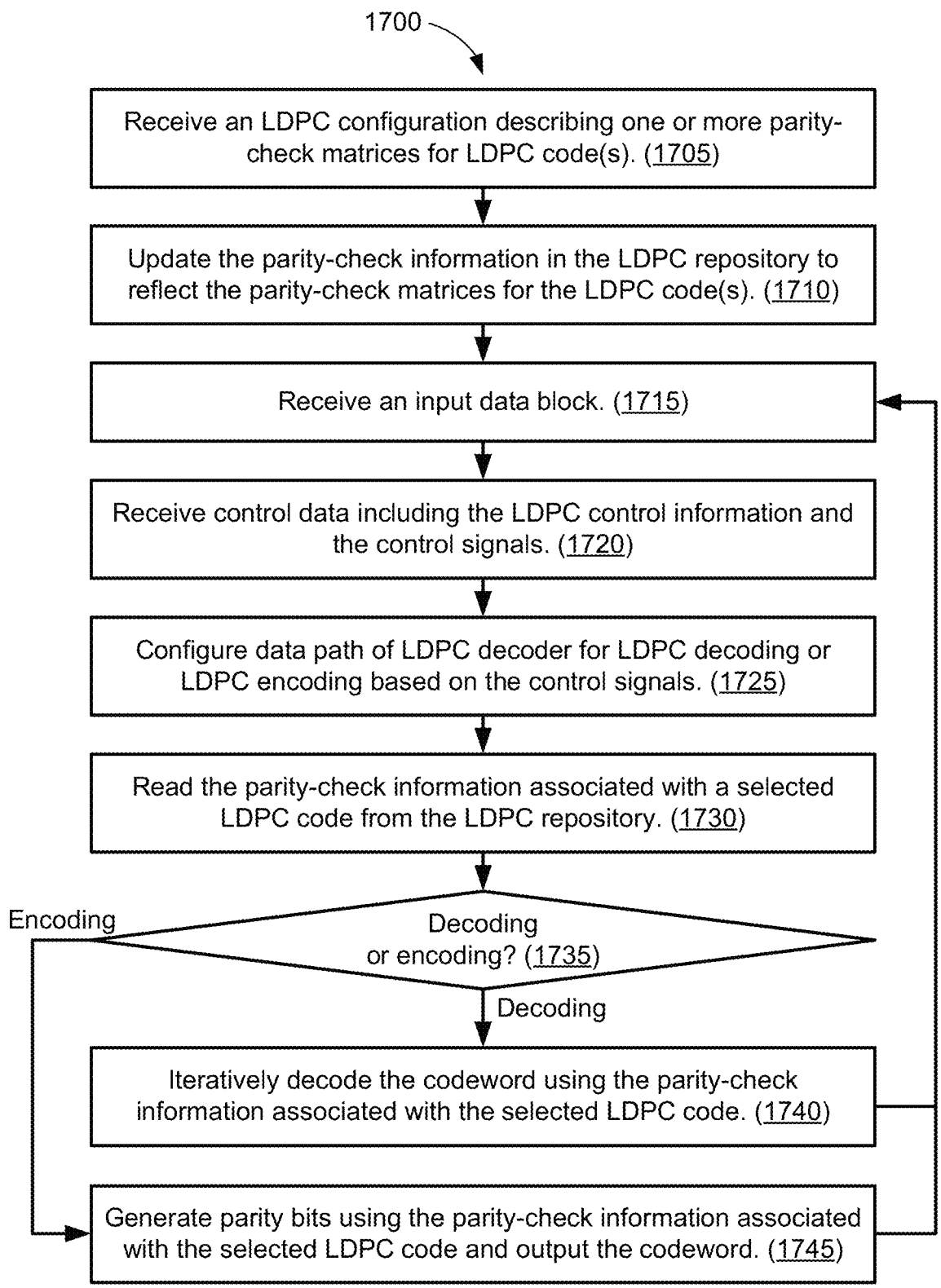
FIG. 17 is an illustrative flow chart depicting another example operation of a programmable LDPC decoder, in accordance with some embodiments.

FIG. 17 is an illustrative flow chart depicting another example operation 1700 of a programmable LDPC decoder, in accordance with some embodiments. In the example of FIG. 17, the programmable LDPC decoder is configurable to perform LDPC decoding and LDPC encoding. Although described below with respect to the decoder circuit 1300-1 of FIG. 13A, the example operation 1700 may be performed by any suitable decoder circuit.

The decoder circuit 1300-1 may receive an LDPC configuration describing parity-check matrices for one or more different LDPC codes (1705). For example, the decoder circuit 1300-1 may receive an LDPC configuration describing a parity-check matrix and/or a derivative of a parity-check matrix for an LDPC code. For purposes of discussion, the term "parity-check matrix," when used in reference to LDPC encoding data, may also include a derivative of a parity-check matrix as described within this disclosure. The LDPC configuration may describe or otherwise indicate the bit values (e.g., "1" or "0") in each column and each row of the associated parity-check matrix, as well as the number of information bits and/or parity bits in each LDPC codeword associated with the parity-check matrix.

The decoder circuit 1300-1 may then update the parity-check information in the LDPC repository to reflect the one or more parity-check matrices for the one or more LDPC codes (1710). For example, the decoder circuit 1300-1 may store the LDPC configuration as a set of parameterized data (e.g., parity-check information) in the LDPC repository. In some aspects, the parity-check information may provide a high-level description of the associated parity-check matrix (such as codeword length, number of information bits, circulant size, number of layers, and the like).

The decoder circuit 1300-1 may receive an input data block (1715). The input data block may be a codeword that has been encoded using a particular LDPC code. The input data block may be information that is to be encoded using a particular LDPC code. The decoder circuit 1300-1, e.g., the LPDC decoder 1330, may receive control data (1720). As discussed, the control signals include an encode enable flag specifying whether LDPC decoding or LDPC encoding is to be performed on the received data block. Further, the control data includes LDPC control information specifying the particular parity-check information describing the particular parity-check matrix that is to be used for the enumerated operation.

The data path of the LDPC decoder is configured for LDPC decoding or LDPC encoding based on the control signals (1725). For example, the control data may be received by the LDPC decoder at or about the same time as the input data block (e.g., substantially concurrently). In response to the received control data, the data path of the LDPC decoder is configured to perform the particular operation specified by the control signals and, more particularly, the encode enable flag. The control data must be compatible with the input data block. The input data block, for example, may be LLRs or information bits. As such, the corresponding and appropriate control data must be used to correctly process the input data block.

The LDPC decoder is capable of reading the parity-check information associated with a selected LDPC code from the LDPC repository (1730). For example, the LDPC decoder is capable of reading a particular portion of the parity-check information corresponding to a particular LPDC code to be used with the received data block. Based on whether the encode enable flag indicates encoding or decoding (1735), the LDPC decoder performs LDPC decoding (1740) or LDPC encoding (1745).

For example, the LDPC decoder is capable of iteratively decoding (1740) the data block, which is a codeword in this case, using the parity-check information associated with the selected LDPC code. The LDPC decoder is capable of generating parity bits (1745) using the parity-check information associated with the selected LDPC code and outputting the resulting codeword.

After performing LDPC decoding (1740) or LDPC encoding (1745), the process may repeat where the decoder circuit receives further data blocks for processing. As discussed, whether the decoder circuit performs LPDC encoding or LDPC decoding can change with each received data block based on the control signals provided to the LDPC decoder. Further, the parity-check information for performing the designated operation may change on a per data block basis according to the LDPC control information provided to the LDPC decoder.

Figure 18:
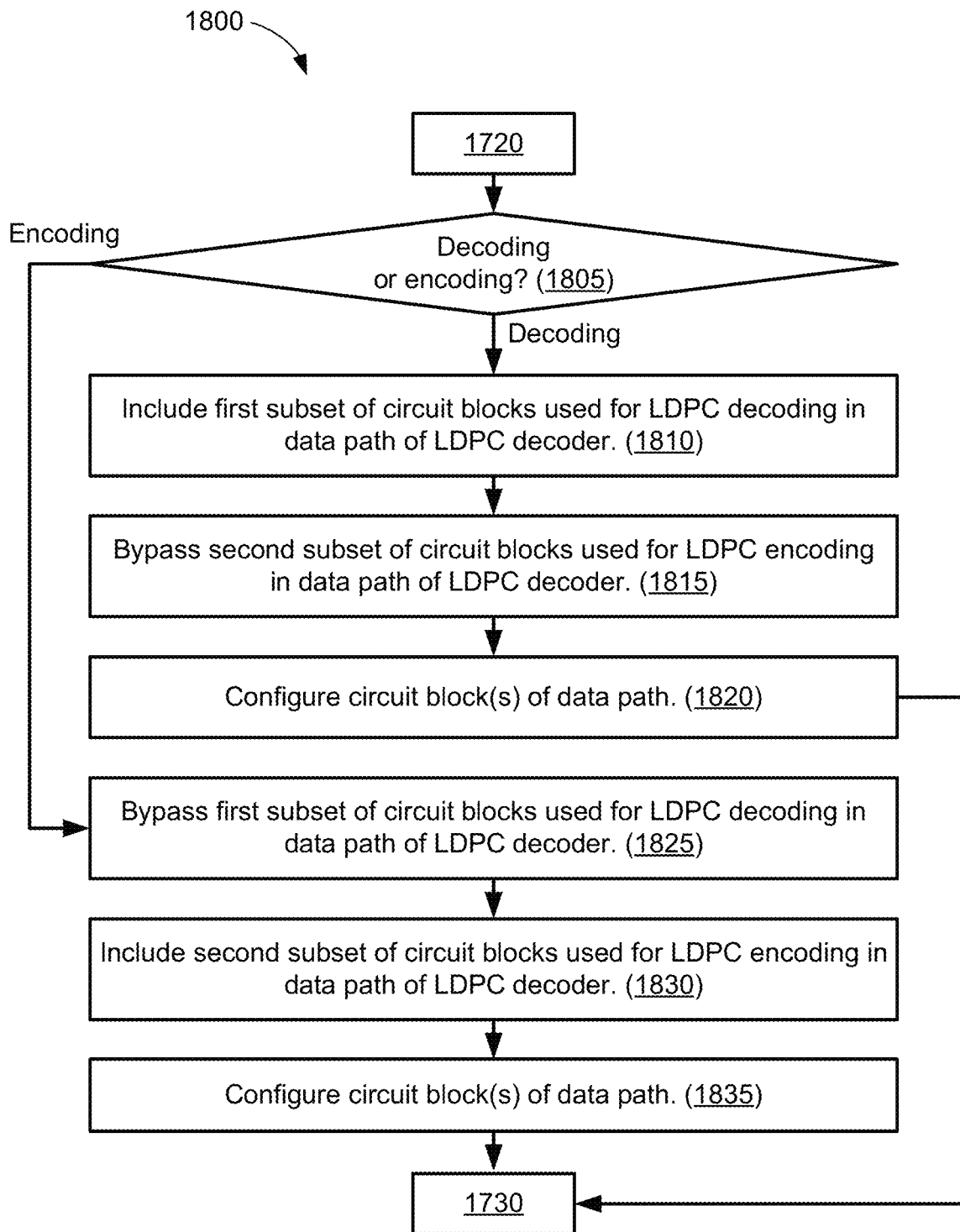
FIG. 18 is an illustrative flow chart depicting example configuration of a data path of an LDPC decoder, in accordance with some embodiments.

FIG. 18 is an illustrative flow chart depicting example configuration 1800 of a data path of an LDPC decoder, in accordance with some embodiments. The configuration 1800 of FIG. 18 is provided as an example implementation of block 1725 of FIG. 17.

Based upon whether the encode enable flag of the control signals indicates encoding or decoding (1805), operation 1800 proceeds to block 1810 or to block 1825. Continuing with the case where the encode enable signal indicates that decoding is to be performed on the received data block (e.g., a codeword), a first subset of circuit blocks of the data path of the LDPC decoder that are used for LDPC decoding are included in the data path of the LDPC decoder (1810). For example, the switch 1604 is configured to output to the subtractor circuit 804 and not directly to the MS minimums generator 840. As such, the subtractor circuit 804, the multiplier circuit 806, and the signal path including the FIFO 860 are included in the data path. The subtractor circuit 804, the multiplier circuit 806, and the signal path including the FIFO 860 process data as part of the signal path. The switch 1608 is configured to output data to the adder 808, which includes the adder 808 and the signal path including the update buffer 870 in the signal path. The adder 808 and the signal path including the update buffer 870 process data as part of the signal path. As discussed, circuit blocks may be included or otherwise enabled in the data path functionally by providing appropriate input values to the circuit blocks in embodiments where switches 1604 and 1608 are omitted.

A second subset of circuit blocks of the data path of the LDPC decoder used for LDPC encoding are bypassed in the data path of the LDPC decoder (1815). Such circuit blocks are removed, whether physically or functionally, from the signal path and do not process data. For example, the bit to LLR circuit 1602 and the bit to LLR circuit 1606 are bypassed. As such, the input buffer 810 is directly coupled to an input of the multiplexer 802. The FIFO 850 is directly coupled to an input of the switch 1608. The LLR to bit circuit 1610 may be bypassed or not depending upon whether hard bits are desired as output for the decoding. As noted, in some embodiments, the LLR to bit circuit 1610 may be controlled independently of whether encoding or decoding is performed. One or more of the circuit blocks of the data path are also configured using the control data (1820).

In the case where the encode enable signal indicates that encoding is to be performed on the received data block, a first subset of circuit blocks of the data path of the LDPC decoder that are used for LDPC decoding are bypassed in the data path of the LDPC decoder (1825). The bypassed circuit blocks are removed from the data path and do not process data. For example, the switch 1604 is configured to output directly to the MS minimums generator 840 and not to the subtractor circuit 804. As such, the subtractor circuit 804, the multiplier circuit 806, and the signal path including the FIFO 860 are excluded or bypassed from the data path (e.g., removed from the data path). The switch 1608 is configured to output data directly to un-rotator 880 and not to the adder circuit 808, which bypasses the adder circuit 808 and the signal path including the update buffer 870 in the signal path. As discussed, circuit blocks may be functionally bypassed in the data path by providing appropriate input values to the circuit blocks in embodiments where switches 1604 and 1608 are omitted.

A second subset of circuit blocks of the data path of the LDPC decoder used for LDPC encoding are included in the data path of the LDPC decoder (1830). For example, the bit to LLR circuit 1602, the bit to LLR circuit 1606, and the LLR to bit circuit 1610 are included in the data path. As such, the input buffer 810 is directly coupled to the bit to LLR circuit 1602, which is directly coupled to an input of the multiplexer 802. The FIFO 850 is directly coupled to the bit to LLR circuit 1606, which is directly coupled to the switch 1608. The un-rotator 880 is directly coupled to the LLR to bit circuit 1610, which his directly coupled to the output buffer 890.

One or more circuit blocks of the data path are also configured using the control data (1835). In some cases, the signals provided to certain circuit blocks as part of the LDPC control information are different when encoding than when decoding. For example, when encoding, the multiplexer 802 receives the Parity signal of the LPDC control information as the select signal instead of the First signal.

In one or more embodiments, the programmable LDPC decoder is capable of operating in an interleaved manner. For example, the LDPC decoder is capable of interleaving data blocks when performing LDPC encoding or LDPC decoding. The programmable LDPC decoder is capable of dynamically scheduling blocks so that layers of different data blocks may be interleaved as processed through the different stages of the LDPC decoder circuitry.

In accordance with the inventive arrangements described herein, interleaving may be implemented by the programmable LDPC decoder in cases where data dependencies are observed in the parity-check information. While the data dependencies can be strictly enforced by stalling the decoder, doing so leads to performance degradations such as reduced throughput. Referring to FIG. 2A, for example, it can be seen that both layers b=1 and b=2 utilize column i7. As such, any adjustments to column i7 from processing layer b=1 should be made prior to accessing the value of column i7 when processing layer b=2. These sorts of data dependencies in the parity-check information can lead to stalls of the programmable LDPC decoder (e.g., periods where the programmable LDPC decoder is idle). In particular, the stall occurs due to the programmable LDPC decoder waiting for values to be written to memory from processing a first layer of a data block before processing the next layer of the same data block can continue. In accordance with the inventive arrangements described herein, stalls due to data dependencies between layers can be avoided by processing multiple data blocks through the programmable LDPC decoder and interleaving the data blocks on a layer-by-layer basis. As such, the programmable LDPC decoder is capable of processing a layer of a second (e.g., different) data block while waiting for a layer of the first data block to finish processing (e.g., decoding or encoding).

Figure 19:
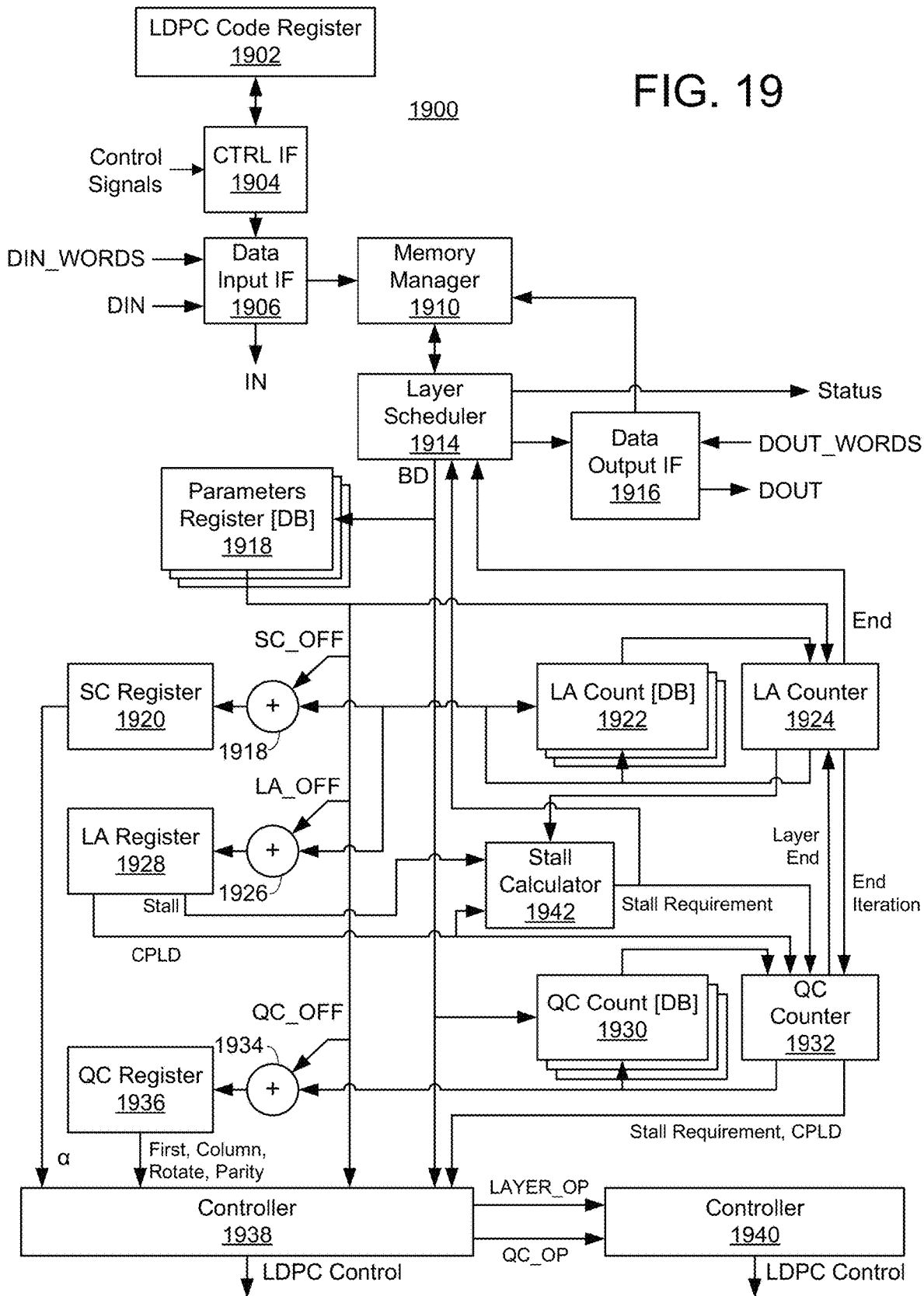
FIG. 19 is a block diagram illustrating another example LDPC repository, in accordance with some embodiments.

FIG. 19 is a block diagram illustrating another example LDPC repository 1900, in accordance with some embodiments. In the example of FIG. 19, the LDPC repository 1900 is capable of controlling the LDPC decoder circuitry (e.g., the LDPC decoder circuitry 530, the LDPC decoder circuitry 1330, or LDPC processing circuit 1354 and memory subsystem 1344) to implement interleaved processing of data blocks. LDPC repository 1900 is capable of managing memory to accommodate multiple data blocks, determine when to increase the number of data blocks that are interleaved, and detect stalls for a plurality of layers of different data blocks scheduled for interleaving.

The example of FIG. 19 shows a control interface 1904 and a data input interface 1906. The control interface 1904 and the data input interface 1906 may not be considered part of the LDPC repository 1900, but are included for purposes of illustration. In the example of FIG. 19, the control interface 1904 receives the control signals. The control signals may be implemented as described in connection with FIG. 5, 13A, or 13B. In an illustrative and non-limiting example, the control interface 1904 may be implemented as the MM interface 1348 of FIG. 13B. The data input interface 1906 is capable of receiving a data block via the DIN signal. The data input interface 1906 further receives the DIN_WORDS signal. As discussed, the DIN_WORDS signal may specify the number of bits of the DIN signal from the data block to be input. The data input interface 1906 may be implemented as the input interface 1342 of FIG. 13B.

Using the data provided from the control signals, e.g., a block descriptor, the control interface 1904 is capable of accessing the LDPC code register 1902 to determine parameters for a received data block. For example, the control interface 1904 is capable of indexing into the LDPC code register 1902 to determine parameters such as N, K, P, NLAYERS, NMQC, NORM_TYPE, SC_OFF, LA_OFF, and/or QC_OFF. The control interface 1904 sends an updated block descriptor that also specifies the retrieved parameters to the memory manager 1910 by way of the data input interface 1906. The data input interface 1906, for example, is capable of managing the input memory (e.g., input buffer 810) and allocating a base address indicating where the data block is to be written. The data input interface 1906 is capable of including the base address in the block descriptor output therefrom.

In the example of FIG. 19, the data input interface 1906 provides the data to be processed (shown as the "IN" signal) to the input buffer 810. In some embodiments, the data input interface 1906 does not provide the block descriptor to memory manager 1910 until the data input interface 1906 has stored the received data block in the input buffer 810.

The memory manager 1910 is capable of performing a memory check. The memory check is capable of managing one or more memories of the LDPC decoder circuitry to establish whether there is sufficient space to store and process the received data block. For example, the memory manager 1910 is capable of determining the status of one or more of the memories of the LDPC decoder circuit to determine whether such memories have enough space available to store and process the received data block to perform interleaved processing of data blocks.

Referring to FIG. 8 and to FIGS. 16A and 16B, in one or more embodiments, the memory manager 1910 manages the FIFO 850. In one or more other embodiments, the memory manager 1910 may also manage the FIFO 860. In particular embodiments, the memory manager 1910 may also manage the update buffer 870. In still other embodiments, the memory manager 1910 may also manage the output buffer 890 and/or the codeword buffer 820. Referring to FIG. 13B, in one example, the memories managed by memory manager 1910 include memory subsystem 1344.

In some embodiments, data blocks may be received in the data input interface 1906 and in the input buffer 810 only when space is available. Any memory checks performed for purposes of determining whether sufficient space is available to store received data in input buffer 810, for example, are independent of the memory check performed by the memory manager 1910 described herein. The memory check performed by the memory manager 1910 is specifically directed to determining whether the LDPC decoder circuitry has sufficient memory available to support the interleaving of layers of different data blocks.

Accordingly, in one or more embodiments, the memory manager 1910 is capable of checking whether the memory of the LDPC decoder circuitry includes sufficient memory for storing and processing the received data block. In response to determining that the memory of the LPDC decoder circuitry does include sufficient memory, the memory manager 1910 allocates memory for storing and processing the received data block. Further, the memory manager 1910 is capable of updating the block descriptor to also specify any offsets into memory of the LPDC decoder circuitry associated with the received data block. The memory manager 1910 is capable of passing the block descriptor to the layer scheduler 1914 in response to the memory check being passed.

In the event the memory check performed by the memory manager 1910 fails, the memory manager 1910 does not pass the block descriptor for the data block on to the layer scheduler. The memory manager 1910, for example, may continue checking whether the memories of the LDPC decoder circuitry have sufficient space available to process the received data block. The memory manager 1910, for example, only allocates memory to the data block and passes the updated block descriptor with the allocated memory offsets to the layer scheduler 1914 when the memory check is satisfied due to the release of memory.

The LDPC repository 1900 further includes a stall calculator (circuit) 1942. The stall calculator 1942 is capable of calculating a stall requirement for received data blocks on a per layer basis. For example, for a received data block, the stall calculator 1942 is capable of determining the stall requirement for each layer of the data blocks using, at least in part, the parity-check information for the data block (e.g., stall 634, stall 1434, and CPLD). The stall calculator outputs the stall requirement (e.g., the Stall Requirement signal) to the QC counter 1932 and to the layer scheduler 1914. The layer scheduler 1914 is capable of scheduling the data block and one or more other data blocks in an interleaved manner based on the Stall Requirement from the stall calculator 1942, presuming the memory check is passed.

The stall calculator 1942 is further capable of dynamically modifying the Stall Requirement for layers of data blocks during operation based on the operating state of the stages of the LDPC decoder circuitry (e.g., the Mins Loop and the Update Loop). By dynamically updating the stall requirements of layers and providing the Stall Requirement to the layer scheduler 1914, the layer scheduler 1914 is capable of scheduling the interleaving layers of further data blocks to fill time periods during which the LDPC decoder would otherwise be stalled due to data dependencies. For example, the layer scheduler 1914 is capable of determining whether to add another data block to a list of data blocks to be interleaved (e.g., an interleave list) based on the Stall Requirement. As an illustrative and non-limiting example, in response to determining that the Stall Requirement is non-zero for a previous layer, the layer scheduler 1914 is capable of adding a further data block to the interleave list. If the Stall Requirement for the previous layer has a value of zero, the layer scheduler does not add another block to the interleave list.

In the example of FIG. 19, the layer scheduler 1914 is capable of outputting the status signal (e.g., the status signal as described in connection with FIG. 13B). Further, the layer scheduler 1914 is capable of controlling the data output interface 1916 to output data via the DOUT signal based on the received DOUT_WORDS signal as described in connection with FIG. 13B. For example, the output port of the layer scheduler 1914, taken in combination with the data output interface 1916, may represent the output interface 1362 of FIG. 13B.

The layer scheduler 1914 is also capable of providing notifications to memory manager 1910 indicating when processing in particular stages of the LDPC decoder circuitry has completed and/or when data blocks are output so that memory manager 1910 is capable of marking memory of the LDPC decoder circuitry as being available (e.g., releasing previously allocated memory that is no longer needed for processing a given data block).

In the example of FIG. 19, the LDPC repository 1900 includes an LA counter 1924, a QC counter 1932, an SC register 1920, an LA register 1928, and a QC register 1936. The LDPC repository 1900 further includes adders 1919, 1926, and 1934 to index into the SC register 1920, the LA register 1928, and the QC register 1936, respectively. The LA counter 1924, QC counter 1932, SC register 1920, LA register 1928, and QC register 1936 are capable of operating substantially as described herein in connection with FIGS. 5 and/or 15.

In the example of FIG. 19, the LDPC repository 1900 includes additional registers that are capable of tracking counter data and parameters for layers of different data blocks that are undergoing interleaved processing within the LDPC decoder circuitry. For example, the parameters register [DB] 1918 is capable of storing parameters, e.g., the block descriptors (BDs) output from layer scheduler 1914, for a plurality of different data blocks (e.g., "DBs") undergoing processing in the LDPC decoder circuitry. Under control of the layer scheduler 1914, the parameters register [DB] 1918 is capable of outputting the parameters for a particular data block and layer to adder 1918, adder 1926, adder 1934, LA counter 1924, and controller 1938.

In the example of FIG. 19, the parameters register [DB] 1918 outputs the SC_OFF to adder 1918 to index into the SC register 1920 for a specified data block. The parameters register [DB] 1918 outputs the LA_OFF to adder 1926 to index into the LA register 1928. The parameters register [DB] 1918 outputs the QC_OFF to adder 1934 to index into the QC register 1936 for the specified data block. The parameters register [DB] 1918 outputs the number of layers for a given block to the LA counter 1932 so that LA counter 1932 may determine when a data block is finished processing. The parameters register [DB] 1918 further is capable of outputting the parameters for the current data block to controller 1938.

LA count [DB] 1922 is capable of retrieving LA counter data for the specified data block in response to the output from the layer scheduler 1914. LA count [DB] 1922 provides the layer counter data to LA counter 1924, which updates the counter value within the LA counter data for the specified data block and writes the updated counter value to the correct location back in the LA count [DB] 1922 for the specified data block. LA counter 1924 is capable of generating an End signal to layer scheduler 1914 indicating when the last layer of the specified data block has finished processing, e.g., via comparison of the count maintained by the LA counter 1924 with the number of layers for the specified data block from the parameters register [DB] 1918. As discussed, layer scheduler 1914 is capable of notifying memory manager 1910 to release memory resources for the specified data block as specified by the End signal from the LA counter 1924 in response to the specified data block finishing processing. As pictured, the LA counter 1924 is further capable of providing an End Iteration signal to the QC counter 1932 specifying when a data block has completed a last iteration in the LDPC decoder circuitry. The LA counter 1922 is also capable of providing a signal to the stall calculator 1942 indicating the processing iteration of the layer and data block.

The result from the LA counter 1924 is also output to adder 1918 and used to determine the index into SC register 1920. The result from LA counter 1924 is further provided to adder 1926 with LA_OFF. The adder 1926 sums the result from LA counter 1924 and LA_OFF to generate an index into LA register 1928 for the specified data block. The values determined from the LA register 1928 for the specified data block, e.g., CPLD and Stall, are output. As pictured, the LA register 1928 provides CPLD to the stall calculator 1942 and to the QC counter 1932. The LA register 1928 provides Stall to the stall calculator 1942.

QC count [DB] 1930 is capable of retrieving QC counter data for a current layer being processed in response to the output from the layer scheduler 1914. QC count [DB] 1930 provides the QC counter data to the QC counter 1932. QC counter 1932 further receives the CPLD specifying the number of processing cycles of work to be performed for a given layer from the LA register 1928 and the Stall Requirement from the stall calculator 1942. The Stall Requirement specifies a number of cycles to stall.

In one or more embodiments, the QC counter 1932 delays counting by the number of cycles specified by the Stall Requirement. In this regard, the stall calculator 1942, by providing the Stall Requirement to the QC counter 1932, is capable of implementing a stall. The QC counter 1932, in response to the Stall Requirement, is capable of delaying counting by the number of cycles specified by the Stall Requirement. As such, the stall calculator 1942, in calculating and providing the Stall Requirement to the QC counter 1932, effectively implements stalls in the LDPC decoder circuitry. The stall effectively extends the period of time allocated to the current layer in the Mins Loop of the LDPC decoder circuitry.

Subsequent to waiting the number of cycles specified by the Stall Requirement, the QC counter 1932 begins operating and updates the QC counter value within the QC counter data for the current layer of the specified data block based on the CPLD and writes the updated QC counter value back to the QC count [DB] 1930 for the current layer and specified data block. The result from the QC counter 1932 is also output to adder 1934 and is used with the QC_OFF for the specified data block from the parameters register 1918 to determine the index into the QC register 1936. The QC counter 1932 is also capable of generating a Layer End signal to the LA counter 1924 indicating when processing of the current layer of the specified data block is complete. As pictured, the QC counter 1932 is further capable of outputting the Stall Requirement and CPLD to controller 1938.

The SC register 1920 is capable of outputting the correct a value to controller 1938. The QC register 1936 is capable of outputting the signals First, Column, Rotate, and optionally Parity (e.g., in the case where encoding is performed) to controller 1938 for the particular layer of a data block to be processed. The controller 1938 outputs control signals (e.g., the LDPC control data) to the LDPC decoder circuitry to control operation thereof and interleaving of layers of data blocks.

The controller 1938 is coupled to a controller 1940. In one or more embodiments, the controller 1938 is coupled to the controller 1940 through one or more FIFO memories (not shown). In particular embodiments, the FIFO memories used to couple the controller 1938 to the controller 1940 may be matched to the FIFO memories that couple the first stage of the LDPC decoder circuitry with the second stage of the LDPC decoder circuitry. The FIFO memories are capable of conveying the LAYER_OP signal and the QC_OP signal to controller 1940. The controller 1940, in response to the LAYER_OP signal and the QC_OP signal, outputs further LDPC control signals to control the second stage of the LDPC decoder circuitry. The LAYER_OP signal, for example, may specify the particular layer that is to be processed by the second stage of the LDPC decoder circuitry. The QC_OP may specify the particular operations that are to be performed by the second stage of the LDPC decoder circuitry for the layer (and data block) specified by the LAYER_OP signal.

In general, the layer scheduler 1914 is capable of scheduling layers of data blocks by outputting the appropriate block descriptor 1924. The layer scheduler 1914, for example, schedules another layer upon completion of the prior layer as indicated by the QC counter 1932. Controller 1938 is capable of collecting the noted parameters and controlling operation of the Mins Loop. Controller 1938 is capable of providing the necessary data (e.g., LAYER_OP and QC_OP) to controller 1940 to control the Update Loop.

In the example of FIG. 19, the layer scheduler 1914 may be coupled to the other circuit blocks of LDPC repository 1900 (not shown) to provide enable signals thereto. For example, circuitry in LDPC repository 1900 may be inactive while the layer scheduler 1914 is idle. The layer scheduler 1914 is idle while the interleave list is empty (e.g., includes no data blocks). When one or more data blocks are added to the interleave list, the layer scheduler 1914 becomes active, or starts. Accordingly, upon starting, the layer scheduler 1914 is capable of providing the enable signal to the various other blocks included in the LDPC repository 1900 to begin processing data blocks through the LDPC decoder circuitry. In response to the interleave list being emptied, e.g., removal of the last data block from the interleave list, the layer scheduler is capable of going idle and, by virtue of the enable signal, deactivate the other circuit blocks of the LDPC repository 1900. In one aspect, the other circuit blocks of the LDPC repository 1900 may be reset upon the layer scheduler going idle. In another aspect, the other circuit blocks of the LDPC repository 1900 may be reset in response to the layer scheduler later becoming active (e.g., when the interleave list is no longer empty).

Figure 20:
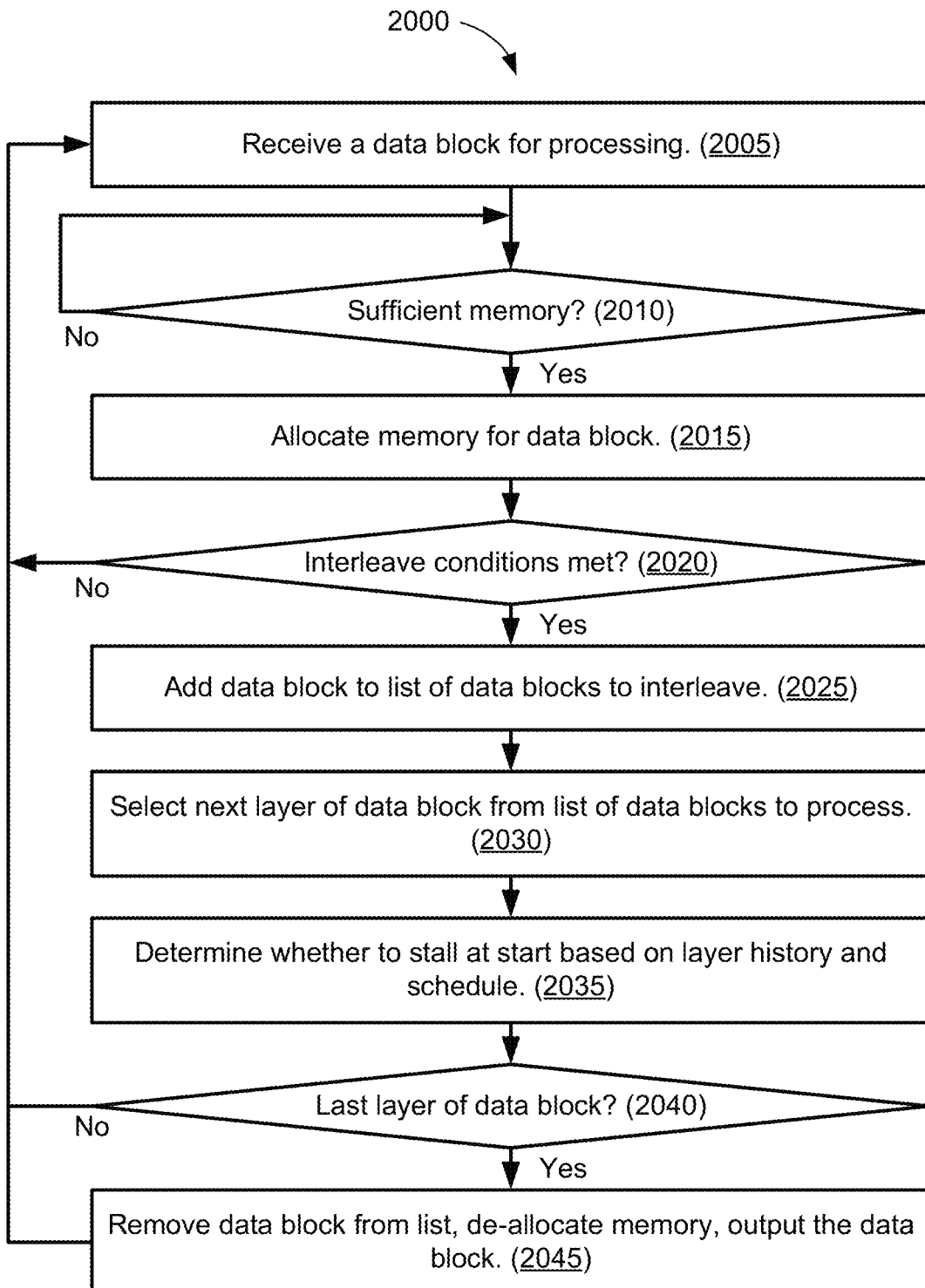
FIG. 20 is an illustrative flow chart depicting another example operation of a programmable LDPC decoder, in accordance with some embodiments.

FIG. 20 is an illustrative flow chart depicting another example operation 2000 of a programmable LDPC decoder, in accordance with some embodiments. In the example of FIG. 20, a programmable LDPC decoder is capable of processing data blocks in an interleaved manner. The processing performed by the programmable LDPC decoder may include encoding of data blocks corresponding to information or decoding of data blocks corresponding to codewords. The operations described in connection with FIG. 20 may be performed by any suitable programmable LDPC decoder such as the example programmable LDPC decoders described in connection with FIG. 5 (for decoding) and FIGS. 13A and 13B (for decoding and/or encoding). It should be appreciated that the LDPC repository 1900 described in connection with FIG. 19 may be used to facilitate interleaving of layers of the data blocks for such LDPC decoders/encoders.

The programmable LDPC decoder is capable of receiving a data block (2005). In one example, the data block may be a codeword that is to be decoded using a selected LDPC code. In another example, the data block is information to be encoded using a selected LDPC code.

The programmable LDPC decoder is capable of determining whether memories of the LDPC decoder circuitry have sufficient memory for storing the plurality of data blocks (2010). In particular embodiments, the programmable LDPC decoder is capable of determining whether there is sufficient memory for processing the data block and for storing the output generated in processing the data block. In some cases, for example, the programmable LDPC decoder includes sufficient memory to store the data block (e.g., output), e.g., but not process the data block through the data pipeline. Accordingly, each time that a data block is received, the memory manager is capable of determining whether the memories within the LDPC decoder circuitry have enough available space, e.g., empty or unused space, to process the data block in an interleaved manner with one or more other data blocks (e.g., the other data blocks on the interleaved list) and store the output generated in processing the data block.

In response to determining that there is insufficient memory, operation 2000 loops back to continue checking whether sufficient memory exists. In the example of FIG. 20, the programmable LDPC decoder is capable of waiting for memory to be released as processing of one or more other data blocks completes. In response to determining that there is sufficient memory, operation 2000 continues to block 2015. The programmable LDPC decoder is capable of allocating memory for the data block (2015). The memory manager, for example, allocates memory for storing the output and processing the data block.

The programmable LDPC decoder determines whether interleave conditions for the data block are met (2020). The LDPC decoder is capable of evaluating one or more different conditions to determine whether to interleave the data block. In one or more embodiments, a first interleave condition includes whether a maximum number of data blocks are already scheduled for interleaving. The programmable LDPC decoder is capable of determining whether a maximum number of data blocks for interleaving has been reached. If the maximum number of data blocks for interleaving has not been exceeded when considering the newly received data block, the first condition is met. Otherwise, the first condition is not met. The maximum number of data blocks may be a limit imposed by the hardware implementation of the programmable LDPC decoder.

In one or more embodiments, a second interleave condition includes whether there is sufficient value in interleaving the data block. The programmable LDPC decoder is capable of determining whether to interleave the data block based on one or more metrics that are calculated by the programmable LDPC decoder. In one or more embodiments, the programmable LDPC decoder (e.g., the stall calculator 1942) determines whether there is a stall, e.g., from a data dependency, in a previous layer processed in the LDPC decoder circuitry (e.g., a layer currently being processed). The stall is specified by the Stall Requirement. If a stall exists in the previous layer, the programmable LDPC decoder (e.g., the layer scheduler 1914) determines that the second condition is met. Otherwise, the programmable LDPC decoder determines that the second condition is not met. For example, in response to determining that the Stall Requirement from the stall calculator specifies a nonzero value, the layer scheduler determines that the second condition is met. In response to determining that the Stall Requirement from the stall calculator specifies a zero value, the layer scheduler determines that the second condition is not met.

The second condition prevents overscheduling of the programmable LDPC decoder. While overscheduling is not detrimental to throughput of the programmable LDPC decoder, overscheduling does increase latency of the programmable LDPC decoder. Latency refers to the amount of time that a data block spends in the decoder from the time of input to the time of output. By interleaving layers of data blocks only in response to the programmable LDPC decoder having to stall (e.g., due to a data dependency), the latency of the programmable LDPC decoder may be minimized. To minimize latency, the programmable LDPC decoder does not schedule interleaved processing of a data block unless the programmable LDPC decoder will stall due to a data dependency (e.g., a stall exists on the previous layer).

In one or more other embodiments, the second condition may incorporate or consider more attributes than those described. For example, the determination of whether sufficient value exists to interleave the data block may depend upon the type of code being used to process the data block.

The conditions described herein may be applied individually or in combination. For example, in one or more embodiments, the LDPC decoder must determine that both the first condition and the second condition have been met to proceed to block 2025.

The programmable LDPC decoder is capable of adding the data block received in block 2005 to the interleave list (2025). The programmable LDPC decoder selects a next layer of a data block from the list of data blocks to be interleaved for processing (2030). In one or more embodiments, the programmable LDPC decoder selects the next layer using a round-robin selection technique. It should be appreciated that other selection techniques may be used and that the embodiments described herein are not intended to be limited to the examples provided. In one or more other embodiments, for example, the programmable LDPC decoder is capable of selecting the layer based on the stall requirements of the layers. In still other embodiments, the programmable LDPC decoder is capable of selecting a layer for processing by prioritizing particular data blocks.

The programmable LDPC decoder is capable of determining whether to stall at the start of the selected layer based on layer history and schedule the selected layer (2035). For example, the LDPC decoder is capable of determining a stall requirement for the previous layer. The LDPC decoder is also capable of scheduling the selected layer based on the stall requirement. Further detail relating to determining stall requirements and scheduling is described in connection with FIG. 21 below.

The programmable LDPC decoder determines whether the selected layer is the last layer of the data block (2040). In response to the programmable LDPC decoder determining that the selected layer is not the last layer of a data block, operation 2000 loops back to block 2005 to continue processing. In response to the programmable LDPC decoder determining that the selected layer is the last layer of a data block, operation 2000 continues to block 2045. The programmable LDPC decoder is capable of removing the data block from the interleave list, de-allocating memory for the data block, and outputting the data block (2045).

In the example of FIG. 20, the layer scheduler is capable of scheduling a first data block with stalls inserted to maintain any data dependencies that exist in the parity-check information for the first data block. At the end of scheduling each layer of the first data block, the layer scheduler is capable of scheduling layers of further data blocks for interleaved processing so long as the memory check is passed and a stall is detected in the previous layer due to data dependencies.

The programmable LDPC decoder processes the plurality of data blocks through the LDPC decoder circuitry using the parity-check information by interleaving layers of the plurality of data blocks through the plurality of stages of the LDPC decoder circuitry. The LDPC decoder circuitry carries out the processing based on the scheduling performed by the layer scheduler and stalls initiated via the stall calculator. For example, the LDPC decoder circuitry is capable of processing the first data block and the second data block by alternating between the two data blocks on a layer-by-layer basis. The stall requirements used for scheduling by the layer scheduler may be updated to account for the interleaved layers by the stall calculator.

It should be appreciated that while stalls remain, the layer scheduler is capable of scheduling further data blocks for interleaved processing. The layer scheduler may continue to schedule additional data blocks as described until a maximum number of data blocks is reached. In some embodiments, the maximum number of data blocks that may be interleaved is 4. The number may be lower or higher depending upon implementation of the programmable LDPC decoder.

In the example of FIG. 20, the scheduling described may be performed for purposes of interleaving layers of data blocks for LDPC encoding, interleaving layers of data blocks for LDPC decoding, or interleaving layers of data blocks when switching between performing LDPC encoding and LDPC decoding. Different parity-check information may be applied to each data block. For example, a first (second) data block may be data to be encoded, while a second (first) data block may be a codeword to be decoded. The first and second data blocks may use same parity-check information or different parity-check information. The programmable LDPC decoder is capable of performing interleaved processing of the first and second data blocks by tracking the encode enable flag for the layers of the respective blocks as the layers are processed though the various stages of the LDPC decoder circuitry. As such, each stage of the LDPC decoder circuitry is capable of performing encoding or decoding for the particular layer being processed by the stage independently of the other stage. Further, the LDPC decoder circuitry is capable of applying the appropriate parity-check information in each stage based on the layer being processed by the stage.

Figure 21:
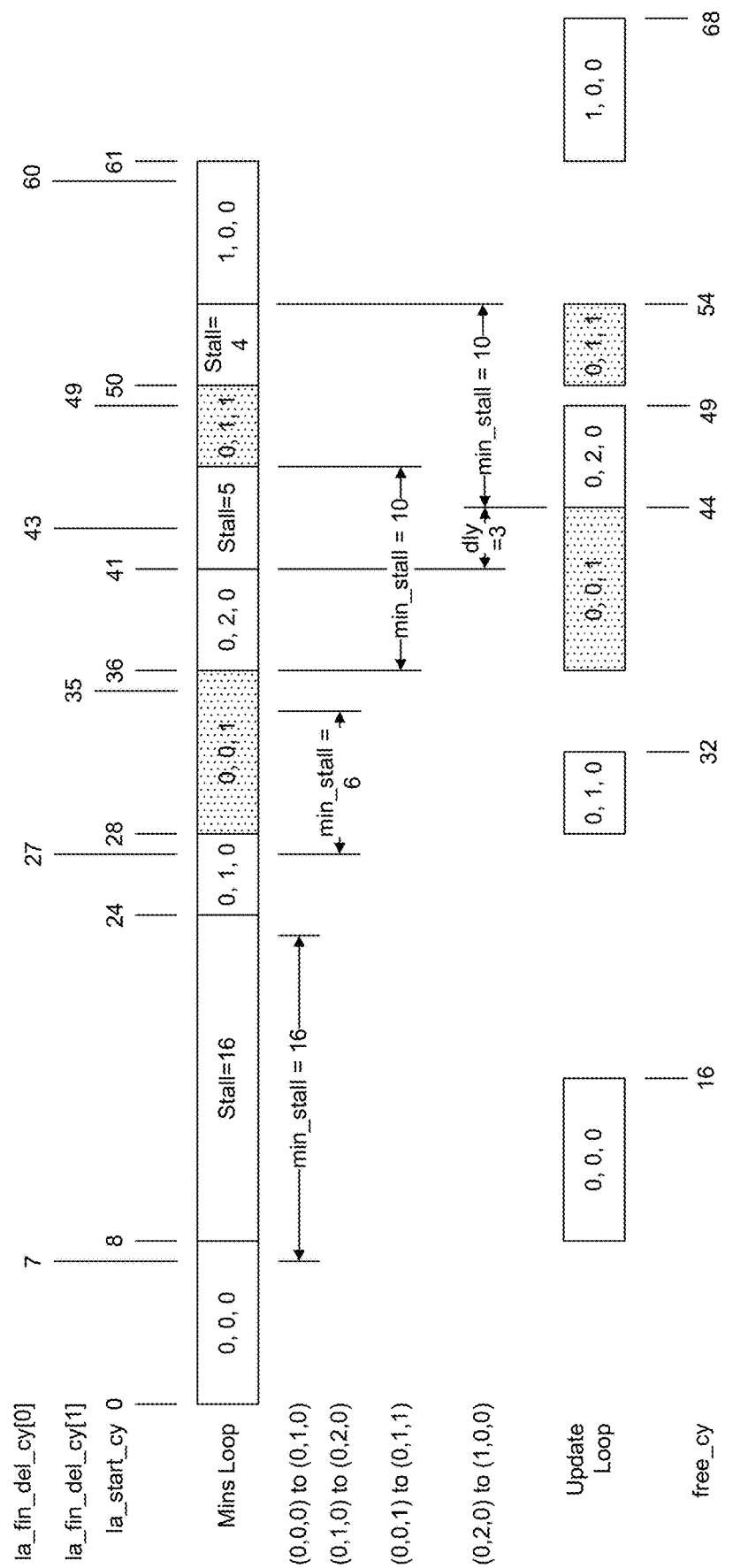
FIG. 21 is a diagram showing an example sequence of layers of data blocks scheduled for interleaved processing, in accordance with some embodiments.

FIG. 21 is a diagram showing an example sequence of layers of data blocks scheduled for interleaved processing, in accordance with some embodiments. FIG. 21 illustrates the interleaving of scheduled data blocks with reference to the different stages of the LPDC decoder circuitry (e.g., the Mins Loop and the Update Loop). The example of FIG. 21 illustrates calculation and updating of stall values for scheduling layers of data blocks in an interleaved manner. The operations described in connection with FIG. 21 may be performed by the LDPC repository. In one or more embodiments, FIG. 21 provides a more detailed description and implementation of block 2035 of FIG. 20.

For purposes of illustration, several quantities are described that are utilized by the stall calculator. The min_stall value stored in the shared LA register (e.g., stall 634, stall 1434) is specified for each layer and represents the minimum number of cycles between the previous layer and the current layer of a data block. The Mins Loop takes la_cycles+L1 cycles to complete, where L1 is the latency of the Mins Loop and la_cycles is the number of cycles of work in the layer (e.g., CPLD 636, CPLD 1436). The Update Loop takes la_cycles+L2, where L2 is the latency of the Update Loop, to update the results in memory. The value of min_stall stored in the shared LA register incorporates values for L1 and L2. As such, for purposes of description herein, the Mins Loop and the Update Loop are presumed to have 0 cycles of latency (e.g., L1=L2=0).

In one or more embodiments, the stall calculator includes and maintains registers for storing the following values: la_start_cy, la_fin_del_cy[DB], and free_cy. The value la_start_cy specifies the cycle a layer of a particular data block starts processing in the Mins Loop. The la_fin_del_cy [DB] specifies the cycle a layer of a particular data block finishes processing in the Mins Loop plus any required delay. The value free_cy specifies the cycle that the Update Loop is free (e.g., finished processing a layer of a data block).

FIG. 21 illustrates a case where a plurality of data blocks have been received for processing. For purposes of illustration, 2 data blocks are shown in FIG. 21, where layers of same data blocks are shown with same shading (or lack of shading). In the example of FIG. 21, a layer of a data block is referred to as (n1, n2, n3), where n1 indicates the iteration (e.g., for decode since only one iteration is needed for encode), n2 indicates the layer, and n3 indicates the data block (e.g., codeword for decode). Further, the memory check as each data block is received has been satisfied.

The layer scheduler is capable of selecting a data block. In the example of FIG. 21, the layer scheduler selects data block 0. Further, the layer scheduler selects a layer of the selected data block. In the example of FIG. 21, the layer scheduler selects layer 0 of data block 0. The layer scheduler is further capable of checking the stall requirement for the selected layer of the selected data block. Accordingly, in the example of FIG. 21, the layer scheduler checks the stall requirement for layer (0,0,0).

At the start of processing for each layer, the stall calculator is capable of reading the min_stall for the layer from the shared LA register. The stall calculator is capable of comparing the min_stall for the current layer with the number of cycles that the previous dependent layer of the data block (e.g., per the parity-check information) will take to complete in order to determine the stall requirement. The stall requirement, as calculated by the stall calculator, is implemented by the QC Counter prior to processing of the layer by the LDPC decoder circuitry. Since layer (0,0,0) is the first layer of the first iteration of the first block to be processed, there are no data dependencies and the stall requirement is 0. The layer scheduler schedules layer (0,0, 0).

At the start of processing, the layer scheduler may become activated in response to data blocks having been received and a data block being added to the interleave list so that the interleave list is no longer empty. For example, data block 0 may be added to the interleave list, thereby activating the layer scheduler. The stall calculator sets la_fin_del_cy[*] to 0. Layer (0,0,0) may be processed in the Mins Loop immediately at la_start_cy=0. For layer (0,0,0), the stall calculator determines, by lookup into the LA register, that la_cycles is 8 and that delay is 0. The stall calculator is capable of performing the operations described below for layer (0,0,0).

$$\begin{aligned}\text{free\_cy} &= \text{la\_start\_cy} + \text{min\_stall} + 2*\text{la\_cycles}\\ &= 0+0+2*8\\ &= 16\end{aligned}$$

$$\begin{aligned}\text{la\_fin\_del\_cy}[0] &= \text{la\_start\_cy} + \text{min\_stall} + \text{la\_cycles} - 1 + \text{delay}\\ &= 0+0+8-1+0\\ &= 7\end{aligned}$$

$$\begin{aligned}\text{la\_start\_cy} &= \text{la\_start\_cy} + \text{stall} + \text{la\_cycles}\\ &= 0+0+8\\ &= 8\end{aligned}$$

From the above, layer (0,0,0) finishes processing in the Update Loop such that the Update Loop is free at cycle 16. Layer (0,0,0) finishes processing in the Mins Loop at cycle 7. A next layer may begin processing in the Mins Loop at cycle 8.

Since the stall requirement for layer (0,0,0), which is the previous layer, was 0, the layer scheduler selects layer 1 of data block 0, e.g., layer (0,1,0). In other words, since the stall requirement of layer (0,0,0) was 0, the layer scheduler does not interleave a different data block (e.g., by adding another data block to the interleave list). The stall calculator determines, by way of a lookup into the LA register, that layer (0,1,0) has la_cycles of 4 and that the layer has a min_stall of 16. The stall calculator is capable of calculating the stall requirement for layer (0,1,0) and the delay as shown below.

$$\begin{aligned}\text{stall requirement} &= \text{min\_stall} - (\text{la\_start\_cy} - 1 - \text{la\_fin\_del\_cy}[0])\\ &= 16 - (8 - 1 - 7)\\ &= 16\end{aligned}$$

$$\text{delay=free\_}cy-(la\_\text{start\_}cy+\text{min\_stall}+la\_\text{cycles})$$

$$\begin{aligned}\text{delay} &= \text{free\_cy} - (\text{la\_start\_cy} + \text{min\_stall} + \text{la\_cycles})\\ &= 16 - (8+16+4)\\ &= -12\end{aligned}$$

When the delay is a negative number, the stall calculator sets the delay to 0. The stall calculator calculates the following for layer (0,1,0):

$$\begin{aligned}\text{free\_cy} &= \text{la\_start\_cy} + \text{min\_stall} + 2*\text{la\_cycles}\\ &= 8 + 16 + 2*4\\ &= 32\end{aligned}$$

$$\begin{aligned}\text{la\_fin\_del\_cy}[0] &= \text{la\_start\_cy} + \text{stall} + \text{la\_cycles} - 1 + \text{delay}\\ &= 8 + 16 + 4 - 1 + 0\\ &= 27\end{aligned}$$

The stall calculator further determines that the next layer after layer (0,1,0) may begin processing in the Mins Loop as follows:

$$\begin{aligned}\text{la\_start\_cy} &= \text{la\_start\_cy} + \text{stall} + \text{la\_cycles}\\ &= 8 + 16 + 4\\ &= 28\end{aligned}$$

Since the stall requirement for layer (0,1,0) was greater than 0 (e.g., where layer (0,1,0) is the previous layer), the layer scheduler adds data block 1 to the interleave list and selects layer 0 of data block 1, e.g., layer (0,0,1). The stall calculator determines, via lookup, that layer (0,0,1) has la_cycles of 8. This is the first layer in the data block so the stall requirement is 0. The stall calculator determines the following for layer (0,1,0):

$$\begin{aligned}\text{la\_fin\_del\_cy}[1] &= \text{la\_start\_cy} + \text{stall} + \text{la\_cycles} - 1 + \text{delay}\\ &= 28 + 0 + 8 - 1 + 0\\ &= 35\end{aligned}$$

$$\begin{aligned}\text{delay} &= \text{free\_cy} - (\text{la\_start\_cy} + \text{stall} + \text{la\_cycles})\\ &= 32 - (28 + 0 + 8)\\ &= -4\end{aligned}$$

$$\begin{aligned}\text{free\_cy} &= \text{la\_start\_cy} + \text{stall} + 2*\text{la\_cycles}\\ &= 28 + 0 + 2*8\\ &= 44\end{aligned}$$

Since the delay is a negative number, the stall calculator sets the delay to 0. The stall calculator further determines that the next layer after layer (0,0,1) may begin processing in the Mins Loop as follows:

$$la\_\text{start\_}cy=la\_\text{start\_}cy+\text{stall}+la\_\text{cycles}$$

$$=28+0+8$$

$$=36$$

Since the stall requirement was 0 in the previous layer, e.g., layer (0,0,1), the layer scheduler does not add another data block to the interleave list and selects layer 2 of data block 0, e.g., layer (0,2,0). The stall calculator determines, by lookup, that layer (0,2,0) has la_cycles of 5 and a min_stall of 6. The stall calculator determines the following for layer (0,2,0):

$$\begin{aligned}\text{stall requirement} &= \text{min\_stall} - (\text{la\_start\_cy} - 1 - \text{la\_fin\_del\_cy}[0])\\ &= 6 - (36 - 1 - 27)\\ &= -2\end{aligned}$$

$$\begin{aligned}\text{delay} &= \text{free\_cy} - (\text{la\_start\_cy} + \text{stall} + \text{la\_cycles})\\ &= 44 - (36 + 0 + 5)\\ &= 3\end{aligned}$$

Since the stall requirement is a negative number, the stall calculator sets the stall requirement to 0. The stall calculator further determines the following for layer (0,2,0):

$$\begin{aligned} \text{free\_cy} &= \text{free\_cy} + \text{la\_cycles} \\ &= 44 + 5 \\ &= 49 \end{aligned}$$

$$\begin{aligned} \text{la\_fin\_del\_cy}[0] &= \text{la\_start\_cy} + \text{stall} + \text{la\_cycles} - 1 + \text{delay} \\ &= 36 + 0 + 5 - 1 + 3 \\ &= 43 \end{aligned}$$

The stall calculator determines that a next layer may begin processing in the Mins Loop as follows:

$$la\_start\_cy = la\_start\_cy + \text{stall} + la\_\text{cycles}$$

$$= 36 + 0 + 5$$

$$= 41$$

Since the stall requirement for layer (0,2,0) was 0, the layer scheduler does not add another data block to the interleave list and selects layer 1 of data block 1, e.g., layer (0,1,1). The stall calculator determines, via lookup, that layer (0,1,1) has a la_cycles of 4 and a min_stall of 10. The stall calculator determines the following for layer (0,1,1):

$$\begin{aligned} \text{stall requirement} &= \text{min\_stall} - (\text{la\_start\_cy} - 1 - \\ &\quad \text{la\_fin\_del\_cy}[1]) \\ &= 10 - (41 - 1 - 35) \\ &= 5 \end{aligned}$$

$$\begin{aligned} \text{delay} &= \text{free\_cy} - (\text{la\_start\_cy} + \text{stall} + \text{la\_cycles}) \\ &= 49 - (41 + 5 + 4) \\ &= -1 (\text{set to } 0) \end{aligned}$$

$$\begin{aligned} \text{free\_cy} &= \text{la\_start\_cy} + \text{stall} + 2 * \text{la\_cycles} \\ &= 41 + 5 + 2 * 4 \\ &= 54 \end{aligned}$$

$$\begin{aligned} \text{la\_fin\_del\_cy}[1] &= \text{la\_start\_cy} + \text{stall} + \text{la\_cycles} - 1 + \text{delay} \\ &= 41 + 5 + 4 - 1 + 0 \\ &= 49 \end{aligned}$$

The stall calculator determines that the next layer may start in the Mins Loop as follows:

$$\begin{aligned} \text{la\_start\_cy} &= \text{la\_start\_cy} + \text{stall} + \text{la\_cycles} \\ &= 41 + 5 + 4 \\ &= 50 \end{aligned}$$

Since the stall requirement for layer (0,1,1) is greater than 0, the layer scheduler does consider adding another data block to the interleaved list. In this example, however, another data block is not available. For example, a data block may not have been received, the memory check may have failed, or the maximum number of data blocks permitted to be interleaved may be 2. Further, in this example, data block 0 has 2 layers. Accordingly, the layer scheduler selects block 0 for processing, with the LA counter determining layer 0 of block 0 for iteration 2, e.g., layer (1,0,0). The stall circuit determines that layer (1,0,0), by way of lookup, has la_cycles of 7 and a min_stall of 10. The stall calculator determines the following for layer (1,0,0):

$$\begin{aligned} \text{stall requirement} &= \text{min\_stall} - (\text{la\_start\_cy} - 1 - \\ &\quad \text{la\_fin\_del\_cy}[0]) \\ &= 10 - (50 - 1 - 43) \\ &= 4 \end{aligned}$$

$$\begin{aligned} \text{delay} &= \text{free\_cy} - (\text{la\_start\_cy} + \text{stall} + \text{la\_cycles}) \\ &= 54 - (50 + 4 + 7) \\ &= -7 (\text{set to } 0) \end{aligned}$$

$$\begin{aligned} \text{free\_cy} &= \text{la\_start\_cy} + \text{stall} + 2 * \text{la\_cycles} \\ &= 50 + 4 + 2 * 7 \\ &= 68 \end{aligned}$$

$$\begin{aligned} \text{la\_fin\_del\_cy}[0] &= \text{la\_start\_cy} + \text{stall} + \text{la\_cycles} - 1 + \text{delay} \\ &= 50 + 4 + 7 - 1 + 0 \\ &= 60 \end{aligned}$$

The stall calculator determines that the next layer may begin processing in the Mins Loop as follows:

$$la\_start\_cy = la\_start\_cy + \text{stall} + la\_\text{cycles}$$

$$= 50 + 4 + 7$$

$$= 61$$

The layer scheduler is capable of continuing to schedule further layers of further data blocks to interleave the layers thereby increasing throughput. In response to the interleave list becoming empty, the layer scheduler goes idle. The circuit blocks of the LDPC repository, e.g., including the stall calculator, may be reset at that time or in response to the layer scheduler later becoming active. The layer scheduler is capable of determining the stall requirements for interleaved layers of data blocks by, at least in part, accounting for changes in layer length (e.g., amount of work to process the layer). The layer scheduler is capable of maximizing or increasing throughput of the LDPC decoder circuitry while keeping the number of data blocks that are interleaved low or to a minimum.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," "some embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

The flowchart and block diagrams in the figures illustrate the architecture, functionality, and operation of possible implementations of systems and methods according to various aspects of the inventive arrangements. In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow.

The corresponding structures, materials, acts, and equivalents of all means or step plus function elements that may be found in the claims below are intended to include any structure, material, or act for performing the function in combination with other claimed elements as specifically claimed.

In one or more embodiments, a decoder circuit can include LDPC decoder circuitry having a plurality of stages and an LDPC repository configured to store parity-check information associated with one or more LDPC codes. The LDPC repository is configured to determine a stall requirement for a layer of a first data block and perform a memory check for a second data block. The LDPC repository, in response to the stall requirement indicating a stall for the layer of the first data block and determining that the memory check is satisfied, is further configured to schedule processing of the first data block and the second data block in the LDPC decoder circuitry using the parity-check information by interleaving the layer of the first data block and a layer of the second data block through the plurality of stages of the LDPC decoder circuitry.

In an aspect, the LDPC repository includes a memory manager configured to perform the memory check by determining whether sufficient space is available within a memory included in the LDPC decoder circuitry to store and process the second data block.

In another aspect, the LDPC repository is configured to schedule up to a maximum number of data blocks for interleaved processing.

In another aspect, the LDPC repository includes a layer scheduler configured to determine the stall requirement by comparing a minimum stall value for the layer of the first data block with a number of cycles that a previous dependent layer of the first data block takes to complete processing.

In another aspect, the layer scheduler is configured to schedule the first data block with stalls inserted based on a data dependency in the parity-check information corresponding to the first data block.

In another aspect, the LDPC decoder circuitry processes the layer of the first data block through a first stage of the plurality of stages and, while the layer of the first data block is processed by a second stage of the plurality of stages, processes a layer of the second data block through the first stage prior to processing a further layer of the first data block in the first stage in response to scheduling by the LPDC repository.

In another aspect, the first data block and the second data block are processed by the LDPC decoder circuitry using a same LDPC code specified by the parity-check information.

In another aspect, the first data block and the second data block are processed by the LDPC decoder circuitry using different LDPC codes specified by the parity-check information.

In another aspect, the LDPC decoder circuitry is configured to perform LDPC decoding.

In another aspect, the LDPC decoder circuitry is configured to perform LDPC encoding.

In another aspect, the LDPC decoder circuitry is configured to switch between performing LDPC encoding and LDPC decoding between layers of the first data block and layers of the second data block.

In one or more embodiments, a method can include receiving a first data block for processing through LDPC decoder circuitry using stored parity-check information, wherein the LDPC decoder circuitry includes a plurality of stages, determining a stall requirement for a layer of the first data block, and determining whether the LDPC decoder circuitry has sufficient memory for storing and processing a second data block. The method can include, in response to the stall requirement indicating a stall for the layer of the first data block and determining that sufficient memory is available, scheduling processing of the first data block and the second data block in the LDPC decoder circuitry using the parity-check information by interleaving the layer of the first data block and a layer of the second data block through the plurality of stages of the LDPC decoder circuitry.

In an aspect, the determining whether the LDPC decoder circuitry has sufficient memory includes determining whether a memory of the LDPC decoder circuitry that couples a first stage of the plurality of stages to a second stage of the plurality of stages has space available for storing and processing the second data block.

In another aspect, the determining the stall requirement includes comparing a minimum stall value for the layer of the first data block with a number of cycles that a previous dependent layer of the first data block takes to complete processing.

In another aspect, the scheduling the first data block and the second data block includes scheduling the first data block with stalls inserted based on a data dependency detected between the layer of the first data block and a prior layer of the first data block.

In another aspect, the method includes the LDPC decoder circuitry processing the layer of the first data block through a first stage of the plurality of stages and, while the layer of the first data block is processed by a second stage of the plurality of stages, processing a layer of the second data block through the first stage prior to processing a further layer of the first data block in the first stage.

In another aspect, the first data block and the second data block are processed by the LDPC decoder circuitry using a same LDPC code specified by the parity-check information.

In another aspect, the first data block and the second data block are processed by the LDPC decoder circuitry using different LDPC codes specified by the parity-check information.

In another aspect, the method includes using the LDPC decoder circuitry to perform LDPC decoding of at least one of the first data block or the second data block.

In another aspect, the method includes using the LDPC decoder circuitry to perform LDPC encoding of at least one of the first data block or the second data block.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A decoder circuit, comprising:
   low-density parity-check (LDPC) decoder circuitry having a plurality of stages; and
   an LDPC repository configured to store parity-check information associated with one or more LDPC codes, wherein the LDPC repository is configured to determine a stall requirement for a layer of a first data block and perform a memory check for a second data block;
   wherein the LDPC repository, in response to the stall requirement indicating a stall for the layer of the first data block and determining that the memory check is satisfied, is further configured to schedule processing of the first data block and the second data block in the LDPC decoder circuitry using the parity-check information by interleaving the layer of the first data block and a layer of the second data block through the plurality of stages of the LDPC decoder circuitry.

2. The decoder circuit of claim 1, wherein the LDPC repository comprises:
   a memory manager configured to perform the memory check by determining whether sufficient space is available within a memory included in the LDPC decoder circuitry to store and process the second data block.

3. The decoder circuit of claim 1, wherein the LDPC repository is configured to schedule up to a maximum number of data blocks for interleaved processing.

4. The decoder circuit of claim 1, wherein the LDPC repository comprises:
   a stall calculator configured to determine the stall requirement by comparing a minimum stall value for the layer of the first data block with a number of cycles that a previous dependent layer of the first data block takes to complete processing.

5. The decoder circuit of claim 4, further comprising:
   a layer scheduler configured to schedule the first data block with stalls inserted based on a data dependency in the parity-check information corresponding to the first data block.

6. The decoder circuit of claim 1, wherein the LDPC decoder circuitry processes the layer of the first data block through a first stage of the plurality of stages and, while the layer of the first data block is processed by a second stage of the plurality of stages, processes a layer of the second data block through the first stage prior to processing a further layer of the first data block in the first stage in response to scheduling by the LPDC repository.

7. The decoder circuit of claim 1, wherein the first data block and the second data block are processed by the LDPC decoder circuitry using a same LDPC code specified by the parity-check information.

8. The decoder circuit of claim 1, wherein the first data block and the second data block are processed by the LDPC decoder circuitry using different LDPC codes specified by the parity-check information.

9. The decoder circuit of claim 1, wherein the LDPC decoder circuitry is configured to perform LDPC decoding.

10. The decoder circuit of claim 1, wherein the LDPC decoder circuitry is configured to perform LDPC encoding.

11. The decoder circuit of claim 1, wherein the LDPC decoder circuitry is configured to switch between performing LDPC encoding and LDPC decoding between layers of the first data block and layers of the second data block.

12. A method, comprising:
receiving a first data block for processing through low-density parity-check (LDPC) decoder circuitry using stored parity-check information, wherein the LDPC decoder circuitry includes a plurality of stages;
determining a stall requirement for a layer of the first data block;
determining whether the LDPC decoder circuitry has sufficient memory for storing and processing a second data block; and
in response to determining that the stall requirement indicates a stall for the layer of the first data block and that sufficient memory is available, scheduling processing of the first data block and the second data block in the LDPC decoder circuitry using the parity-check information by interleaving the layer of the first data block and a layer of the second data block through the plurality of stages of the LDPC decoder circuitry.

13. The method of claim 12, wherein the determining whether the LDPC decoder circuitry has sufficient memory comprises:
determining whether a memory of the LDPC decoder circuitry that couples a first stage of the plurality of stages to a second stage of the plurality of stages has space available for storing and processing the second data block.

14. The method of claim 12, wherein the determining the stall requirement comprises:
comparing a minimum stall value for the layer of the first data block with a number of cycles that a previous dependent layer of the first data block takes to complete processing.

15. The method of claim 12, wherein the scheduling the first data block and the second data block comprises:
scheduling the first data block with stalls inserted based on a data dependency detected between the layer of the first data block and a prior layer of the first data block.

16. The method of claim 12, further comprising:
the LDPC decoder circuitry processing the layer of the first data block through a first stage of the plurality of stages and, while the layer of the first data block is processed by a second stage of the plurality of stages, processing the layer of the second data block through the first stage prior to processing a further layer of the first data block in the first stage.

17. The method of claim 12, wherein the first data block and the second data block are processed by the LDPC decoder circuitry using a same LDPC code specified by the parity-check information.

18. The method of claim 12, wherein the first data block and the second data block are processed by the LDPC decoder circuitry using different LDPC codes specified by the parity-check information.

19. The method of claim 12, further comprising:
using the LDPC decoder circuitry to perform LDPC decoding of at least one of the first data block or the second data block.

20. The method of claim 12, further comprising:
using the LDPC decoder circuitry to perform LDPC encoding of at least one of the first data block or the second data block.

* * * * *